(12) United States Patent
Shah et al.

(10) Patent No.: US 8,158,493 B2
(45) Date of Patent: Apr. 17, 2012

(54) LASER-BASED MATERIAL PROCESSING METHODS AND SYSTEMS

(75) Inventors: Lawrence Shah, Maitland, FL (US); Gyu Cheon Cho, Ann Arbor, MI (US); Jingzhou Xu, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 0 days.

(21) Appl. No.: 12/641,256

(22) Filed: Dec. 17, 2009

(65) Prior Publication Data

US 2010/0197116 A1 Aug. 5, 2010

Related U.S. Application Data

(63) Continuation of application No. PCT/US2009/037443, filed on Mar. 17, 2009.

(60) Provisional application No. 61/038,725, filed on Mar. 21, 2008, provisional application No. 61/110,913, filed on Nov. 3, 2008, provisional application No. 61/152,625, filed on Feb. 13, 2009.

(51) Int. Cl.
*H01L 21/00* (2006.01)

(52) U.S. Cl. ............... 438/463; 219/121.69; 219/121.68; 219/121.8; 257/E21.48; 257/E21.596

(58) Field of Classification Search ........................ None
See application file for complete search history.

(56) References Cited

U.S. PATENT DOCUMENTS

| | | |
|---|---|---|
| 3,360,398 A | 12/1967 | Garibotti |
| 5,499,134 A | 3/1996 | Galvanauskas |
| 5,593,606 A | 1/1997 | Owen |
| 5,641,416 A | 6/1997 | Chadha |
| 5,652,681 A | 7/1997 | Chen |
| 5,656,186 A | 8/1997 | Mourou |

(Continued)

FOREIGN PATENT DOCUMENTS

GB 20092459669 A 11/2009

(Continued)

OTHER PUBLICATIONS

Ameer-Beg et al. ("Femto-second Laser Micromachining of Materials", Applied Surface Science, 127-129, pp. 875-880, 1998).*

(Continued)

*Primary Examiner* — Charles Garber
*Assistant Examiner* — Yasser Abdelaziez
(74) *Attorney, Agent, or Firm* — Knobbe, Martens, Olson & Bear, LLP

(57) ABSTRACT

Various embodiments may be used for laser-based modification of target material of a workpiece while advantageously achieving improvements in processing throughput and/or quality. Embodiments of a method of processing may include focusing and directing laser pulses to a region of the workpiece at a pulse repetition rate sufficiently high so that material is efficiently removed from the region and a quantity of unwanted material within the region, proximate to the region, or both is reduced relative to a quantity obtainable at a lower repetition rate. Embodiments of an ultrashort pulse laser system may include at least one of a fiber amplifier or fiber laser. Various embodiments are suitable for at least one of dicing, cutting, scribing, and forming features on or within a semiconductor substrate. Workpiece materials may also include metals, inorganic or organic dielectrics, or any material to be micromachined with femtosecond, picosecond, and/or nanosecond pulses.

16 Claims, 40 Drawing Sheets

U.S. PATENT DOCUMENTS

| | | | |
|---|---|---|---|
| 5,696,782 | A | 12/1997 | Harter |
| 5,744,780 | A | 4/1998 | Chang et al. |
| 5,818,630 | A | 10/1998 | Fermann |
| 5,841,099 | A | 11/1998 | Owen |
| 5,847,960 | A | 12/1998 | Cutler |
| 5,883,710 | A | 3/1999 | Nikoonahad |
| 6,067,306 | A | 5/2000 | Sandstrom |
| 6,172,325 | B1 | 1/2001 | Baird |
| 6,210,401 | B1 | 4/2001 | Lai |
| 6,211,488 | B1 | 4/2001 | Hoekstra |
| 6,281,471 | B1 | 8/2001 | Smart |
| 6,407,363 | B2 | 6/2002 | Dunsky |
| 6,433,301 | B1 | 8/2002 | Dunsky |
| 6,552,301 | B2 | 4/2003 | Herman |
| 6,555,447 | B2 | 4/2003 | Weishauss |
| 6,562,698 | B2 | 5/2003 | Manor |
| 6,621,040 | B1 | 9/2003 | Perry et al. |
| 6,664,498 | B2 | 12/2003 | Forsman |
| 6,676,878 | B2 | 1/2004 | O'Brien |
| 6,716,362 | B1 | 4/2004 | Benz |
| 6,737,606 | B2 | 5/2004 | Wai |
| 6,744,009 | B1 | 6/2004 | Xuan |
| 6,760,356 | B2 | 7/2004 | Erbert et al. |
| 6,770,544 | B2 | 8/2004 | Sawada |
| 6,784,399 | B2 | 8/2004 | Dunsky |
| 6,784,400 | B1 | 8/2004 | Banks et al. |
| 6,791,060 | B2 | 9/2004 | Dunsky |
| 6,885,683 | B1 | 4/2005 | Fermann |
| 6,917,631 | B2 | 7/2005 | Richardson |
| 6,979,798 | B2 | 12/2005 | Gu et al. |
| 6,992,026 | B2 | 1/2006 | Fukuyo |
| 7,057,133 | B2 | 6/2006 | Lei |
| 7,113,327 | B2 | 9/2006 | Gu |
| 7,115,514 | B2 | 10/2006 | Stoltz |
| 7,169,687 | B2 | 1/2007 | Li |
| 7,316,940 | B2 | 1/2008 | Daubenspeck |
| 7,330,301 | B2 | 2/2008 | Harter |
| 7,470,566 | B2 | 12/2008 | Nakamura |
| 7,486,705 | B2 | 2/2009 | Shah |
| 7,505,196 | B2 | 3/2009 | Nati et al. |
| 7,528,342 | B2 | 5/2009 | Deshi |
| 7,568,365 | B2 | 8/2009 | Schaffer et al. |
| 7,605,343 | B2 | 10/2009 | Lei |
| 7,684,450 | B2 | 3/2010 | Shah |
| 7,912,100 | B2 | 3/2011 | Shah et al. |
| 2001/0045419 | A1* | 11/2001 | Dunsky et al. ........... 219/121.76 |
| 2002/0162360 | A1 | 11/2002 | Schaffer et al. |
| 2003/0047543 | A1 | 3/2003 | Peng |
| 2003/0160034 | A1 | 8/2003 | Filgas et al. |
| 2003/0215204 | A1 | 11/2003 | Schroeder et al. |
| 2004/0226925 | A1 | 11/2004 | Gu et al. |
| 2004/0240037 | A1 | 12/2004 | Harter |
| 2005/0000952 | A1 | 1/2005 | Harter |
| 2005/0067391 | A1 | 3/2005 | Starkston |
| 2005/0105865 | A1 | 5/2005 | Fermann |
| 2005/0111500 | A1 | 5/2005 | Harter |
| 2005/0184035 | A1 | 8/2005 | Kurosawa et al. |
| 2005/0190802 | A1 | 9/2005 | Richardson |
| 2005/0225846 | A1 | 10/2005 | Nati |
| 2005/0226278 | A1 | 10/2005 | Gu |
| 2005/0226287 | A1 | 10/2005 | Shah |
| 2005/0274702 | A1 | 12/2005 | Deshi |
| 2005/0279740 | A1 | 12/2005 | Liu |
| 2006/0009008 | A1 | 1/2006 | Kaneuchi |
| 2006/0088984 | A1 | 4/2006 | Li |
| 2006/0096962 | A1 | 5/2006 | Park |
| 2006/0099810 | A1 | 5/2006 | Voronov |
| 2006/0159137 | A1 | 7/2006 | Shah |
| 2006/0169677 | A1 | 8/2006 | Deshi |
| 2006/0207976 | A1 | 9/2006 | Bovatsek et al. |
| 2006/0263024 | A1 | 11/2006 | Dong |
| 2006/0285561 | A1 | 12/2006 | Shah et al. |
| 2007/0207570 | A1 | 9/2007 | Choi |
| 2007/0272555 | A1 | 11/2007 | Baird |
| 2007/0272666 | A1 | 11/2007 | O'Brien |
| 2007/0272668 | A1 | 11/2007 | Albelo |
| 2007/0275541 | A1 | 11/2007 | Harris |
| 2007/0293019 | A1 | 12/2007 | Jeng |
| 2008/0051713 | A1 | 2/2008 | Kohlbrenner |
| 2008/0067155 | A1 | 3/2008 | Gu |
| 2008/0067160 | A1 | 3/2008 | Suutarinen |
| 2008/0299745 | A1 | 12/2008 | Morikazu |
| 2009/0067455 | A1 | 3/2009 | Murison |
| 2009/0194516 | A1 | 8/2009 | Deshi |
| 2009/0268265 | A1 | 10/2009 | Shah |
| 2010/0111120 | A1 | 5/2010 | Shah |
| 2011/0240617 | A1 | 10/2011 | Xu et al. |

FOREIGN PATENT DOCUMENTS

| | | | |
|---|---|---|---|
| JP | 2005142389 | A2 | 6/2005 |
| WO | WO2007136183 | A1 | 11/2007 |
| WO | WO2008/033135 | A1 | 3/2008 |
| WO | WO2008033135 | A1 | 3/2008 |
| WO | WO2008091898 | A1 | 7/2008 |
| WO | WO2009042347 | A1 | 4/2009 |
| WO | WO2009117451 | A1 | 9/2009 |
| WO | WO2009120918 | A2 | 10/2009 |
| WO | WO2009145978 | A1 | 12/2009 |
| WO | WO 2011/123205 | | 10/2011 |

OTHER PUBLICATIONS

International Search Report and Written Opinion for International Application No. PCT/US2009/037443 filed Mar. 17, 2009, dated May 4, 2009, in 12 pages.

International Preliminary Report on Patentability for International Application No. PCT/US2009/037443 filed Mar. 17, 2009, dated Sep. 21, 2010, in 7 pages.

International Search Report and Written Opinion for International Application No. PCT/US2011/026501, mailed May 10, 2011, 14 pages.

U.S. Appl. No. 13/037,614, filed Mar. 1, 2011, 97 pages.

Preliminary Amendment filed on May 4, 2011 in U.S. Appl. No. 13/037,614, 8 pages.

A. Ancona et al., "Femtosecond and picosecond laser drilling of metals at high repetition rates and average powers," Optics Letters, vol. 34, pp. 3304-3306, Nov. 2009.

A. Ancona et al., "High speed laser drilling of metals using a high repetition rate, high average power ultrafast fiber CPA system," Optics Express, vol. 16, pp. 8958-8968, Jun. 2008.

N. Bärsch et al., "Ablation and cutting of planar silicon devices using femtosecond laser pulses," Applied Physics A, vol. 77, pp. 237-242, May 2003.

J. Bovatsek et al., "Laser ablation threshold and etch rate comparison between the ultrafast Yb fiber-based FCPA laser and a Ti:sapphire laser for various materials," Fifth Int'l Symposium on Laser Precision Microfabrication, Proc. SPIE, vol. 5662, pp. 661-666, Oct. 2004.

D. Breitling et al., "Fundamental aspects in machining of metals with short and ultrashort laser pulses," Photon Processing in Microelectronics and Photonics III, Proc. SPIE, vol. 5339, pp. 49-63, Jul. 2004.

T.H.R. Crawford et al., "Femtosecond laser micromachining of grooves in silicon with 800 nm pulses," Applied Physics A, vol. 80, pp. 1717-1724, Aug. 2004.

Disco Laser Application Fully Automatic Laser Saw DFL 7000 Series product brochure, Jul. 2000.

H. Endert et al., "Novel ultrashort-pulse fiber lasers and their applications," Proc. SPIE, vol. 4426, pp. 483-488, Apr. 2003.

R. Fluck et al., "Passively Q-switched 1.34μm Nd:YVO$_4$ microchip laser with semiconductor saturable-absorber mirrors," Optics Letters, vol. 22, p. 991-993, Jul. 1997.

J. König et al., "Plasma evolution during metal ablation with ultrashort laser pulses," Optics Express, vol. 13, pp. 10597-10607, Dec. 2005.

J. Li et al., "Laser dicing and subsequent die strength enhancement technologies for ultra-thin wafer," Electronic Components and Technology Conference, 2007, pp. 761-766, May 2007.

A. Ostendorf et al., "Processing thin silicon with ultrashort-pulsed lasers: creating an alternative to conventional sawing techniques," Proceedings of ICALEO 2003, LMF Section A, pp. 20-28, Oct. 2003.

L. Shah et al., "12 μJ, 1.2 W femtosecond pulse generation at 346 nm from a frequency-tripled Yb cubicon fiber amplifier," CLEO 2005, paper CPDB1, pp. 1-3, May 2005.

A.E. Siegman et al., "Choice of clip levels for beam width measurements using knife-edge techniques," J. of Quantum Electronics, vol. 27, pp. 1098-1104, Apr. 1991.

A.E. Siegman, "Defining the effective radius of curvature for a nonideal optical beam," J. of Quantum Electronics, vol. 27, pp. 1146-1148, May 1991.

R.F. Toftness et al., "Laser technology for wafer dicing and microvia drilling for next generation wafers," Proc. SPIE, vol. 5713, pp. 54-66, May 2005.

H.K. Tönshoff et al., "Speed rate improvement for microcutting of thin silicon with femtosecond laser pulses," Third International Symposium on Laser Precision Microfabrication, Proc. SPIE, vol. 4830, pp. 531-536, Jun. 2003.

International Search Report and Written Opinion of Patentability for PCT Application No. PCT/US2006/002531, mailed Sep. 12, 2007.

International Preliminary Report on Patentability for PCT Application No. PCT/US2006/002531, mailed Oct. 11, 2007.

Stuart, et al., "Nanosecond-to-femtosecond laser-induced breakdown in dielectrics," Phys. Rev. B, vol. 55, No. 4, pp. 1749-1761, Jan. 15, 1996.

Borowiec, et al., "Wavelength dependence of the single pulse femtosecond laser ablation threshold of indium phosphide in the 400-2050 nm range," Applied Surface Science, vol. 243, pp. 129-137, 2005, available online Nov. 11, 2004.

Serafetinides, et al., "Ultra-short pulsed laser ablation of polymers," Applied Surface Science, vol. 180, pp. 42-56, 2001.

Herrmann, et al., "Micromachining with picosecond lasers: precise, cost efficient, industrially reliable," Lumera Laser: Laser Technik Journal, pp. 1-11.

Herrmann, et al., "Micromachining with Picosecond Laser Pulses," ILS Article, Feb. 9, 2004.

M. Henry et al., "Cutting flexible printed circuit board with a 532nm Q-switched diode pumped solid state laser," Paper #M804, Proceeding of ICALEO, Laser Microfabrication Conference, pp. 412-419, 2005.

Wang, X.C., et al., "355 nm DPSS UV laser cutting of FR4 and BT/epoxy-based PCB substrates," Optics and Lasers in Engineering, vol. 46, pp. 404-409, Jan. 2008.

Yung, K.C., et al., "A study of the heat-affected zone in the UV YAG laser drilling of GFRP materials," Journal Mater. Process Technology, vol. 122, pp. 278-285, Mar. 2002.

Shah, et al., "12 µJ, 1.2 W Femtosecond Pulse Generation at 346 nm from a Frequency-tripled Yb Cubicon Fiber Amplifier," CLEO 2005 Postdeadline, CPDB1, in 3 pages, May 2005.

Schaffer et al., "Laser-induced breakdown and damage in bulk transparent materials induced by tightly focused laser pulses," Meas. Sci. Technol., vol. 12, pp. 1784-1794, Oct. 2001.

Eaton et al., "Thermal heating effects in writing optical waveguides with 0.1-5 MHz repetition rate," Photon Processing in Microelectronics and Photonics IV, ed. Fieret et al., Proc. of SPIE, vol. 5713, pp. 35-42, May 2005.

Eaton et al., "Heat accumulation effects in femtosecond laser-written waveguides with variable repetition rate," Optics Express, vol. 13, pp. 4708-4716, Jun. 2005.

* cited by examiner

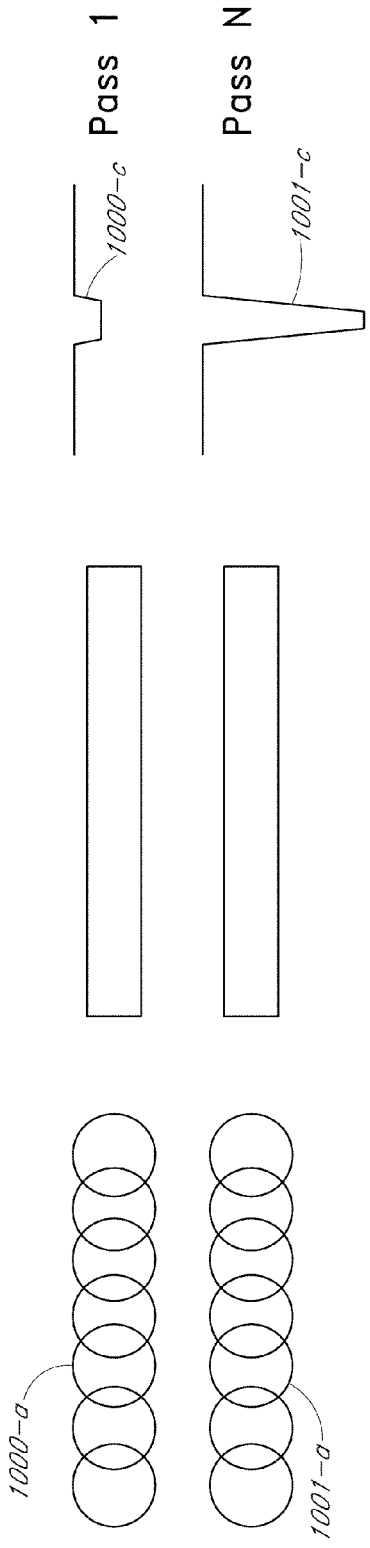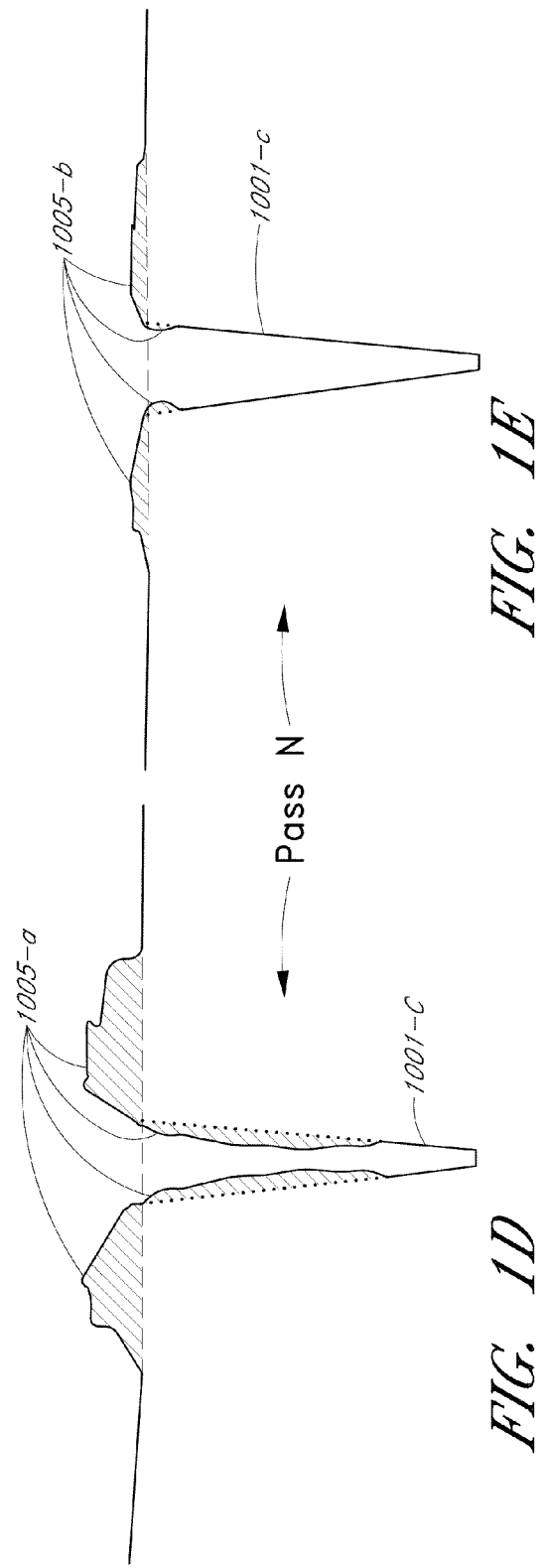

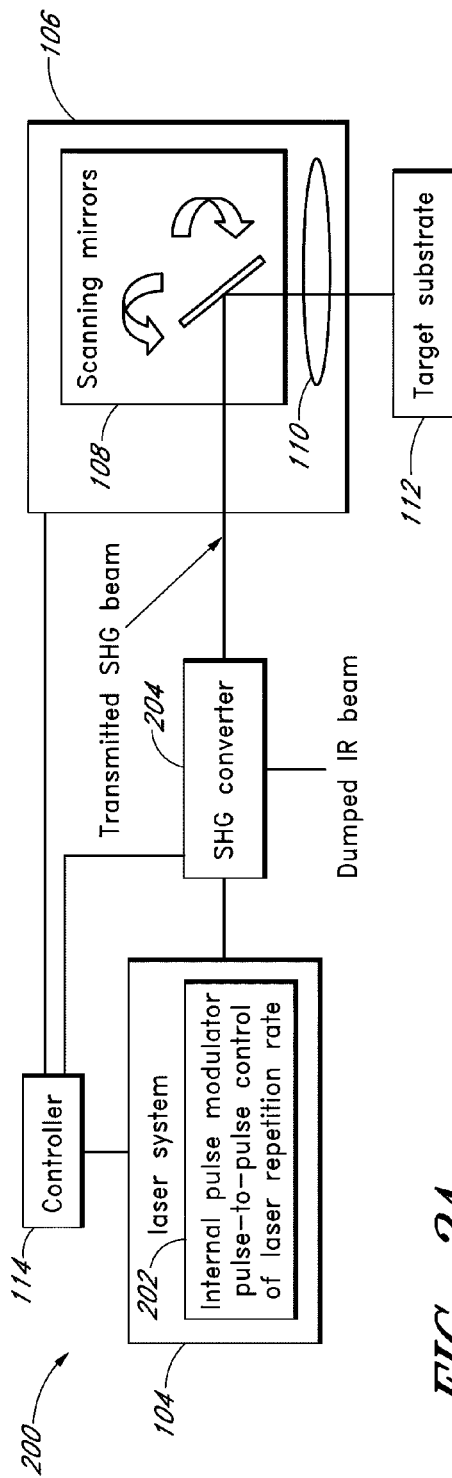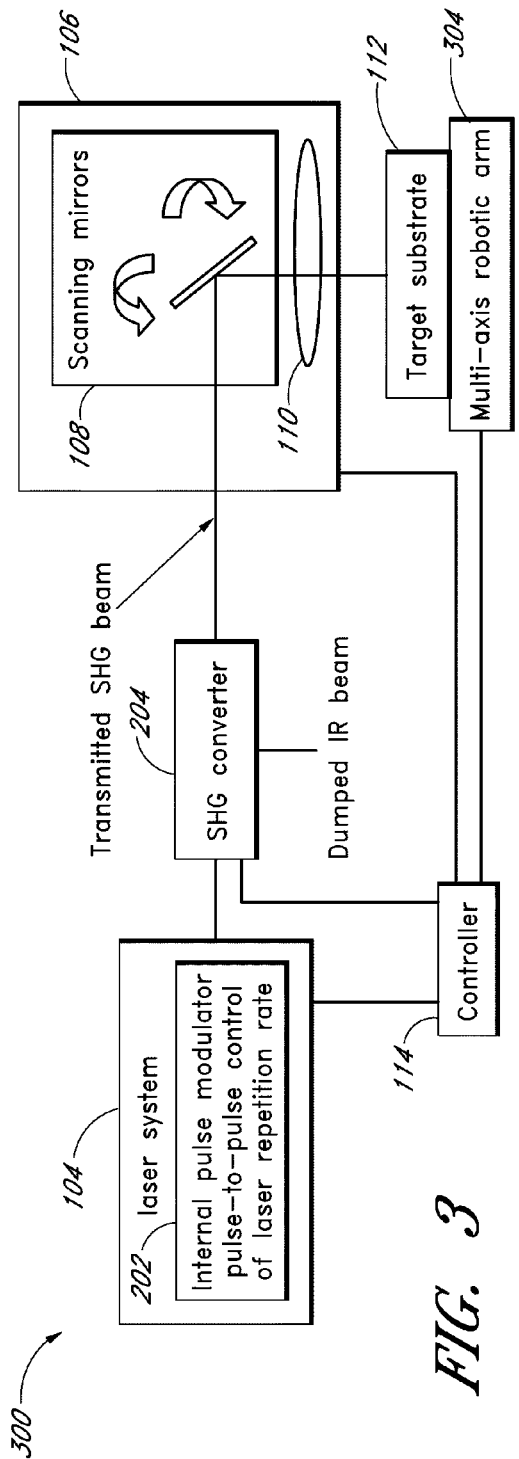

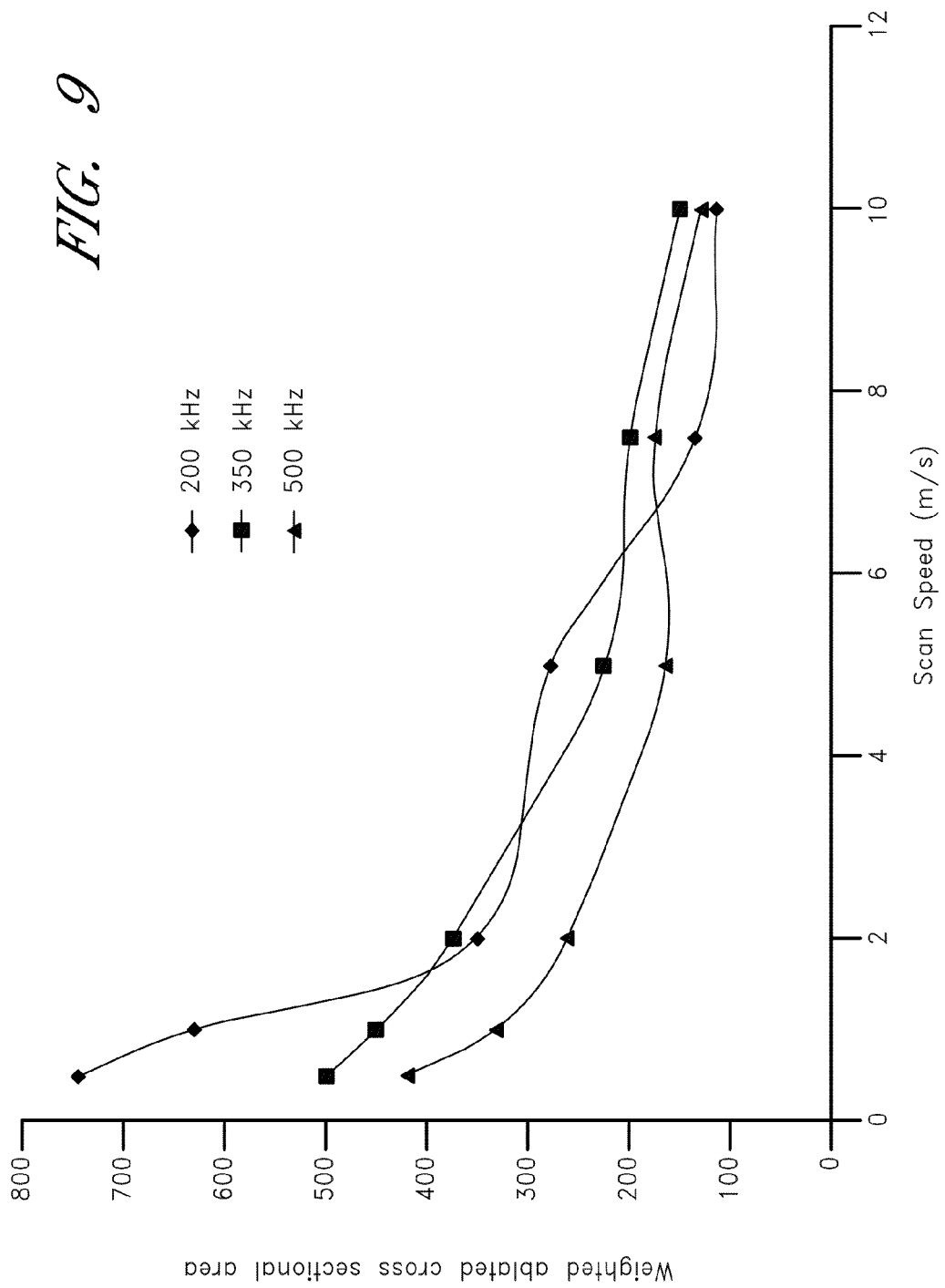

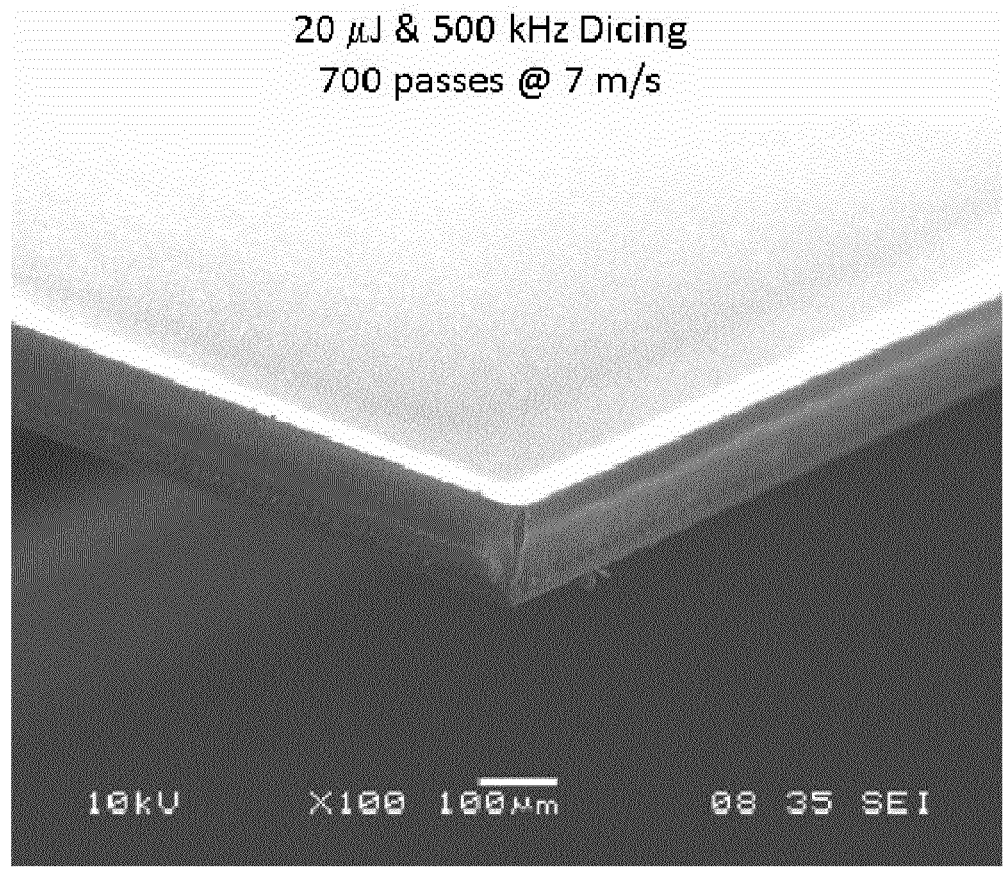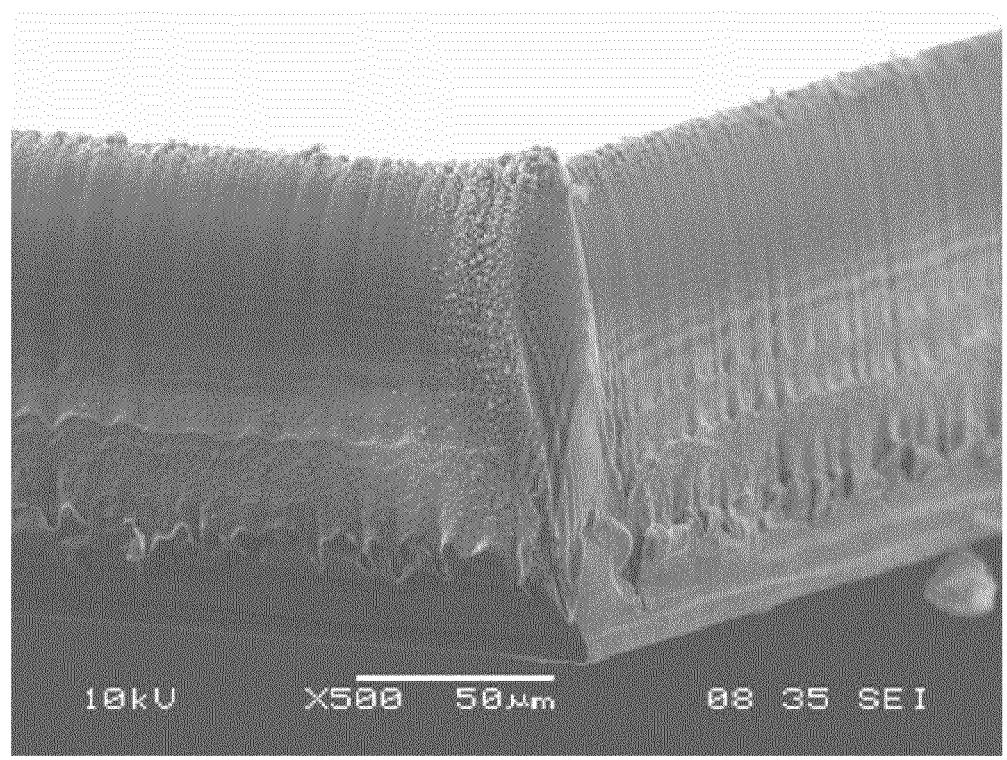
FIG. 12A

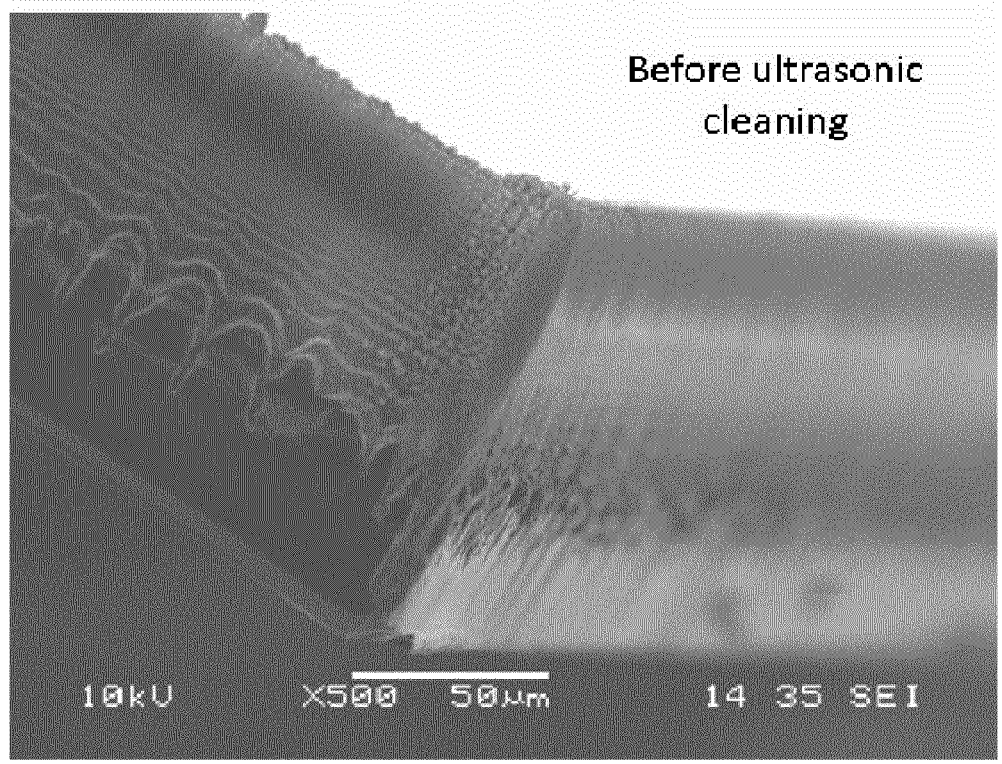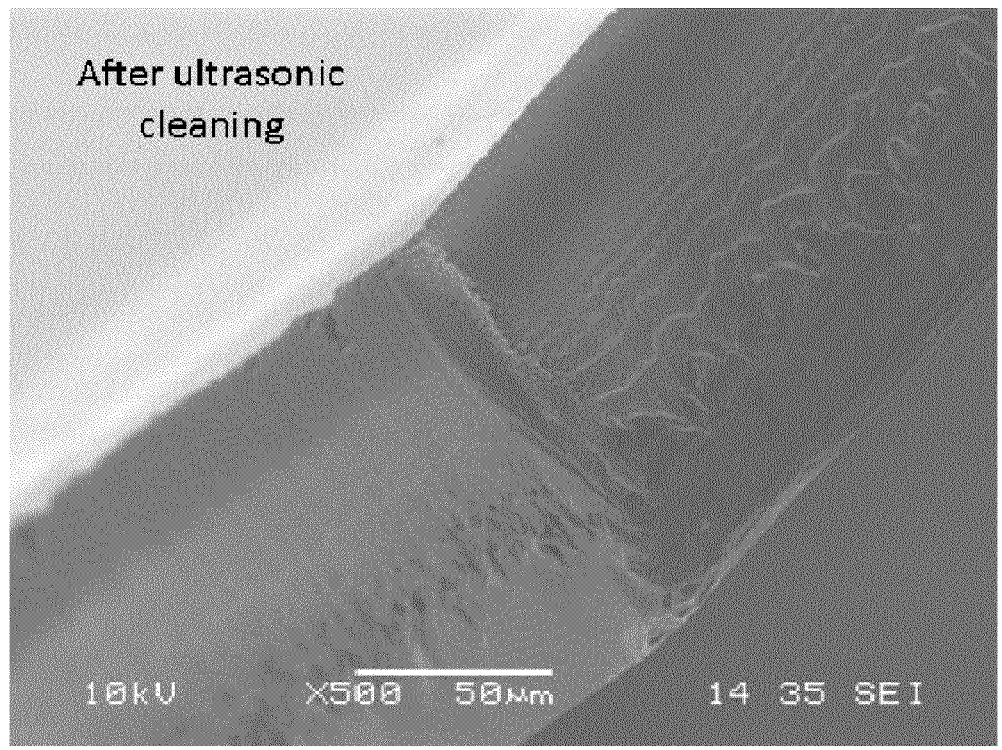
FIG. 12B

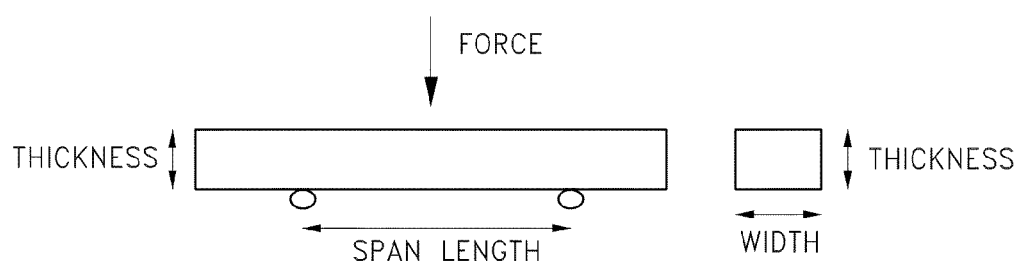
FIG. 14
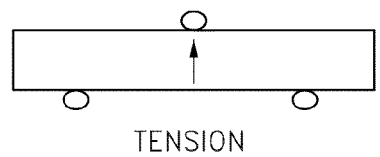 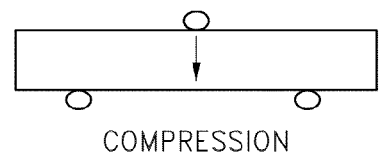
FIG. 14A-1    FIG. 14A-2

"SILICON BASED PATTERNED WAFER"
10 J AT 500 kHz
100 PASSES
~7.0 m/s fs Ablation ps Recast fs Textured ps Smooth

LASER-BASED MATERIAL PROCESSING METHODS AND SYSTEMS

CROSS REFERENCE TO RELATED APPLICATIONS

This application claims the benefit under 35 U.S.C. §120 and 35 U.S.C. §365(c) as a continuation of International Application No. PCT/US2009/037443 designating the United States, with an international filing date of Mar. 17, 2009, entitled "LASER-BASED MATERIAL PROCESSING METHODS AND SYSTEMS," which claims the benefit under 35 U.S.C. §119(e) to U.S. Provisional Patent Application No. 61/038,725, filed Mar. 21, 2008, entitled "LASER-BASED MATERIAL PROCESSING METHODS AND SYSTEMS," to U.S. Provisional Patent Application No. 61/110,913, filed Nov. 3, 2008, entitled "LASER-BASED MATERIAL PROCESSING METHODS AND SYSTEMS," and to U.S. Provisional Patent Application No. 61/152,625, filed Feb. 13, 2009, entitled "LASER-BASED MATERIAL PROCESSING METHODS AND SYSTEMS," the entire disclosures of each of the aforementioned international application and provisional applications are hereby incorporated by reference herein in their entirety.

This application is related to co-pending international patent application number PCT/US08/51713, filed Jan. 22, 2008, entitled "ULTRASHORT LASER MICRO-TEXTURE PRINTING," published as international publication no. WO 2008/091898, which claims the benefit of U.S. Provisional Patent Application No. 60/886,285, filed Jan. 23, 2007, entitled "ULTRASHORT LASER MICRO-TEXTURE PRINTING." This application is also related to U.S. patent application Ser. No. 10/813,269, filed Mar. 31, 2004, entitled "FEMTOSECOND LASER PROCESSING SYSTEM WITH PROCESS PARAMETERS, CONTROLS AND FEEDBACK," now U.S. Pat. No. 7,486,705. Each of the above-identified patent applications, publication, and patent is owned by the assignee of the present application. The disclosures of each of the above-identified applications, publication, and patent are hereby incorporated by reference herein in their entirety.

BACKGROUND

1. Field

This disclosure relates generally to pulsed lasers and machining materials using high repetition rate pulsed lasers.

2. Description of the Related Art

Several material processing applications including, for example, thin silicon wafer dicing, printed circuit board (PCB) drilling, solar cell manufacturing, and flat panel display manufacturing, involve similar material processing techniques and problems. Early solutions included mechanical and lithographic processing techniques. However, the reduction in device size, increased device complexity, and the environmental cost of chemical processing transitioned the industry toward laser processing methods. High power diode-pumped solid state lasers having typical wavelengths of 1 µm, or frequency converted versions having green or UV wavelengths, are now utilized. One method utilized in some applications includes progressively cutting through the material with repetitive passes at relatively high scanning speeds. In such applications, there are three main problems: (a) cleaning cutting through the desired material without causing damage to the material (e.g., residual stress, delamination, thermally induced material modification, etc.), (b) achieving a sufficiently high volume material removal rate to be commercially viable, and (c) reduction/elimination of recast material.

Various options have been suggested for efficient and high-quality laser-based machining of materials, including operation at high repetition rates with less debris and melt. However, the problem of limiting accumulation of re-deposited material near a processing site has not been sufficiently addressed, and is generally a difficult problem to overcome. As high material removal rates are required for rapid processing, the relatively large amount of ablated material ejected from a processing site may generally include one or more of liquid melt, relatively large quantities of solid material, and vapor. Fine distributions of particles, down to the nanometer scale (e.g., 10 nm), may also be redeposited.

In various applications, the problem of limiting accumulation has been addressed with process modifications. For example, in some current semiconductor-industry techniques, a substrate may be coated with a sacrificial layer of material that is removed with the redeposited material after laser processing. This process step may be used alone or in combination with post-processing of the substrate with various chemical solvents to remove the recast. However, such techniques reduce throughput and increase costs by adding additional processing steps and additional consumable materials. As such, a preferred solution would eliminate the need for such debris removal.

Process debris may include slag, melted regions, heat-affected zones (HAZ), and so forth. In some cases, the debris cannot be effectively removed using conventional non-chemical cleaning techniques such as, for example, cleaning in an ultrasonic bath.

Moreover, low-k material and composite layers utilized in integrated circuits and semiconductor devices introduce challenges for certain implementations of laser-based material processing. Low-k material can include material that has a dielectric constant that is less than the dielectric constant of silicon dioxide. For example, low-k material can include dielectric materials such as doped silicon dioxide, polymeric dielectrics, etc.

SUMMARY

Because of the foregoing challenges and limitations, the inventors have recognized a need exists not only to efficiently machine materials but also to limit accumulation of redeposited material. Solutions which would eliminate expensive processing steps are highly desirable. Therefore, various embodiments of the systems and methods disclosed herein may be used for laser-based modification of target material of a workpiece while simultaneously achieving improvements in processing throughput and/or quality.

In one general aspect, a method of laser processing a workpiece is provided. The method may comprise focusing and directing laser pulses to a region of the workpiece at a pulse repetition rate sufficiently high so that material is efficiently removed from the region and a quantity of unwanted material within or proximate to the region is reduced relative to a quantity obtainable at a lower repetition rate. For example, the pulse repetition rate may be in a range from about 100 kHz to about 5 MHz in some embodiments of the method.

In another general aspect, a method of laser processing a workpiece may comprise focusing and directing laser pulses to a region of the workpiece at a pulse repetition rate sufficiently high so that heat accumulation within one or more materials is controlled in such a way that provides for rapid material removal, while limiting accumulation of redeposited material about the processed area. The method may allow control of a heat-affected zone (HAZ).

In another general aspect, a method of laser processing a workpiece includes irradiating at least one material of the workpiece with laser pulses having a pulse width. The laser pulses may be focused onto spots in the at least one material. The focused spots may be relatively scanned with respect to the material at a scanning rate. In some implementations, the workpiece comprises a patterned region and a bare semiconductor wafer region. The patterned region can comprise at least one of a dielectric material and a metal material. In some embodiments, the scanning rate used for removal of at least a portion of the patterned region is substantially less than the scanning rate used for removal of at least a portion of the bare wafer region.

In some embodiments, an overlap between adjacent focused spots is substantially greater for irradiation of the patterned region than for irradiation of the bare wafer region. For example, the overlap for irradiation of the patterned region may be greater than about 95% in some cases.

In some embodiments, at least a portion of material within the patterned region is modified using a pulse width in a range of about 100 ps to about 500 ps. In some embodiments, at least a portion of material within the semiconductor wafer region is modified using a pulse width in a range of about 100 fs to about 10 ps.

At least one implementation includes an ultrashort pulse laser system suitable for carrying out embodiments of the above methods of laser processing. At least one embodiment includes an ultrashort pulse laser system that comprises at least one of a fiber amplifier or a fiber laser. At least one embodiment includes an ultrashort pulse laser system configured as an "all-fiber" design.

In various embodiments, a pulsed laser system provides a pulse width of at least one pulse that is less than about 10 ps In some embodiments, a pulse width of at least one pulse is less than about a few nanoseconds, for example a sub-nanosecond pulse.

Embodiments of a method of scribing, dicing, cutting, or processing to remove material from a region of a multi-material workpiece are provided. In some embodiments, the method comprises directing laser pulses toward at least one material of a multi-material workpiece. The laser pulses can have a pulse width in a range from tens of femtoseconds to about 500 picoseconds and a pulse repetition rate of a few hundred kHz to about 10 MHz. The workpiece can comprise both a pattern and a semiconductor wafer, and the pattern can comprise at least one of a dielectric material and a metal material. The method can also include focusing the laser pulses into lasers spots having spot sizes in a range from a few microns to about 50 µm ($1/e^2$) and positioning the laser spots relative to the at least one material at a scan speed such that an overlap between adjacent focused spots for removal of material from at least a portion of the pattern is substantially greater than an overlap between adjacent focused spots for removal of material from at least a portion of the semiconductor wafer. In certain advantageous implementations, the method controls heat accumulation within one or more materials of the workpiece, while limiting accumulation of redeposited material about the region.

Embodiments of a method of processing a workpiece that comprises a pattern and a semiconductor wafer are provided. The pattern can comprise at least one of a dielectric material and a metal material. In some embodiments, the method includes modifying at least a portion of the pattern with a laser pulse comprising a pulse width in the range from about 100 ps to about 500 ps and modifying at least a portion of the semiconductor wafer with a laser pulse comprising a pulse width in a range from about 100 fs to about 10 ps.

Embodiments of a method of laser processing a multi-material workpiece having a semiconductor material are provided. In some embodiments, the method comprises focusing and directing laser pulses to a region of the workpiece at a pulse repetition rate in a range from about 100 kHz to about 10 MHz and at a repetition rate sufficiently high so that material is efficiently removed from the region and a quantity of unwanted material within or proximate to the region is limited relative to a quantity obtainable at a lower repetition rate below about 100 kHz.

In other embodiments, methods of laser processing a multi-material workpiece having a semiconductor material are provided. In some such embodiments, the method comprises repeatedly irradiating at least one target material of the workpiece with focused laser pulses at a scan rate and a pulse repetition rate. The repetition rate may be in a range of at least about a few hundred kHz to about 10 MHz, and the scan rate may be in a range of about 0.2 m/s to about 20 m/s. In various embodiments of the method, at least some of the focused laser pulses have a non-zero spatial overlap factor with at least one other pulse, a pulse width less than about 1 ns, a pulse energy in a range of about 100 nJ to about 25 µJ, a focused ($1/e^2$) spot size in a range of about 5 µm to about 50 µm, and a fluence in a range of about 0.25 J/cm$^2$ to about 30 J/cm$^2$ at the target material.

Embodiments of method of processing a multi-material workpiece are disclosed. The workpiece can comprise a semiconductor material and a pattern, and the pattern can comprise at least one of a dielectric material and metal material. In some embodiments, the method comprises irradiating the workpiece with a series of laser pulses, with at least two pulses of the series having different characteristics that are applied to different materials of the workpiece. The method also comprises controlling heat-affected zone (HAZ) such that at least one HAZ generated during removal of at least one of the dielectric material and the metal material is increased depthwise relative to at least one HAZ generated during removal of a portion of the semiconductor material.

Embodiments of a method of processing a workpiece comprising both a pattern and a semiconductor wafer region are disclosed. The pattern can comprise a dielectric material and a metal material. In some embodiments, the method comprises modifying at least a portion of the pattern with focused laser pulses, with at least one focused pulse comprising a pulse width in a range of about 100 fs to about 500 ps. The method also includes accumulating sufficient heat in the portion of the pattern to avoid delamination of the dielectric material from the metal material.

Embodiments of a laser-based system for scribing, dicing, cutting, or processing a multi-material workpiece having a semiconductor material are provided. In some embodiments, the laser-based system comprises a source of optical pulses and an optical amplification system configured to amplify a pulse from the source to a pulse energy of at least about 1 µJ and to generate output optical pulses having at least one pulse width in a range from about 500 fs to a few hundred picoseconds. The system may also include a modulation system, comprising at least one optical modulator, configured to adjust a repetition rate of the output optical pulses to be within a range from about 100 kHz to about 10 MHz, and a beam delivery system configured to focus and deliver pulsed laser beams to the workpiece, such that a pulsed beam is focused into a spot size ($1/e^2$) in a range from about 15 µm to about 50 µm. The system may also include a positioning system configured to scan the beams relative to the one or more materials of the workpiece at a scan rate in a range from about 0.1 msec to about 20 msec, and a controller configured to be coupled to at least the positioning system. The controller can be configured to control a spatial overlap between adjacent focused beams during processing of the workpiece at the repetition rate.

Embodiments of a laser-based system for scribing, dicing, cutting, or processing of a multi-material workpiece having a semiconductor material are described herein. Embodiments of the system comprise a source of optical pulses and an optical amplification system configured to amplify a pulse from the source and to generate output pulses having at least one pulse width in a range from tens of femtoseconds to about 500 picoseconds. The system can also include a modulation system, including at least one optical modulator, configured to provide a repetition rate of the output optical pulses to be in a range from at least about 1 MHz to less than about 100 MHz. The system also can include a beam delivery system configured to focus and deliver pulsed laser beams to the workpiece, such that a pulsed beam is focused into a spot size ($1/e^2$) of at least about 5 microns, and a positioning system configured to scan the beams at a scan rate that produces a spot overlap on or within the one or more materials of the workpiece. The spot overlap in various implementations may be at least about 95% at the repetition rate and the spot size.

Embodiments of a system for dicing, cutting, scribing, or forming features on or within a workpiece having a semiconductor material are provided. In some embodiments, the system comprises a pulsed laser system configured to repeatedly irradiate at least a portion of the material with focused laser pulses at a scan rate and a pulse repetition rate. The repetition rate can be in a range of about 100 kHz to about 5 MHz and sufficiently high to efficiently remove a substantial depthwise portion of material from a target location and to limit accumulation of unwanted material about the target location. The system can also include a beam delivery system configured to focus and deliver the laser pulses, and a positioning system configured to position the laser pulses relative to the semiconductor substrate at the scan rate. The positioning system can comprise at least one of an optical scanner and a substrate positioner. In some embodiments, a controller is configured to be coupled to the pulsed laser system, the beam delivery system, and the positioning system. The controller can be configured to control a spatial overlap between adjacent focused laser pulses during processing of the workpiece at the repetition rate.

BRIEF DESCRIPTION OF THE DRAWINGS

FIGS. 1A-1C schematically illustrate top and cross-sectional views representing an embodiment of a multiple pass laser-based method for material removal.

FIGS. 1D-1E schematically illustrate cross-sectional views representing a relation between machining depth and formation of unwanted re-deposited material after N passes.

FIG. 1E is a schematic representation of a result obtainable with at least one embodiment of a pulsed laser system.

FIG. 1G-1 illustrates a wafer having several die, and FIG. 1G-2 illustrates an expanded view of a portion of the wafer of FIG. 1G-1, and FIG. 1G-3 illustrates a cross sectional side-view of a portion of the wafer.

FIGS. 2A-2B schematically illustrate embodiments of a system for processing a workpiece with laser pulse trains.

FIG. 3 schematically illustrates another embodiment of a system for processing a workpiece with laser pulse trains FIG. 4A schematically illustrates yet another embodiment of a system for processing a workpiece with laser pulse trains.

FIG. 9 is a plot of further illustrating examples of cross-sectional area versus scan speed, normalized for average power and spatial overlap of spots.

FIGS. 10A-1 and 10A-2 show example SEM cross-sections, wherein a quantity of re-deposited material is sufficiently low such that conventional ultrasonic cleaning is effective for further debris removal, the result being applicable to, for example, thin-wafer dicing and similar applications.

FIGS. 12A-12B are SEM images showing a portion of a wafer cut (diced) using an embodiment of a pulsed laser system, and a result obtained after conventional ultrasonic cleaning.

FIGS. 13A-1-13A-3 are SEM images showing results obtained with various repetition rates and scan speeds using about 200 ps pulse widths.

FIGS. 13A-4-13A-5 are plots showing weighted ablated cross-sectional area (in square microns) and a ratio of ablated depth to recast height, respectively, corresponding to the data shown in FIGS. 13A-1-13A-3.

FIGS. 14 and 14A-1 and 14A-2 schematically illustrate various examples of configurations used to test die strength of semiconductor devices.

FIG. 17 also includes published nanosecond laser results and mechanical test results for comparison. Circles are used to show results for dies in tension, and squares are used to show results for dies in compression. Average values (and error bars) corresponding to the experimental test results are offset horizontally (to the right) of the individual experimental test results with 500 fs and 300 ps pulses.

Figure 1F:
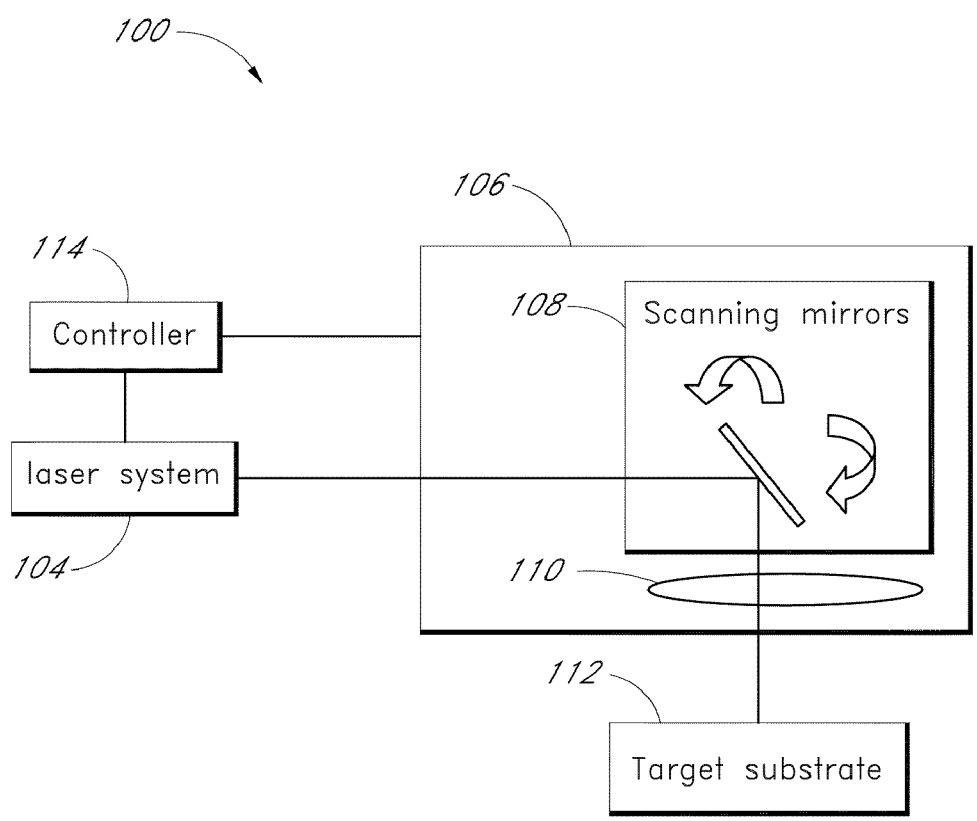
FIG. 1F schematically illustrates an embodiment of a laser system suitable for processing a workpiece with laser pulses.

These and other features will now be described with reference to the drawings summarized above. The drawings and the associated descriptions are provided to illustrate embodiments and not to limit the scope of the disclosure.

DETAILED DESCRIPTION OF PREFERRED EMBODIMENTS

In the following detailed description, target material generally refers to material in or on at least one region of a workpiece that is to be modified by one or more laser pulses. The target material may comprise multiple materials having different physical properties.

In the following detailed description, repetition rate, unless otherwise stated, generally refers to a rate at which laser pulses are delivered to a target material during laser processing of the material. The rate may correspond to the rate at which pulses are generated by a laser source, but the rate may also be reduced relative to the source rate in embodiments where, for example, a pulse or group of pulses is gated and delivered to the target material.

In the following detailed description, reference is made to limiting accumulation of unwanted material within or proximate to a target material, target region, or the like. Unless otherwise stated, alternative language is to not to be construed as only one of the two (or more) alternatives, but may include both (or more) alternatives.

As used herein the term debris is not limiting, and generally refers to unwanted accumulation of material within or proximate a localized region. Debris may result from laser-material interaction and/or a heat affected zone (HAZ). Recast, slag, redeposit and other related terms are also well known in the art. Typically a heat affected zone includes material heated and cooled fast enough to form molten material, and the extent of the region depends, among other factors, on the pulse duration and various material parameters. Short pulses, particularly ultrashort pulses, are known to localize the heat and reduce the dimension of a heat-affected zone.

Overview

Embodiments are generally applicable for laser processing a workpiece, and particularly for micromachining applications. For example, various embodiments are applicable to cutting, dicing, scribing, and/or engraving semiconductor substrates to form features having a typical lateral dimension of about 1 micron to about 100 microns and a depth from a few microns to hundreds of microns. For example, certain embodiments may be utilized for fabrication of precise trenches and grooves in a variety of materials. Extremely precise trenches in silicon are required for a variety of microelectronic applications. Several research groups have demonstrated that the best results are obtained using femtosecond laser pulses with the laser intensity just above the ablation threshold (see, e.g., Barsch, Korber, Ostendorf, and Tonshoff, "Ablation and Cutting of Planar Silicon Devices using Femtosecond Laser Pulses," Appl. Physics A 77, pp. 237-244, (2003) and Ostendorf, Kulik, and Barsch, "Processing Thin Silicon with Ultrashort-pulsed Lasers Creating an Alternative to Conventional Sawing Techniques," Proceedings of the ICALEO, Jacksonville, USA, October 2003)

Currently, the preferred method for micro-fluidic device fabrication is via lithographic processing, often involving several cycles of ultraviolet (UV) light exposures that is followed by a solvent etch. Femtosecond lasers are capable of directly machining blind and through holes of modest aspect ratio (1:10-1:100, depending upon substrate material, laser parameters and hole diameter).

It is well known that ultrashort laser pulses offer important advantages relative to conventional nanosecond lasers: reduced HAZ, reduced residual stress, less sensitivity to variations in material ablation thresholds. Furthermore, it is well established that relatively high processing rates can be achieved by scaling laser average power (assuming fluence on the target is greater than the material ablation threshold) and using high speed multi-pass beam scanning. Ultrashort laser processing is also generally recognized as a suitable approach for reduction of slag, residue, melt formations, or other unwanted by-products of laser-material interaction. However, it is also well established that the use of ultrashort pulses alone cannot guarantee improved quality. Many early experiments were carried out in vacuum which simplified processing. Citations to various publications, patents, and published patent applications relating to material processing with ultrashort pulses, micromachining of one or more of semiconductor, metal, or dielectric materials used in semiconductor device manufacturing, laser-material interaction mechanisms, and systems for micromachining may be found in the priority U.S. provisional patent applications.

Embodiments disclosed herein may be utilized to form high aspect ratio features in a material, wherein a depth to width ratio is large. Such features, sometimes referred to as grooves or trenches, may be formed by controllably removing material from a workpiece surface. The material may be removed by repeatedly scanning focused laser pulses over a target region with a mechanism to position the target material and/or the laser pulses relative to each other.

Some embodiments may be utilized for laser cutting of materials, particularly semiconductor substrates. Such embodiments may also include the formation of high-aspect ratio features as part of the process. For example, thin wafer dicing advantageously may use clean and precise cuts to separate wafer die without damaging nearby circuitry or structures. The wafer may be diced using focused laser pulses to cut through the entire wafer, perhaps changing the depthwise position of focus during cutting in some embodiments. Alternatively, laser pulses may form a high aspect ratio feature, for example, a narrow and deep cut of pre-determined depth. A thin depthwise portion of remaining material is then separated using a non-laser method. In any case, it may be advantageous for debris and contamination to be sufficiently well controlled.

FIGS. 1A-1C are schematic illustrations showing a portion of a process for laser-based material modification. Examples of focused laser spots 1000-*a*, 1001-*a* are shown with an overlap factor which may be a small fraction of a spot diameter in some embodiments. The overlap factor may be different than schematically shown in FIG. 1A. For example, the overlap factor may be approximately the same from spot to spot (e.g., as schematically illustrated in FIG. 1A) or the overlap factor may differ from spot to spot. Different laser passes may utilize different overlap factors (and/or spot shapes, spot diameters, etc.). In various implementations, some adjacent spots can substantially overlap (e.g., having an overlap factor that is a small fraction of a spot diameter) or some adjacent spots can be spaced apart (e.g., having an overlap factor that is approximately the same, or larger, than the spot diameter). In various embodiments, an overlap factor may be selected to provide machined features with, for example, smooth straight edges, or selected to affect heat accumulation within a region. In such embodiments, the overlap factor (or other parameters) can be pre-selected prior to machining, selected or adjusted dynamically during machining, or a combination of pre-selection and dynamic selection can be used. Although FIG. 1A illustrates the focused laser spots 1000-a and 1001-a as circles having the same spot diameter, the focused laser spots can have other shapes and sizes in other embodiments. Many variations in spot shape, spot size, overlap factor, etc. are possible.

The spots may be applied to target material of a workpiece with one pass or with multiple passes, for example with a scanning mechanism (not shown). In FIGS. 1A-1C, the upper illustrations schematically show the first pass of the laser pulses (Pass1), and the lower illustrations show the $N^{th}$ pass of the laser pulses (Pass N). In various embodiments, any suitable number N of processing passes may be used, for example, 1, 2, 5, 10, 100, 250, 700, 1000, or more passes. A simplified top schematic view of a target region is shown in FIG. 1B, showing a region where material was removed with the circular spots 1000-a, 1001-a. The region has a lateral dimension on the order of a spot diameter, although it is generally known that with ultrashort pulses it is possible to controllably remove material over a region smaller than a spot dimension, as taught in, for example, U.S. Pat. No. 5,656,186. In the top views shown in FIGS. 1A-1C, the region where material is removed is schematically shown as a rectangle, although at least the edges orthogonal to the scan direction are typically somewhat rounded, particularly with the use of focused laser beams having an elliptical or circular cross section.

With various embodiments, the features may be formed with laser spots to remove a depthwise portion of the target material, for example, about 0.5 µm or a few microns in some embodiments. In a single pass, a relatively small depth-portion 1000-c is removed (see upper illustration in FIG. 1C). A second pass, or N passes, then remove additional depthwise portions, as schematically represented by curve 1001-c (see lower illustration in FIG. 1C). After N passes a feature may be formed having a desired depth and/or spatial profile. Alternatively, with a sufficiently large number of passes, the material may be cleanly severed (e.g., cut all the way through the material, sometimes called "breakthrough"). In various embodiments, the number of passes N may be 1, 2, 3, 4, 5, 10, 25, 100, 250, 500, 750, 1000, 1500, 2000, 5000, or more. The number of passes may be selected based on factors including, for example, the desired depth and/or spatial profile of the feature, the material(s) forming the workpiece, whether breakthrough is desired, and so forth. The number of passes may be dynamically adjusted during processing.

FIG. 1B schematically shows a simple linear/rectangular machined pattern as viewed from above the workpiece. However, machined features may be circular, elliptical, interleaved, spiral or other arbitrary shapes that will be formed by programming the relative positions of the laser pulse source and target material (e.g., with a scanning mechanism, as will be further illustrated below). Similarly, the focused spot distributions may be non-circular and/or may have Gaussian or non-Gaussian spot profiles. Further, various shapes may be formed as a function of depth, for example tapered, stepped, and/or curved features wherein the width of the feature varies with depth in a pre-determined manner, or approximately so. High aspect ratio features may be formed alone or in combination with other features, and may be connected to a region having a lower aspect feature, for example a large diameter hole. Many variations are possible with the systems and methods disclosed herein.

Some parameters of interest for embodiments of "trench digging" or other applications may include, for example, the shape, depth, and quality of the trench. However, in many applications, redeposited material, commonly called recast or slag, may be formed at or very near the edges of the narrow trenches. The quantity of redeposited material generally increases with increased machining depth.

FIG. 1D schematically illustrates a cross-sectional view of a machined feature 1001-c having a depth (as in FIGS. 1A-1C), but having significant redeposited material 1005-a. The redeposited material 1005-a may be above a surface of the workpiece and/or within the machined feature 1001-c. A baseline of the non-processed substrate is depicted as the dashed lines in FIGS. 1D and 1E. The redeposited material may also accumulate within a feature or target region, for example within a depth of several microns below the baseline (see FIG. 1D).

FIG. 1E is representative of an example result obtainable with pulsed laser embodiments, wherein, for a fixed number of passes N, accumulation of redeposited material 1005-b is reduced (compared to the result schematically shown in FIG. 1D). As illustrated in FIG. 1E, the cross sectional area of redeposited material is reduced (relative to FIG. 1D) and/or the type of material deposited is in the form of fine particles as opposed to molten material of a larger dimension. For example, in some embodiments, such a result is obtainable by increasing the laser repetition rate and, in this example, holding other laser parameters approximately constant. In various embodiments, the accumulation of the redeposited material may be reduced within the target region, proximate to the target region, or both. In various embodiments, the nature of the redeposited material (e.g., the size distribution of the particles) may be altered within the target region, proximate to the target region, or both. FIGS. 1C, 1D, and 1E schematically illustrate the machined features 1000-c and 1001-c as having a cross-section shaped generally as a trapezoid. The trapezoidal cross-sectional shape is intended to be schematic and is not intended as a limitation on the cross-sectional shape (or any other characteristic) of features that can be machined with various embodiments of the laser-based processing systems and methods disclosed herein. In other embodiments, features can be machined that do not have trapezoidal cross-sectional shapes such as, for example, triangular shapes, rectangular shapes, rounded shapes, tapered shapes converging to a minimum width much smaller than the a maximum width, or any other suitable shape. Many feature shapes and sizes are possible. Also, the cross-sectional size and shape of the redeposited material 1005-a, 1005-b are intended to be schematic and are not intended as a limitation on the sizes and/or shapes of possible redeposited material.

By way of example, results from machining experiments on silicon substrates showed a surprising result: increasing the laser repetition rate of laser pulses from about 200 kHz to about 1 MHz, while maintaining approximately constant laser pulse energy, focal spot size, and pulse duration, produced an increase in the volume of material removed relative to the amount of material redeposited. The experiments were carried out using a fiber-based ultra-short chirped pulse laser system. The results suggest that pulse repetition rates of several hundred kHz up to several MHz may provide a significant improvement in processing quality. For example, in certain applications, additional processing steps may not be required to remove redeposited material.

Obtaining both a desired feature shape and reduction in redeposited material were best achieved with ultrashort pulses, for example, pulses less than about 10 ps in width. However, increased repetition rate was also beneficial with longer pulses of about 200 ps. The accumulation of redeposited material was reduced relative to slower repetition rates. For some applications, benefits may also be found with longer pulse widths, for example up to a few nanoseconds, or below 10 ns.

Embodiments may therefore decrease the quantity of slag and/or other unwanted material (and/or change the nature of the redeposited material), while providing for a desired shape, depth, and/or width of the features. By way of example, and as will be shown later, high repetition rate processing affected the nature and quantity of re-deposited material.

In certain embodiments, a measure of quality may be the depth and/or volume of a machined feature relative to a peak height, average height, and/or volume of redeposited material. Another example measure of quality may be the feature depth relative to the total volume of redeposited material. Suitable measures of quality may be obtained with cross-sectional samples or volumetric quantification of an affected region. Various tools may be used to quantify performance, for example, surface metrology tools such as white light interferometers, Atomic Force Microscopes (AFMs), or similar tools (available from, for example, Veeco Instruments Inc., Woodbury, N.Y.). The tools may provide for improved measurement accuracy and precision, with capability for automated or semi-automated operation. The commercially available tools have proven capability for measuring surface roughness of a sample and also larger volumes of material, and AFMs may be used to quantify structure of the depthwise features, for example.

In some applications, for example dicing and scribing, different quality measures may be provided. For example, quantification of the volume of redeposited material may be a useful measure, and may be combined with cut quality as an overall figure of merit. Various embodiments are particularly applicable for processing operations where high efficiency is desirable, and wherein accumulation of redeposited material is detrimental or otherwise undesirable.

In some embodiments micromachining may include laser scribing, dicing, or similar processing of semiconductor wafers, which may be bare or patterned. Scribing and dicing are two applications with a recognized need. Scribing typically removes one or more layers of multiple materials supported on a silicon substrate. The die of a wafer may then be separated with a mechanical dicer. With decreasing of silicon substrate thickness to below 100 μm, for example 50 μm, an increased need for laser based dicing of the substrates has developed. However, in some implementations, rapid laser processing speeds are required to provide justification to replace conventional mechanical dicing. Moreover, in some implementations, undesirable thermal effects are to be reduced or avoided to assure reliability of subsequent packaging processes.

Figures 1, 1G:
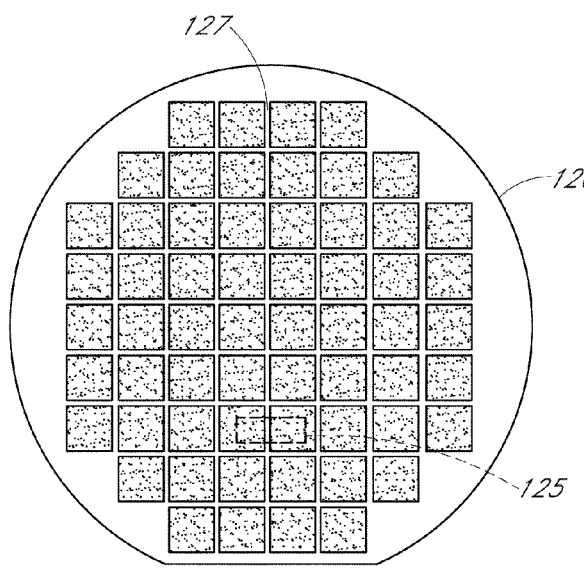
FIGS. 1G-1 to 1G-3 schematically illustrate examples of portions of patterned wafers.

FIGS. 1G-1 (not to scale) schematically illustrates an example of a patterned semiconductor wafer 120 having several die arranged in rows and columns with streets 127 therebetween. In conventional systems the wafer is typically laser scribed, and cut using a dicing saw. As the thickness decreases below about 100 μm, for example 50 μm or 75 μm, mechanical dicing becomes more difficult. Therefore, it is desirable to use laser dicing to reduce or eliminate mechanical dicing.

Figures 1, 1G, 2, 3:
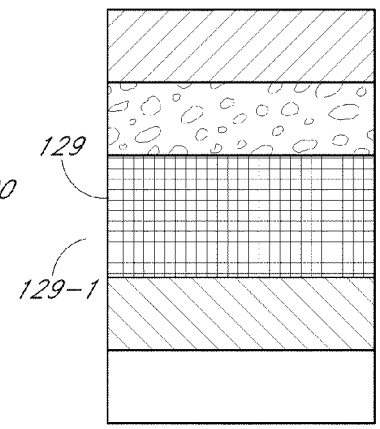
Figures 1, 1G, 2:
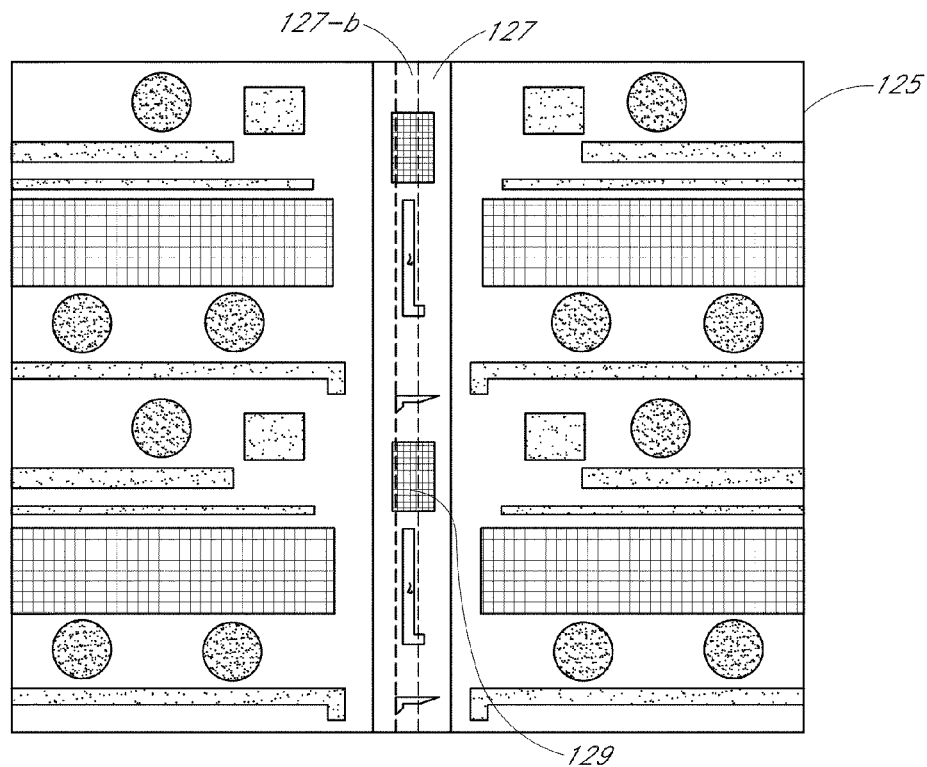

FIG. 1G-2 schematically illustrates an example portion 125 of the wafer 120. By way of example, dicing is to be carried out in region 127-B along the streets. The region may include several materials and bare wafer portions. The circuit features shown in the streets, for example high-density grid layer 129, may be utilized for electrical or other functional tests prior to dicing. The regions adjacent to street 127 contain high density active circuits, interconnects which may include solder balls, or other combinations. In certain advantageous implementations, the dicing or scribing is to be carried out to cleanly cut the wafer without causing damage to circuitry, without introducing significant debris or heat affected zone (HAZ), and should provide for sufficient die strength.

FIG. 1G-3 schematically illustrates a cross sectional side-view 129-1 of a portion of the wafer, the fine grid area 129 of FIG. 1G-2. The grid may be covered with one or more of dielectric and metal materials.

Because potential processing speed is one possible reason for use of laser technology for thin-wafer dicing, a practical system for dicing very thin wafers is to provide for removal of a relatively large amount of material at high speed.

Workpiece materials in the streets may include, but are not limited to, metals, inorganic dielectrics, organic dielectrics, semiconductor materials, low-k dielectric materials, or combinations thereof. The combinations of materials may be arranged in widely varying spatial patterns and/or stacked in depth. For example, microelectronic circuits may comprise portions having alternating layers of copper and low-k material, covered by an overlying passivation layer. Other combinations and/or configurations of materials are possible.

Various studies disclosed results and models for micromachining of Silicon. For example, Crawford et al, in "Femtosecond laser machining of grooves in Silicon with 800 nm pulses, Applied Physics A 80, 1717-1724 (2005) investigated ablation rates (in vacuum) as a function of pulse energy, translation speed, number of passes, and polarization direction (parallel vs. perpendicular to translation direction, and with circular polarization). Laser parameters included 150 fs pulses at 800 nm wavelength with laser pulse repetition rate of 1 KHz. Maximum translation speed was about 500 μm/sec. A spot size was about 5 μm.

Single and multiple pass results were reported, and motion effects analyzed. A model was disclosed, including the effects of motion with high overlap between pulses assumed. The approach included determining an accumulated fluence at a point along the center of a groove. Despite providing a useful framework for analysis, it was recognized that the effective fluence may change somewhat for each pulse and a single or few pulse irradiation may produce much different results than many pulses, whether or not the target is moving. Some conclusions reflect a little effect of translation on groove width, with the effect being difficult to quantify due to roughness and debris. The results were also compared with other studies. Various other morphologies were identified.

Ablation performance was not predictable with a linear model over all passes. Reported ablation depth per pulse well below 1 μm were generally observed with fluencies up to a few Joules/cm$^2$. Polarization effects were somewhat significant, with branching with polarization parallel to translation direction. Expected ablation depth limits were observed with groove formation, apparently a result of insufficient fluence at the bottom of a groove. In one example, the first few passes resulted in large amounts of material removed in a nearly linear manner. However, beyond twenty passes the amount of material ejected decreased. Material re-deposition apparently competed with removal by the edges of the pulse near the rim of a groove. After a large number of passes the rim was expected to largely erode away with additional passes.

With our experiments increasing the repetition rate to about a few hundred KHz or greater, and preferably to at least about 1 MHz in some embodiments, improved a ratio of material removed to redeposited material compared to results obtained below a few hundred KHz. The results were obtained with translation speeds suitable for high-throughput processing, and approaching some present limits of motion speed of high speed mirror systems. Also, at least some results indicate too high a repetition rate will result in undesirable thermal effects, recast, and generally unwanted HAZ induced material modification. Simultaneously achieving both high throughput and reduced debris is a general goal and a beneficial result that can be achieved with certain embodiments.

By way of example, scribing and/or dicing of 50 μm thick or similar substrates may be carried out with a focused spot size of at least 15 μm, and with a spot size in the range of about 15-50 μm in some embodiments. Other spot sizes may be used such as, for example, a few microns (e.g., about 3 microns in one case). In some implementations, spot sizes in a range from about 1 micron to about 5 microns are used. The quantity of material removed is generally determined by one or more factors including the scan speed, spot overlap, repetition rate (pulses per second delivered to surface), pulse energy, and spot diameter. In some embodiments, sufficient overlap between adjacent spots on the surface provides for cutting or scribing a pattern of relatively uniform width. In some experimental systems, relatively high pulse energy of at least a few microJoules with a spot size of about 15 μm will typically result in ablation within a region having diameter about 15-20 μm. A scanning system, for example a galvanometer based mirror scanner, may provide scan speeds of up to about 10-20 msec.

Material removal requirements vary, and heat accumulation within a region may be increased or decreased with suitable selection of one or more factors including pulse energy, repetition rate and speed parameters. It may be desirable to increase heat accumulation within a region to facilitate material removal in some embodiments. In various embodiments ultrashort pulses may be applied at a high rate and reduced motion speed to induce thermal effects similar to non-ultrashort pulses. In at least one embodiment one or more of pulse energy, repetition rate, speed, and pulse width may be adjusted. In some embodiments available pulse energy will be at least about 5 μJ, repetition rates will be adjustable up to about 10 MHz, beam speed at the surface may be in a range of about 0.1 m/sec up to about 10 msec, and pulse widths provided within a range from below 1 picosecond up to a few nanoseconds. By way of example, with 1 MHz rate, 40 μm spots, and speed of 0.1 msec, the overlap between spots exceeds 99%. Localized heat accumulation may be significant. If the 1 MHz rate is maintained, and speed is increased to about 5 m/sec, the spot overlap decreases by 50-fold, with decreased heat accumulation within a processing region. Accordingly, in various advantageous embodiments, overlap factors may be utilized that are in a range from about 0.001 to about 0.99. Other ranges are possible.

Because materials within the streets may vary with different wafer designs it is desirable for some implementations of a laser system to provide for adjustment of certain parameters over a wide range. For example, the scan speed, pulse energy, repetition rate (rate at which pulses impinge the surface), pulse width, and spot size are preferably adjustable over a wide range, for example at least 2:1 in some embodiments. One or more such parameters, for example the pulse width, speed, and repetition rate, may be adjustable over more than a 10:1 range. Other adjustable ranges are possible in other embodiments.

Different laser and speed parameters may be required for scribing and bare silicon dicing, as a result of different material properties. In some embodiments material removal will be facilitated with increasing heat accumulation with relatively high pulse energy and high overlap between pulses, for example greater than 99% overlap. A sufficiently well controlled heat-affected zone (HAZ) is to be maintained to avoid collateral damage or increased debris in some of these embodiments.

A typical multimaterial device, for example a patterned wafer, may include conductor, dielectric, and semiconductor materials stacked in depth. Processing of a typical multimaterial device may be carried out at, for example, a 1 MHz repetition rate, a spot size of about 40 μm, and at motion speeds producing overlap between about 75% to more than 99% between adjacent spots.

By way of example, with a pulse repetition rate in the range of about a few hundred kHz to about 10 MHz, the scan speed may be controlled in such a way that tailors the heat accumulation to facilitate material removal while simultaneously limiting debris and controlling HAZ. In some implementations, removal of metal and dielectric layers may be carried out at a scan speed substantially slower than a scan speed used for removal of bare silicon. As a result, the overlap between adjacent spots for removal of at least one of a metal and dielectric may be greater than an overlap for bare wafer processing (e.g., at least about ten-times greater in some embodiments). A focused spot size in the range of about 15-40 μm, and typically about 30-40 μm, provides for high throughput in some cases.

Referring again to FIG. 1G-2, the width of street 127 may be reduced in certain wafer designs, for example to a few ten of microns. A corresponding reduction in spot size from certain preferred values above (e.g.: about 40 μm in some cases) may be advantageous. For example, a spot size of about 5 μm may be useable for cutting, scribing, or other processing operations within a street having a width of about 25 μm. Some laser parameters may be scaled accordingly, and various design options may be utilized to avoid physical limitations associated with certain parameters. Other spot sizes may be used such as, for example, a few microns (e.g., about 3 microns in one case). In some implementations, spot sizes in a range from about 1 micron to about 5 microns are used. Spot sizes of about a few microns may be advantageous for processing narrow street widths (e.g., less than a few tens of microns).

Referring again to FIG. 1G-2, a cutting path 127-b within street 127 is illustrated, the cutting path 127-b centered on the street region in this example. It is known that wafer scribing and breaking may be carried out with a combination of a laser, for example a nanosecond pulsed laser, and a dicing saw. The nanosecond laser may, in some implementations, scribe two lines at approximately equal distance from the center of the street. A dicing blade centered on the street is used to cut through the remaining wafer, thereby producing individual die. Embodiments described herein may also be used to modify material along any path (e.g., a pre-determined path for the wafer), and/or may be used in various combinations (e.g., with a dicing saw). The material to be modified or processed may comprise metal, dielectrics including low-k materials, and/or semiconductors. Moreover, processing of ultra-thin wafers, such as, for example 50 μm thick wafers, can be carried out with a femtosecond laser to cut through the entire thickness of the wafer, or a substantial portion thereof, in some implementations. Some embodiments may reduce or eliminate use of mechanical dicing of such ultra-thin wafers.

For example, in certain implementations, requirements for precision positioning may increase, but total pulse energy may be decreased. It is well known that a decreasing spot size at a particular wavelength results in a decreased depth of focus (DOF). The DOF decrease generally varies as the square of the spot size. If processing over a large depth range is required various well known methods and systems for dynamic focusing, or improvements thereof, may be applied in some cases. By way of example, as the spot size decreases from 50 µm to 5 µm the DOF decreases by 100-fold. On other hand, the total pulse energy to achieve a given fluence over a spot area decreases as the square of the spot diameter. In some implementations, much lower maximum pulse energy may be used for smaller spot sizes, and a maximum pulse energy may be, for example, about 100 nJ, or up to about 1 µJ, for processing of various dielectric, conductor, and semiconductor materials. A smaller spot size may lead to some considerations for motion control also. Reduced scan speeds may be utilized in some embodiments, but a requirement for precision positioning may also be increased.

Therefore, in some embodiments, pulse energy and speed may be scaled downward while processing at a given fluence and repetition rate. By way of example, assume pulse overlap exceeding 99% (e.g.: at least 99.5%), a 1 MHz repetition rate, and a spot size of about 4 µm (e.g.: approximate 10-fold reduction from the 40 µm spot size used in some embodiments). In this example, corresponding scan speed is on the order of 10 mm/sec. The fluence may be obtained with pulse energy may be scaled down from a range of at least a few microjoules (e.g.: 5 µJ) to below 100 nanojoules (e.g.: 50 nJ) as a result of a 10-fold decreased spot size.

Similarly, in some embodiments, the repetition rate may be increased to tens of MHz, and with relatively low pulse energy for certain micromachining operations. For example, some cutting or scribing applications may require selective removal of a single layer of material, or a few layers, with relatively low fluence.

Referring to FIG. 1G-3, one of more layers are schematically represented by shaded regions (not necessarily to scale), and may comprise dielectric and/or metal materials. The underlying bare wafer (not shaded) is processed by the laser after modification of the overlying layers in certain processing applications. The inventors also discovered that thermal processing (e.g., heat accumulation) and/or a sufficient heat affected zone (HAZ) reduces or avoids delamination and/or cracking of composite layers or certain material (e.g. low-k dielectrics). Also, reduced HAZ associated with ultrashort pulses may be beneficial for cutting through the wafer for singulation of die. By way of example, if nanosecond pulses are used both to remove layers and for dicing the silicon wafer, performance may be insufficient or unpredictable. For example, it is known that weak die strength and various other material issues are caused by excessive HAZ caused by nanosecond pulses.

Without subscribing to any particular theory, when a wafer is irradiated with a laser pulse, electrons in the wafer absorb energy from the laser beam almost immediately. As a result of collisions between hot electrons and the lattice, thermal equilibrium between the electron system and the lattice is quickly achieved, and the exposed area increases in temperature. The time to reach the equilibrium varies as a function of material, and may be hundreds of femtoseconds to tens of picoseconds. Thermal energy within the exposed region will transfer to its surrounding cooler area. The rate of cooling is affected by several parameters, for example: material, temperature differential between the hotter and cooler area, as well as the temperature distribution. As an example point of reference, an approximate period, when silicon stays above its melting temperature, is about hundreds of ps.

When a nanosecond (or longer pulse duration) laser is used for dicing or scribing process, the irradiated region remains above its melting temperature for an extended time frame. A "melting pool" (e.g.: a region of molten material) will be formed and will shrink when it is cooling down. The "boiling" and "cooling" process causes cracking, surface roughness and voids in the HAZ. Such a process can be erratic, and the quality of material modification difficult to predict.

Femtosecond pulse irradiation in some implementations provides a shallow HAZ, but little interaction with underlying layers of a device occurs as a result of the ultrashort pulse width. The femtosecond heating process is almost instantaneous, confines HAZ to a limited thickness, and does not substantially affect layers disposed below modified material. Much smoother and predictable surface morphology is achievable in certain such implementations.

However, as a result of the very shallow HAZ formed by an ultrashort laser pulses in some of these implementations, little or no material modification of multiple materials occurs. For example, melting between layers may be absent. Thus, dicing or scribing performance with multilayer devices, specifically devices having at least one low-k material, can be somewhat limited using femtosecond laser pulses in these implementations. Moreover, delamination may occur in some of these implementations. However, the inventors discovered, as will be shown in experiments described below, that in some embodiments of the systems and methods described herein, increasing pulse energy and/or fluence, and/or decreasing scan speed, provided good processing results in multi-material target regions. Accordingly, the inventors' results described herein may be used to control heat accumulation and/or HAZ within one or more materials of the target. For example, embodiments of the systems and methods disclosed herein may be configured to provide sufficiently high heat accumulation in a target to reduce or avoid delamination (e.g., delamination of a dielectric material and a metal material).

In some embodiments multiple lasers may be utilized, and configured in an integrated laser system having multiple sources, or as a source having adjustable pulse widths. By way of example, a relatively long pulse width, for example hundreds of picoseconds and up to a few nanoseconds, may be utilized to increase HAZ for processing a first depthwise portion of a workpiece, and particularly for removing low-k layers and/or other metals and/or other dielectrics. Such metals may include, but are not limited to, copper, aluminum, and/or gold. Dielectric materials may include, but are not limited to, silicon dioxide, silicon nitride, and/or various organic or inorganic materials. The arrangement of the dielectric and/or metal materials may vary in three-dimensions as schematically illustrated in the examples shown in FIGS. 1G-1 to 1G-3.

In some embodiments, ultrashort pulses may be used to process a second depthwise portion of the workpiece, with generation of negligible HAZ. In various embodiments femtosecond pulses are utilized for at least cutting through the entire wafer, or a substantial fraction of the wafer, and particularly for cutting very thin wafers, for example wafers having thickness of 100 µm or less. Moreover, in some of these embodiments, at least a portion of the processing of metals and/or dielectrics may also be carried out with femtosecond pulses.

In at least one embodiment a single laser source may be utilized. Adjustment of laser parameters may balance heat generation within a processing region and transfer of heat outward from the region. Delamination and/or unwanted thermal stress are then reduced or avoided.

In various embodiments a picosecond pulse width may be utilized to remove a low-k material. For example, at least one pulse may be in the range of about 100 ps to about 500 ps, about 100 ps to 250 ps, or in the range of about 200 ps to 500 ps. In some embodiments at least one pulse may have a pulse energy may in the range of about 2 µJ to 10 µJ over a spot diameter of 30-40 µm, corresponding to a fluence at least about 0.15 J/cm$^2$, for example. Such examples of pulse widths and fluence can generate sufficient HAZ for processing metal and dielectrics, and within a period of time to provide material modification, (e.g.: melting and removal) of multiple layers. However, any region of melted material is also sufficiently shallow (e.g.: not too deep) so that unwanted cracking, surface roughness and/or voids in the HAZ are reduced or avoided. In other embodiments, other pulse widths, pulse energies, spot diameters, and fluences may be used.

In some device designs the width of street 127 may be reduced. Embodiments of the laser system may then be configured with a reduced spot size for processing in a narrowed region. In some of these embodiments, the pulse energy can then be reduced while maintaining a given fluence. However, in some applications a relatively high fluence may be selected for processing and may be advantageous for processing of various metals and dielectrics.

Example Embodiments of Pulsed Laser Systems for Micromachining

FIG. 1F schematically illustrates an embodiment of a system 100 suitable for processing a workpiece with laser pulses. The system 100 comprises a laser system 104 that is operatively coupled to a controller 114 and scanning system 106. In some embodiments, the laser system 104 is configured to output laser pulses that comprise one or more ultrashort pulses (USP). For example, in at least one embodiment, the laser system 104 comprises a USP laser. In various embodiments the system 100 will provide for adjustment of certain pulse parameters over a substantial range. Such parameters may include one or more of pulse energy, pulse repetition rate, pulse width, spot diameter, overlap of adjacent spots, and scan speed. By way of example, pulses may be generated at an adjustable repetition rate up to about 1 MHz, or up to about 10 MHz. An output pulse may have an energy of about 1 µJ or higher, for example up to about 5-20 µJ, and a pulse width about 1 ps or shorter. Further details of various embodiments of the system 100 are described below.

An amplified laser system, particularly an ultrashort fiber-based chirped pulse amplification system (FCPA), operating at repetition rates of at least several hundred kHz, is suitable for processing of several types of patterned and unpatterned substrates. High pulse energy, for example several microjoules, is obtainable with an amplified train of ultrashort pulses. Sufficient pulse energy in at least the microjoule range is obtainable, with 15-40 µm typical spot diameters providing for high throughput in some embodiments.

In some implementations, multiple passes can be used. The pulse energy used in the passes may be the same or different than the energy used in additional passes. Moreover, in some embodiments, the pulse energy may be varied between passes.

In some embodiments other laser pulse parameters may be adjusted between passes. For example, a relatively long pulse width may be used for removal of at least conductive and/or dielectric materials. Such a pulse width may be up to a few nanoseconds (ns), less than 1 ns, or about 500 ps or shorter. An ultrashort pulse may be used to cut at least the underlying silicon material, for example with sub-picosecond pulses.

In some implementations, the long and short pulses may be applied in separate passes, or in some embodiments by applying bursts of laser light to a target area of a material during any single pass. In some cases, the burst may be applied at a predetermined repetition rate, and may comprise at least first and second pulses of laser light displaced or overlapped in time, and the first pulse width may be greater than the second pulse width, and greater than 10 ps in duration in some embodiments, the second pulse width being an ultrashort pulse, for example a sub-picosecond pulse. The pulse separation of pulses in the burst may be about 1 µsec to 0.1 µsec, and in some embodiments a shorter separation may be used. The second pulse width may be as above: sub-picosecond (e.g.: >100 fs) to about 10 ps, and generally less than about 50 ps. Moreover, first and second is not restricted to temporal sequence, but may be applied in any order. For example a reversed order may result from respective top-side or bottom-side initial scans.

One possible preferred laser system for some micromachining implementations will provide pulse energy of at least about 5 µJ at an adjustable repetition rate (pulses delivered to the surface) of about a few hundred kHz to 10 MHz, and will be coupled to a scanner for scanning at a rate up to about 10 msec. The system can include an optical power amplifier to provide for high pulse energy and sufficiently high throughput. Preferably at least a portion of the system will be fiber based.

In one preferred embodiment, the laser source comprises a Yb-doped, amplified fiber laser (e.g., FCPA µJewel, available from IMRA America). Such a laser offers several primary advantages over commercial solid-state laser systems. For example, this laser source provides a variable repetition rate over a range of about 100 kHz to 5 MHz. Higher pulse energy than oscillator-only systems allows greater flexibility in focal geometry (e.g.: larger spot sizes for a given fluence). In at least one embodiment, pulse energy of up to about 10 µJ may be applied at a repetition rate of about 1 MHz, with at least about 1 µJ at a 5 MHz rate. Higher repetition rate than various solid-state regeneratively amplified systems allow greater speed. Although some oscillators have been demonstrated which produce microjoule pulse energy, the complexity is at least comparable to CPA systems.

Such energy is also achievable with embodiments of a fiber-based system utilizing a power amplifier, for example at least one large mode amplifier producing a nearly diffraction limited output beam. In at least one embodiment, a large mode amplifier may receive low-energy pulses from a mode locked fiber oscillator, and amplify the pulses to the microjoule level. Preferably, the oscillator and power amplifier are integrated to form an all-fiber system. Numerous possibilities exist.

In some embodiments, particularly for processing with lower pulse energy and/or higher repetition rates, an all-fiber ultrashort pulsed laser system may be utilized. The system may include a fiber-based pulse amplification system producing pulse widths below 1 ps. Low energy pulses from a fiber oscillator may be selected with an optical switch, and amplified with a fiber amplifier to at least about 100 nJ. At relatively low energy the sub-picosecond pulses may be amplified with the fiber amplifier. In other embodiments an all-fiber chirped pulse amplification system may comprise a pulse stretcher and pulse compressor. The compressor may comprise a fiber compressor performing at least partial pulse compression, a bulk compressor, or a combination thereof. Many variations are possible, including further amplification, harmonic conversion, and the like.

Various embodiments include fiber-based chirped pulse amplification systems suitable for numerous micromachining applications. The systems are particularly suited for processing materials using pulse energies up to tens of microjoules and up to a maximum of about 100 µJ. Spot diameters may be in a range from about 1 micron to about 100 µm. In some embodiments, a spot size may be in the range of about 10 µm to 100 µm, or 10 µm to about 60 µm, or 25 µm to 50 µm. Pulse widths may be in a range from tens of femtoseconds (e.g., 50 fs) to about 500 picoseconds. The parameters generally provide for energy density near or above an ablation threshold for the workpiece material(s) being processed, and the total energy required may depend on, for example, the spot diameter. Workpiece materials may include, but are not limited to, metals, inorganic dielectrics, organic dielectrics, semiconductor materials, low-k dielectric materials, or combinations thereof.

FIG. 1F schematically illustrates a first embodiment of a system 100 capable of use for processing a workpiece, for example a semiconductor substrate. The system 100 comprises a laser system 104 and a scanning system 106. In this embodiment, the scanning system 106 includes two beam deflectors 108, for example galvanometric scanning mirrors, capable of two-dimensional scanning. In other embodiments, a different number and/or type of scanning mirrors may be used. In some embodiments, the scanning may be one-dimensional. The scanning system 106 may also include focusing optics 110 such as, for example, an integrated F-theta lens capable of producing a substantially flat field of view at the target substrate 112. For example, in some embodiments, the F-theta lens is configured to produce a 20 µm laser focus spot with a substantially flat field of view over an area of about 8000 mm². In other embodiments, for example for application to wafer cutting or dicing, a 10-50 µm laser focus spot with a substantially flat field of view over an area of about 60 mm×60 mm may be utilized. The scanning system 106 (and/or other system components) may be controlled by a controller 114. For example, the controller 114 may include one or more general and/or special purpose computers, which may be remote and/or local to the system 100.

In other embodiments, additional optical elements may be utilized in the scanning system 106 (e.g., mirrors, lenses, gratings, spatial light modulators, etc.). A skilled artisan will recognize that a pattern to be formed within the substrate may be communicated to the system 100 via many methods including wired and/or wireless techniques. In certain embodiments, the pattern is represented via vector graphics including curves and/or polygons, and may include three-dimensional machining instructions. Many variations are possible.

In some embodiments, the laser system 104 may comprise a USP laser configured to output one or more ultrashort pulses (USP). An ultrashort pulse may have a duration such as, for example, less than approximately 10 ps. In the example system 100 shown in FIG. 1F, the laser system 104 may comprise a fiber-based laser capable of generating an ultrafast pulse train. For example, the laser may comprise an FCPA µJewel laser available from IMRA America, Inc. (Ann Arbor, Mich.). The laser pulses have a wavelength that may be about 1 µm. In some embodiments, shorter wavelengths laser pulses are used such as, for example, green light pulses of about 520 nm wavelength. In other embodiments, any other suitable laser system can be implemented. In certain embodiments, the laser system 104 may produce laser pulses with a pulse width less than about 10 ps. For example, the pulse width may be in a range from about 100 fs to about 1 ps. In some embodiments, the pulse width is in a range from about 10 fs to about 500 ps. In other embodiments of the laser system 104, other pulse widths are used such as, for example, ≦10 ns, ≦1 ns, ≦100 ps, ≦1 ps, and/or ≦100 fs.

In certain embodiments, the laser system 104 may comprise a diode-based and/or microchip laser seed source and may output pulses having durations of about a nanosecond, a few nanoseconds, and/or up to about 10 nanoseconds. The laser system 104 may comprise any suitable type of laser for outputting pulses having desired properties.

In some embodiments, a relatively high laser repetition rate is used to enable relatively rapid laser processing. For example, the repetition rate may be larger than 500 kHz. In certain embodiments, a repetition rate of about 1 MHz to 10 MHz may be used. Other repetition rates are possible. Based on results disclosed herein, the use of a relatively high repetition rate may be utilized in some embodiments to reduce the quantity of redeposited material 1005-a schematically illustrated in FIG. 1D. In some implementations, tens or hundreds of laser pulses may overlap in each focal spot diameter, which may be about 20 µm in diameter, or 10-50 µm in some embodiments. In other embodiments a different number of pulses may overlap. For example, in some embodiments a few pulses may overlap, for example 3 pulses. Another possible advantage of a relatively high repetition rate is the ability to process the substrate in a shorter time than when a lower repetition rate is used. As such, in certain embodiments, the throughput of the system 100 is improved while simultaneously providing improved quality.

FIG. 2A schematically illustrates an embodiment of a system 200 that can be used for processing a semiconductor a target substrate 112 via with ultrafast pulse trains. This system 200 may be generally similar to the embodiment schematically depicted in FIG. 1F. The laser system 104 in the embodiment shown in FIG. 2A comprises an optional internal pulse modulator 202 not shown in the embodiment depicted in FIG. 1F. The optical modulator 202 may be used for modulation of the repetition rate of the laser pulse train. In some embodiments, the laser pulse train comprises one or more ultrashort pulses such as, for example, one or more trains of ultrashort pulses. In some embodiments, the modulator 202 is adapted to change the laser pulse repetition rate from the oscillator repetition rate (typically about 50 MHz in some fiber laser embodiments) to the machining repetition rate (typically less than or about 1 MHz). For example, the modulator 202 may be configured to allow for transmission of only every nth pulse from the oscillator pulse train to a final power amplifier, or transmission of groups of pulses. In certain embodiments, it may be convenient to implement such oscillator amplifier configurations for the generation of high energy pulse trains, where for improved oscillator stability, oscillator repetition rates of the order of 50 MHz are utilized. Such oscillator amplifier systems are well known to a skilled artisan.

In certain implementations, the internal modulator 202 allows the average power and thermal conditions in the amplifier to remain substantially the same while substantially instantaneously changing the pulse energy and pulse peak power. The internal modulator 202 may comprise an acousto-optic modulator or any other suitable optical modulator. In certain embodiments, the laser system 104 outputs pulses with pulse energies above about 1 µJ, pulse durations less than about 10 ps, and a pulse repetition rate of greater than about 100 kHz.

The embodiment shown in FIG. 2A also comprises a frequency converter 204 such as, for example, a second harmonic generation (SHG) converter. In this embodiment, combination of the SHG converter and the internal modulator 202 provides a "fast shutter," because the harmonic conversion efficiency is proportional to the laser pulse energy. Accordingly, by modulating the laser repetition rate from the oscillator it is possible to turn the machining beam (e.g., the transmitted SHG beam) on and off substantially instantaneously. Such rapid shuttering is not possible mechanically and is difficult to implement optically for high laser powers without causing degradation to beam quality, pulse duration, etc. Some embodiments may include a third harmonic generation converter and/or a fourth harmonic generation converter or any other suitable harmonic generation converter.

The embodiment shown in FIG. 2A also comprises the controller 114, which may be used to control the laser system 104, the scanning system 106, the frequency converter 204, and/or other system components. For example, in certain embodiments, control of the modulator 202 and the scanning system 106 (e.g., the scanning mirrors 108 and/or the focusing optics 110) may be linked so as to enable much greater control of the laser irradiation conditions, thereby providing greater control of machining depth and lateral extent. For example, in some embodiments, the controller 114 is configured to control a spatial overlap between adjacent focused pulses (or groups of pulses) during processing of a target material at the pulse repetition rate.

Figure 2B:
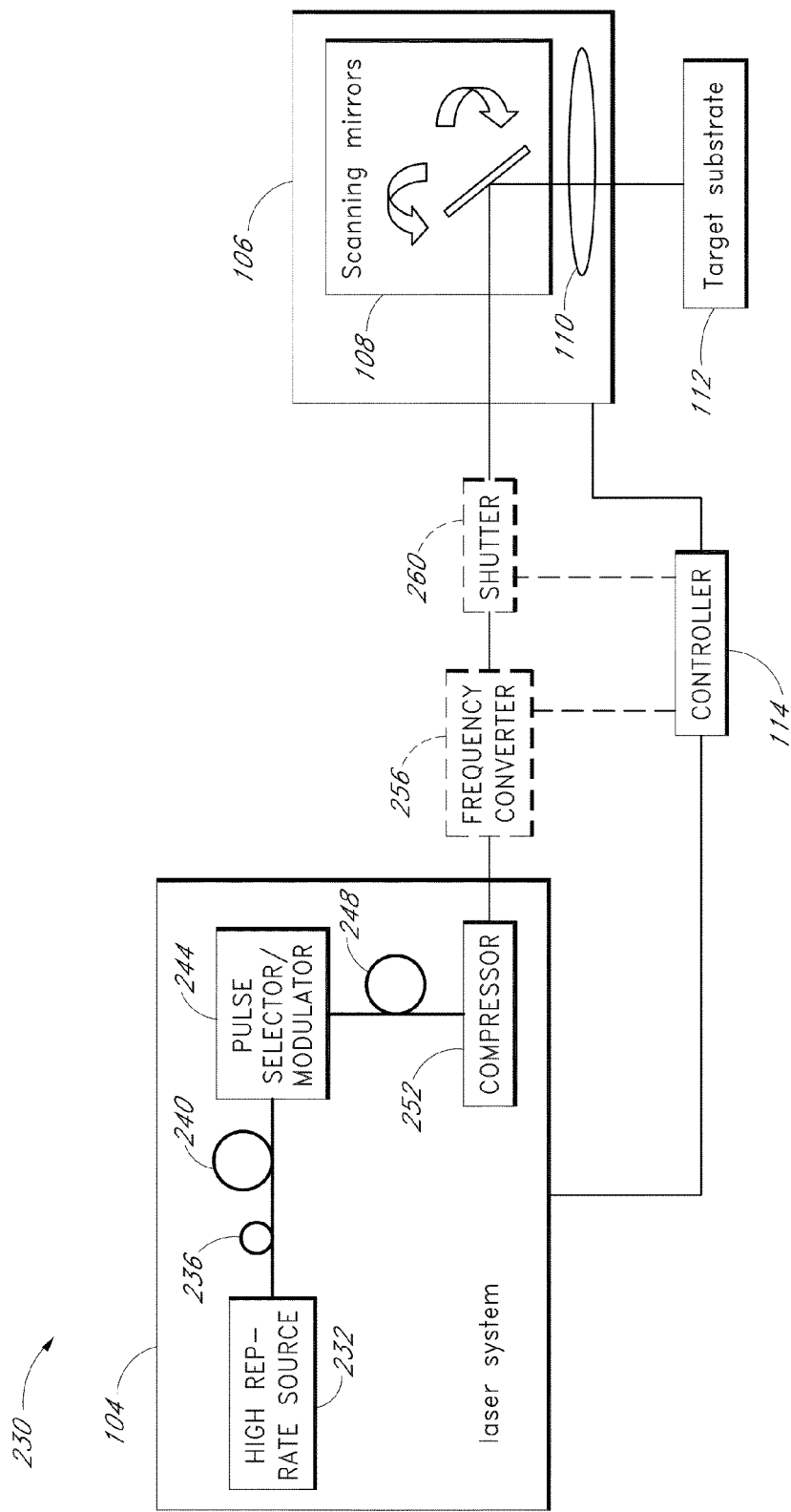

FIG. 2B schematically illustrates an embodiment of a system 230 capable of use for processing target substrates with ultrafast pulse trains. In this embodiment, the laser system 104 includes a chirped pulse amplification system such as, for example, a fiber-based chirped pulse amplification (FCPA) system. Advantages of using an FCPA system include improved efficiency and reliability. Also, since the output energy and peak-power of a fiber amplifier generally decrease as the repetition rate of the oscillator increases, with substantially constant average output power or with fixed pump power. The fiber amplifier output energy and power variation as a function of repetition rate may be exploited to provide improved FCPA performance.

Various U.S. patents assigned to the assignee of the present application disclose chirped pulse amplification systems using compact fiber configurations. The disclosure of each of the following U.S. patents is hereby incorporated by reference herein in its entirety: U.S. Pat. No. 5,499,134, issued Mar. 12, 1996 to Galvanauskas, et al., entitled "Optical Pulse Amplification Using Chirped Bragg Gratings," U.S. Pat. No. 5,696,782, issued Dec. 9, 1997 to Harter, et al., entitled "High Power Fiber Chirped Pulse Amplification Systems Based On Cladding Pumped Rare-Earth Doped Fibers," and U.S. Pat. No. 7,113,327, issued Sep. 26, 2006 to Gu, et al., entitled "High Power Fiber Chirped Pulse Amplification System Utilizing Telecom-Type Components" (hereinafter referred to as "the '327 patent"). Any of the laser systems disclosed in these patents, as well as other commercially-available "all fiber" laser systems, may be used with the system 230 shown in FIG. 2B.

In certain embodiments, the laser system 104 comprises an FCPA μJewel laser (available from IMRA America, Inc., the assignee of the present application), which provides laser pulses at an output of a compressor 252. The output pulses may be generated at an adjustable repetition rate up to about 1 MHz. An output pulse may have an energy of about 1 μJ or higher, and a pulse width about 1 ps or shorter. In some embodiments, if the peak power and pulse energy are low enough to avoid non-linear effects, a fiber compressor, rather than a bulk output compressor, may be used for pulse compression. In certain embodiments, photonic bandgap fibers or photonic crystal fibers may be used alone or in combination with bulk compressors or large area fibers to provide for increased output energy and peak power.

In the embodiment of the system 230 schematically illustrated in FIG. 2B, the laser system 104 comprises a single-pass fiber-based chirped pulse amplification system. The laser system 104 includes a high repetition rate source 232, a fiber stretcher 236, a fiber pre-amplifier 240, a pulse selector/modulator 244, a fiber power amplifier 248, and a compressor 252. The output of the compressor 252 may be an ultrashort pulse train. In some embodiments, the compressor 252 may be detuned to provide longer pulse widths (e.g., about 200 ps). In other embodiments, the compressor 252 is not used, and the laser system 104 outputs pulses having widths up to about a nanosecond, a few nanoseconds, and/or up to about 10 nanoseconds. In some embodiments, the laser system 104 may include one of more of a single-pass and double-pass pre-amplifier, a single or double-pass stretcher, and power-amplifier arrangement (not shown), which may provide longer stretched pulse widths and higher pulse energy in a comparable package size. Some embodiments may comprise polarization maintaining (PM) fiber amplifiers, oscillators, and stretcher fibers. As described above, the controller 114 may be configured to coordinate delivery of the pulses to the target substrate 112 via the scanning system 106. In various embodiments, the controller 114 may be used to control some or all of the components of the laser system 104, the scanning system 106, and/or other system components. In one embodiment, the controller 114 is configured to control the laser system 104 by controlling the pulse selector/modulator 244. As described above, the scanning system 106 may include, for example, a scanning mirror 108 such as, e.g., a galvanometer scanning mirror. The scanning system 106 may also include focusing optics 110.

The high repetition rate source 232 may provide a free-running pulse train operating at a repetition rate well above 1 MHz, for example, in a range of about 20 MHz to about 100 MHz. Mode-locked lasers, including all-fiber-based passive mode-locked or other devices, may be used to produce such repetition rates. Corresponding pulse widths may be in a range from about several hundred femtoseconds to about 10 picoseconds, for example. In other embodiments, non-mode locked laser sources may be used. For example, output of a quasi-cw semiconductor laser may be modulated and optionally compressed to produce picosecond or femtosecond pulses. Suitable laser sources include the sources described in U.S. patent application Ser. No. 10/437,057 to Harter, entitled "Inexpensive Variable Rep-Rate Source For High-Energy, Ultrafast Lasers," now U.S. Patent Application Publication 2004/0240037, assigned to the assignee of the present application, and hereby incorporated by reference herein in its entirety.

The fiber stretcher 236 may include a length of optical fiber (e.g., about 100 m to 1 km depending on fiber dispersion) to stretch pulses from the high repetition rate source 232 in order to avoid non-linear effects and/or damage to the fiber pre-amplifier 240 and/or the fiber power amplifier 248. The stretcher 236 may comprise a fiber Bragg grating (FBG), a chirped FBG, or a combination thereof. The stretcher 236 may comprise fiber having anomalous third order dispersion (TOD), so as to partially compensate residual TOD (if present) that may be accumulated in the system. In some embodiments, the majority of residual TOD results from the use of mismatched stretcher (fiber-based) and compressor dispersion (bulk-grating based). In various example embodiments, the width of a stretched pulse may be about 50 ps, in a range from about 100 ps to about 500 ps, or in a range up to about 1 ns. Pulse stretching may also be provided in double pass arrangements.

The fiber pre-amplifier 240, which is optional in some laser systems 104, amplifies the energy of a pulse emitted from the high repetition rate source 232. The source 232 may emit pulses with energies from about several hundred pJ to about 1 nJ, and up to about 5 nJ. In some embodiments, the pulse energy at the output of the pre-amplifier 240 may be above about 1 nJ, for example, in a range from about 1 nJ to about 20 nJ, and in some embodiments up to about 100 nJ. In some embodiments a large-mode amplifier may be used as a pre-amplifier so as to produce microjoule seed pulses. For example, various amplifier options developed by the assignee of the present application (e.g.: amplifiers utilizing a multimode fiber, large core leakage channel fiber, photonic crystal fiber, and/or photonic bandgap fiber) that provide a high quality output beam are further described below and useable as either pre-amplifiers, power amplifiers, or generally as at least a portion of a multistage amplifier.

The pulse selector/modulator 244 may be configured to selectively transmit pulses to the power amplifier 248. The pulse selector/modulator 244 may include an acoustic-optic modulator (AOM), an electro-optic modulator (EOM), a high speed Mach-Zehnder device (MZ), and/or an electro-absorption modulator (EAM). AOMs do not require high voltage electronics, and commercially available digital driver electronics provide ease of use. Mach-Zehnder modulators (MZs) are integrated optical devices having GHz bandwidths and low drive voltages, and in many cases, require a polarized input beam. In some embodiments, the relatively small area of an integrated MZ device may limit useable peak-power. In some embodiments, the pulse stretcher 236 reduces peak power incident on the modulator 244, as described in the '327 patent. MZ devices have been used at 1.55 µm telecom wavelengths, and MZ devices are now available at 1 µm wavelengths. The '327 patent discloses a chirped pulse amplification system using MZ modulators. In certain embodiments, the pulse selector/modulator 244 may provide for about 20 dB to about 30 dB of intensity control, and may be useable to at least partially control output intensity based on the transfer characteristic of the power amplifier 248 as a function of input.

In certain embodiments, the fiber power amplifier 248 comprises a multimode fiber amplifier configured to provide an output substantially in the fundamental mode. For example, the system may utilize a fiber power amplifier as described in U.S. Pat. No. 5,818,630, issued to Fermann, et al., entitled "Single-Mode Amplifiers and Compressors Based on Multi-Mode Fibers," assigned to the assignee of the present application, and hereby incorporated by reference herein in its entirety. Multimode fiber amplifiers provide production of peak powers and pulse energies that are higher than those achievable in single-mode (SM) fibers before the onset of undesirable nonlinearities and gain saturation. In other embodiments, large-area amplifiers may be utilized, for example photonic bandgap or photonic crystal designs. High quality output beams were demonstrated with leakage mode designs, for example, as described in U.S. patent application Ser. No. 11/134,856, entitled, "Single Mode Propagation in Fibers and Rods with Large Leakage Channels," published as U.S. Patent Application Publication 2006/0263024, assigned to the assignee of the present application, and hereby incorporated by reference herein in its entirety.

As described above, the compressor 252 is an all-fiber compressor in some embodiments. However, if peak power is too high, for example about 100 kW or greater in some implementations, non-linear effects may limit performance of an all-fiber compressor. A tradeoff may then exist between the compactness of a fiber design and the flexibility associated with a bulk compressor. In some embodiments, both fiber and bulk components may be used in the laser system 104.

The high repetition rate source 232 may produce pulses having an output wavelength of about 1 µm. In some embodiments, the system 230 comprises an optional frequency converter 256. For example, the frequency converter 256 may comprise a frequency doubler, a frequency tripler, and/or a frequency quadrupler producing respective visible (e.g., green) or ultraviolet output wavelengths (for 1 µm input wavelengths). In some embodiments the frequency converter 256 may comprise a parametric amplifier. Conversion efficiency is generally improved with higher peak intensity. Therefore, the frequency converter 256 advantageously may be positioned to receive the output of the compressor 252. In one example embodiment, the frequency converter 256 was configured to provide second, third, and fourth harmonic generation. Second harmonic generation was accomplished using a type I non-critically phase-matched lithium triborate (LBO) crystal. The third harmonic was produced by sum frequency mixing the fundamental and the second harmonic in a type II critically phase-matched LBO crystal. A type I LBO and type I beta barium borate (BBO) crystal can also be used in embodiments for 3rd harmonic generation, producing near UV output wavelengths. A type I critically phase-matched beta barium borate (BBO) crystal generated the fourth harmonic by frequency doubling the second harmonic light. In this example embodiment, light having 50 µJ, 500 fs pulses at a fundamental wavelength of 1040 nm was input to the frequency converter 256, which provided 53%, 25%, and 10% conversion efficiency to second, third, and fourth harmonic frequencies, respectively. At a laser repetition rate of 100 kHz, this example embodiment produced an average power of about 5.00 W at 1040 nm, and average converted powers of about 2.62 W at 520 nm, about 1.20 W at 346 nm, and about 504 mW at 260 nm. The converted pulse energies were about 26 µJ at 520 nm, about 12 µJ at 346 nm, and about 5 µJ at 260 nm. Further details of a laser system 104 that may be used for providing frequency converted ultrashort pulses are described in "12 µJ, 1.2 W Femtosecond Pulse Generation at 346 nm from a Frequency-tripled Yb Cubicon Fiber Amplifier," by Shah, et al., 2005, CLEO 2005 Postdeadline, CPDB1, which is hereby incorporated by reference herein in its entirety.

The controller 114 may be used to coordinates the positioning of the scanning beam and the selection of laser pulses. In certain embodiments, when the high repetition rate source 232 is free-running, a portion of the beam is detected using a length of optical fiber coupled to a high speed photodetector (not shown). The photodetector output provides a synchronization signal to the controller 114. The synchronization signal advantageously may be a digital signal. The scanning system 106 may include 2-D galvanometer mirrors 108 such as, for example, hurrySCAN® II 14 scan heads available from SCANLAB America, Inc. (Naperville, Ill.). Advantages of using such scan heads include that they are low inertia-devices and are provided with user-friendly commercially available controllers so that mirror position and/or velocity signals are readily programmable. The scanning system 106 and the controller 114 may also be used with any suitable combination of translation stages, rotation stages, and robotic arm (not shown) to position the target substrate 112. In some embodiments the scanning mirrors 108 may be omitted and any other suitable system for relatively moving the laser beam and the target substrate 112. Suitable focusing optics 110 such as, for example, an F-theta lens and/or a high resolution objective may be used to focus each laser pulse onto the surface of or in the target material. Some refractive optical elements may introduce spot placement and focusing errors, or other temporal or spatial distortions, resulting from material dispersion. In certain embodiments, commercially available optic elements designed for ultrashort laser pulse beams are used. In certain embodiments, the controller 114 is configured to control spatial overlap between adjacent focused laser pulses (or groups of laser pulses) during processing of the target material.

In certain embodiments, it may be desirable to operate the amplifier(s) substantially continuously to reduce the likelihood of damage and to provide for maximum energy extraction from the amplifiers. Fiber amplifiers are well suited for amplifying high speed pulse trains. However, in some embodiments, increased risk of amplifier damage occurs and undesirable amplified spontaneous emission (ASE) is generated during extended periods where material processing does not occur ("idle periods"). For example, in some amplifiers, the idle time period may be in a range from tens of microseconds to hundreds of milliseconds or greater. In certain fiber amplifiers, an idle time of about 100 µs may be sufficient for gain to increase to a sufficient level for free-lasing under high gain (strong pumping) conditions. After about 25-40 µs of idle time, if a seed pulse is injected, the built up gain in the amplifier may have sufficient gain to create a high energy pulse capable of inducing damage to the output fiber facet. Accordingly, in certain embodiments, stabilization and protection of the laser components is provided by dynamic adjustment of the input pulse energy and/or control of a pump diode current as described, for example, in U.S. patent application Ser. No. 10/813,173, to Nati, et al., entitled "Method And Apparatus For Controlling And Protecting Pulsed High Power Fiber Amplifier Systems," published as U.S. Patent Application Publication No. 2005/0225846, assigned to the assignee of the present application, and hereby incorporated by reference herein in its entirety.

In various embodiments of the system 230, the controller 114 can be configured to operate the pulse selector/modulator 244 at a high repetition rate (e.g., from about 50 MHz to about 100 MHz) during idle periods. During idle periods, the amplifier 248 is generally operating in a non-saturated regime. The power amplifier average output may slightly increase at the fundamental wavelength. Modulation of the pulse energy between an idle period and an "active" period (when the system 230 is processing the target) may be sufficient to provide rapid shuttering of the beam (e.g., "off" and "on" functionality). In some implementations, the laser fluence on the target substrate 112 during some "idle" periods may be above the ablation and/or surface modification thresholds, but the modulation in fluence between "idle" and "active" periods may be sufficient for process control. In some embodiments, an optional shutter 260 may be used to control the energy incident on the target substrate 112. The optional shutter 260 may comprise an acousto-optic device, an opto-mechanical shutter, and/or an electro-optic shutter.

Certain embodiments of the system 230 include a frequency converter 256 that may provide, for example, frequency doubling and/or tripling. In certain such embodiments, the pulse energy and/or the peak power may be relatively low at the output of the frequency converter 256. In such cases, output of the converter 256 may be a relatively low energy pulse with most energy content at the fundamental wavelength and, at focus on the target; the energy may be below the ablation and/or surface modification thresholds of the target material. In some system embodiments, modulator adjustment of about 20 dB to about 30 dB may provide control of intensity over a wide operating range so as to avoid altering target material properties.

In certain embodiments, techniques may be used to attenuate unwanted beam energy. For example, unwanted energy may be removed with a spectral filter (not shown). In some implementations, polarization filtering may be possible, because of the difference in polarization state between fundamental and harmonic frequencies for Type I phase matching. The pulse selector/modulator 244 also may be controlled to limit the energy to the amplifier 248. Focusing optics in the scanning system 106 (or other focusing optics if a scanner is not used) may be optimized for the machining wavelength (which may be a frequency converted wavelength if the optional frequency converter 256 is used). In some implementations, the focusing optics may be configured so that the spot size of the fundamental wavelength is increased so that the energy density at the surface of the target substrate 112 is reduced.

During active processing periods, the controller 114 may be used to provide signals to the pulse selector/modulator 244 to "down count" or otherwise select pulses. In some embodiments, processing repetition rates may be from about 100 KHz to about 10 MHz. During active processing, it may be advantageous for the laser to operate in saturation, or approximately so, in order to extract the maximum energy from the fiber amplifier.

FIG. 3 schematically illustrates an embodiment of a system 300 capable of use for machining a workpiece (or target substrate) 112 via ultrafast pulse trains. This system 300 may be generally similar to the embodiments depicted in FIGS. 1F and 2A, 2B. The system 300 may further comprise a robotic arm system 304 coupled to the target substrate 112 and configured to manipulate the target position (and/or orientation) relative to the scanning beam. The robotic arm system 304 may be a single-axis or a multi-axis system. In some embodiments, the scanning system 106 comprises a scan head that is moved with respect to the target substrate 112. A possible advantage of embodiments providing relative movement between the scan beam and the target substrate 112 is that the system may enable processing of non-flat surfaces.

In some embodiments of the systems 100, 200, 230, and 300 schematically shown in FIGS. 1-F, 2A, 2B and 3, respectively, the laser spot size is primarily determined by the F-theta lens in the scanning system 106. In some implementations, in order to have reasonable processing area for images, spot sizes larger than about 10 µm are used. Certain embodiments of the laser system 104 are capable of machining much smaller spot sizes (e.g., ≦1 µm). For such small focal dimensions, significantly lower pulse energy is used in some embodiments. In order to achieve sufficiently high resolution over a sufficiently large working area, the target and the beam may be moved with respect to each other. For example, the target may be moved relative to a substantially stationary laser beam (or vice-versa).

In certain embodiments of the systems 100, 200, 230, and 300, a variable telescope can be positioned along an optical path between the laser system 104 and the scanning system 106. In certain such embodiments, the F-theta lens may be omitted from the scanning system 106. The variable telescope may be used to dynamically vary the focal length of the system and may provide continuous variation of the focal spot size on the target substrate 112. A commercially available variable telescope system may include, for example, the varioSCAN dynamic focusing unit available from SCANLAB America, Inc. (Naperville, Ill.). Such a system, with dynamic focusing, provides capability for 3D adjustment of the beam focal position, and useful capability for following or compensating variations in the target surface locations, as might be caused by substrate warpage or other deviations from flatness.

Figure 4A:
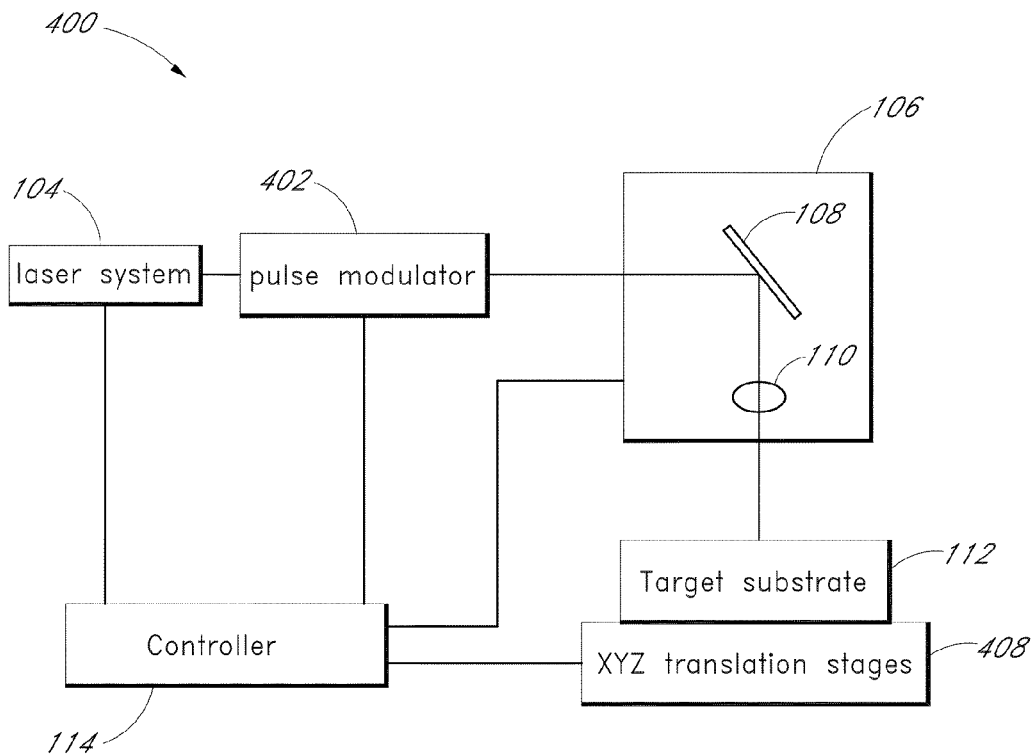

FIG. 4A schematically illustrates an embodiment of a system 400 capable of use for processing semiconductor substrates with ultrafast pulse trains. This embodiment comprises a laser system 104 and a translation stage 408 configured to move the target substrate 112 relative to the laser beam. In certain embodiments, the translation stage 408 remains in substantially constant motion with relatively high translation speeds in order to enable sufficiently high processing speeds. In some embodiments, the translation stage 408 may include an X-Y or an X-Y-Z translation stage. For example, the translation stage 408 may include a Nano-Translation (ANT™) stage available from Aerotech, Inc. (Pittsburgh, Pa.). Many techniques for relatively controlling positioning of a pulsed laser beam and a target substrate are known such as, for example, as described in U.S. Pat. No. 6,172,325 to Baird, et al., entitled "Laser Processing Power Output Stabilization Apparatus and Method Employing Processing Position Feedback." In some embodiments, the controller 114 may execute control instructions for coordinating the scanning system 106 and the translation stage 408 such as, for example, the Nmark™ control software available from Aerotech, Inc. (Pittsburgh, Pa.).

In some embodiments of the system 400 schematically shown in FIG. 4A, a modulator 402 may be used to provide substantially instantaneous laser modulation for improved control of the laser-material interaction. The modulator 402 may be generally similar to the modulator 202 described with reference to FIG. 2, or the modulator 402 may be an external modulator as schematically depicted in FIG. 4A. In certain embodiments, the controller 114 provides linked control of the modulator 402 and the translation stage 408.

In certain embodiments, the systems described herein (e.g., the systems 100, 200, 230, 300, and 400) may process a target substrate using multiple passes of a laser beam relative to the target substrate. For example, ten or more passes may be used in various embodiments, and perhaps hundreds for formation of very high aspect ratio features. The fluence (and/or other system parameters) may be adjusted to control the material removal during a given pass.

In various embodiment the system the system may utilize information regarding the state of the laser system of target and, based on feedback signals, control laser parameters as described in, for example, U.S. patent application Ser. No. 10/813,269, filed March 31, 204, entitled "Femtosecond laser processing system with process parameters, controls and feedback," (hereinafter, the '269 application) assigned to the assignee of the present application, and which is hereby incorporated by reference in its entirety.

In some embodiments, a system may be provided wherein each laser pulse may have individualized characteristics. At least one of the laser pulses may be an ultrashort pulse. The system may comprise a laser means for generating a pulse or high repetition rate bursts of pulses as provided in one or more of the embodiments 100, 200, 230, 300, 400. Additionally a control means that controls the laser means and a beam manipulation means for monitoring the pulse width, wavelength, repetition rate, polarization, and/or temporal delay characteristics of the pulses comprising the pulse bursts may be included. In some embodiments, the system may generate feedback data based on the measured pulse width, wavelength, repetition rate, polarization and/or temporal delay characteristics for the control means. In one embodiment, the laser means may comprise a fiber amplifier that uses stretcher gratings and compressor gratings. The beam manipulation means can comprise a variety of devices including, e.g., an optical gating device that measures the pulse duration of the laser pulses, a power meter that measures the power of the laser pulses output from the laser means, and/or a photodiode that measures a repetition rate of the laser pulses. In some embodiments where a frequency converter is utilized, for example a doubler or tripler, a beam manipulation means optically converts the fundamental frequency of a percentage of the generated laser pulses to one or more other optical frequencies, and includes at least one optical member that converts a portion of the fundamental of the laser pulses into at least one higher order harmonic signal. The optical member may comprise a non-linear crystal device with a controller that controls the crystal's orientation. In certain embodiments, the means for converting an optical frequency advantageously includes a spectrometer that measures one or more predetermined parameters of pulses output from the non-linear crystal device and generates feedback for the control means. Another embodiment of the beam manipulation means comprises telescopic optical devices to control the size, shape, divergence, and/or polarization of the laser pulses input, and steering optics to control an impingement location of the laser pulses on a target substrate. The system may further comprise a beam profiler that monitors characteristics of laser pulses and generates feedback for the control means. The above-described system has several uses including, but not limited to, modifying the refractive index of a target substrate; surface marking, sub-surface marking, and/or surface texturing of a target substrate; fabricating holes, channels, trenches, grooves, vias, and/or other features in a target substrate; and depositing and/or removing thin layers of material on a target substrate.

Figure 5:
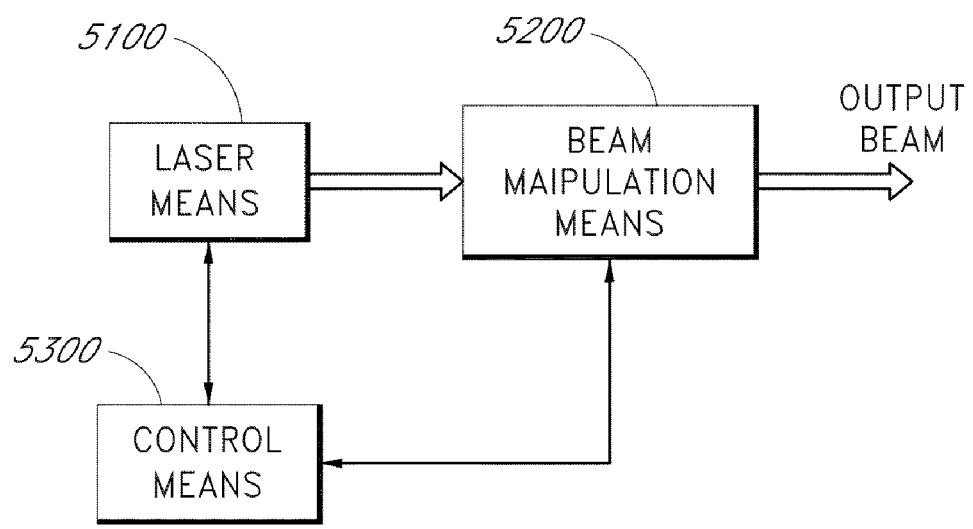

As shown in the embodiment of a laser processing system illustrated in FIG. 5, the control means 5300 is coupled to the laser means 5100. The laser system may be generally similar to an embodiment of the laser system schematically illustrated in FIG. 5 of the '269 application. The control means 5300 monitors several output laser parameters, such as, for example, the average output power, the pulse train (repetition rate and/or burst mode structure), pulse duration (and/or temporal phase, e.g., FROG, frequency resolved optical gating), and/or spatial phase (wavefront sensor). The monitored parameters are linked to the control means 5300 in order to vary laser performance (pulse energy, repetition rate and pulse duration) through feedback loops. Furthermore, the feedback loops may be linked to compressor alignment (e.g., grating separation) in order to pre-chirp the laser pulse, thereby compensating for the optical dispersion caused by the components in subsequent laser system modules. The control means 5300 may comprise, for example, a desktop computer, a laptop computer, a tablet computer, a handheld computer, a workstation computer or any other general-purpose and/or special-purpose computing or communicating device. The control means 5300 may execute any of the well-known MAC-OS, WINDOWS, UNIX, LINUX, or other appropriate operating systems on a computer (not shown). The control means 5300 may be networked to other computing means by physical links and/or wireless links. The control means 5300 may comprise an input device, an output device, random access memory (RAM), and/or read-only memory (ROM), a CD-ROM, a DVD device, a hard drive, and/or other magnetic or optical storage media, or other appropriate storage and retrieval devices. The control means 5300 may also comprise a processor having a system clock or other suitable timing device or software. The input device might comprise a keyboard, mouse, a touch screen, pressure-sensitive pad or other suitable input device, and the output device can comprise a video display, a printer, a disk drive or other suitable output device.

In some embodiments, additional tools may be included to monitor the status of the target substrate, and/or to confirm/control the focal position relative to the surface of the target substrate. For example, an illumination and optical microscopic viewing system (not shown) could be used to locate alignment markers, confirm/deny laser damage, and measure laser affected feature volume and/or morphology. Additional data could be obtained by including spectroscopic diagnostics such as laser induced breakdown spectroscopy (LIBS) and/or laser-induced fluorescence. A range-finding tool that precisely determines the distance from the target surface to the focal point could also be employed. In some applications, determining the distance may be advantageous since one application may include micron-level material processing. Use of a camera system that images the surface of the target substrate could be used as well. At these dimensions, small error/uncertainty may reduce the user's ability to precisely control the laser/material interaction. This may be complicated since several such applications potentially involve subsurface processing of materials with non-planar surfaces. Signals from the viewing/spectroscopic tools could feedback to other system components (e.g., the control means, the means for converting optical frequencies, etc.) to precisely influence the extent and nature of the laser/material interaction. Furthermore, the signal from the range finding tool and/or the viewing/spectroscopic tools can be fed back to the control workpiece positions. The scanning mechanism steering optics, which may include a galvanometer based mirror scanner and possibly one or more additional precision positioners, and control means 5300 provide that the beam is accurately delivered to the target substrate.

Accordingly, in certain embodiments of the systems described herein, laser controls and diagnostics allow for active control of processing parameters in order to ensure that the laser intensity remains within a desired (and/or an optimal range), thereby assuring consistent feature size, material removal rate, and thermal effect. In addition, the ability to control the size, shape, divergence, and/or polarization of the beam makes it possible to further improve (and/or optimize) the shape and/or edge quality of machined features (such as, e.g., grooves and/or trenches). For example, it has been demonstrated that the use of a highly elliptical beam with its major axis parallel to the direction of translation is capable of producing trenches with higher aspect ratio and better surface quality than is possible using a round focal beam (see, e.g., Barsch, Korber, Ostendorf, and Tonshoff, "Ablation and Cutting of Planar Silicon Devices using Femtosecond Laser Pulses," Appl. Physics A 77, pp. 237-244, (2003) and Ostendorf, Kulik, and Barsch, "Processing Thin Silicon with Ultrashort-pulsed Lasers Creating an Alternative to Conventional Sawing Techniques," Proceedings of the ICALEO, Jacksonville, USA, October 2003). Adjusting the laser polarization relative to the direction of scanning has also been shown to affect the surface and edge quality of femtosecond machined grooves. The ability to actively monitor and independently control laser and beam parameters, as enabled by various embodiments of the laser systems described herein, is beneficial for achieving reproducible micron-level precision in the fabrication of features including, for example, surface grooves and/or trenches.

Further details of a system having feedback and controls are described in the '269 application, such as, for example, FIGS. 7-13 and the corresponding text of the '269 application.

In some embodiments, processing may be carried out with a train of picoseconds pulses having total energies sufficient for material removal. For example, pulse widths may be in a range of about 10 ps to about 500 ps. In some embodiments, a pulse compressor may not be utilized. In such embodiments, pulses from one or more laser sources may be amplified to produce the processing pulses. Such a configuration may be generally similar to embodiments of the systems 100, 200, 230, 300, and 400, but with omission of a pulse compressor.

Embodiments are applicable for many micromachining applications, and well matched to applications in microelectronics including, for example, wafer cutting, dicing, scribing, and similar applications. In some applications, suitable modifications of elements shown in the system embodiments 100, 200, 230, 300, and 400 may be made using methods and devices adapted for such applications. For example, in one embodiment, a substrate positioning mechanism may include the X-Y-Z stage 408, and additional rotation mechanism(s) to provide 6-axis capability and/or to maintain flatness and coplanarity of the target substrate (e.g., a wafer). For example, the wafer may be mounted to a special holder (e.g., a wafer chuck) by another material (e.g., tape) for a cutting operation.

Certain embodiments of the systems 100, 200, 230, 300, and 400 include various combinations of laser and amplifier(s). Although fiber-based technology is preferred in some embodiments, various embodiments may utilize waveguide lasers and/or amplifiers, regenerative amplifiers, and so forth. In some embodiments, the technologies may be used in combination with fiber amplifiers, lasers, and/or a length of un-doped transmission fiber. For example, in one embodiment, a passively Q-switched microchip laser may produce several microjoules of pulse energy at repetition rates somewhat below one MHz, for example up to about 100-500 kHz, and somewhat larger. Pulse widths may be in the range of about 1 ps to about 100 ps. In some embodiments a microchip laser may seed a fiber amplifier, for example as disclosed in the above-incorporated U.S. patent application Ser. No. 10/437,057 to Harter.

In some embodiments, pulse widths of less than a few nanoseconds may be utilized, for example sub-nanosecond pulses or pulses having a width of about 500 ps or less. Suitable modifications of the embodiments shown in 100, 200, 230, 300, and 400 include diode based or microchip laser seed sources, elimination of at least one of a pulse stretcher and pulse compressor, reduced number of amplifier stages, elimination of amplifier stages, and the like.

For example, the above-incorporated U.S. patent application Ser. No. 10/437,057 discloses various embodiments utilizing seed and microchip laser sources which are amplified and compressed with various fiber and non-fiber elements to produce ultrashort pulse widths. In one embodiment seed pulses of a few nanoseconds are generated using a semiconductor laser diode, portions thereof are selected using a GHz electro-optic modulation, and then further processed so as to obtain amplified and compressed pulses. Typical repetition rates are less than about 10 MHz. The disclosed arrangements provide elements and sub-systems useable by a person skilled in the art to construct relatively high repetition rate (e.g., 500 kHz-10 MHz) short pulses (sub-picosecond to about a few nanoseconds) so as to create geometric features within a predetermined tolerance, and with reduced accumulation of redeposited material on or very near to a processing location when operated at the higher repetition rates.

Numerous variations are possible. For example, in some embodiments a Q-switched microchip laser may provide pulses having a width of a few picoseconds to several tens of picoseconds, but at a rate of tens of kHz up to about 100 kHz. In some embodiments, the operating repetition rate may be increased substantially, for example to 500 kHz or a few MHz, with a tolerable increase in the pulse width to a sub-nanosecond width. An embodiment may optionally include a fiber amplifier. By way of example, R. Fluck, B. Braun, E. Gini, H. Melchior, and U. Keller, in "Passively Q-switched 1.34 µm Nd: YVO$_4$ Microchip Laser with Semiconductor Saturable Absorber Mirrors, Optics letters, Vol. 22, No. 13, disclose an early 1.3 µm passively Q-switched laser with performance similar to a 1 µm version. Variations in pump power, crystal length, and design of a SESAM (semiconductor saturable absorber mirror) resulted in pulse widths of 230 ps to 12 ns and repetition rates of 30 kHz to 4 MHz.

Some embodiments may include modifications of an early model GXP-pulsar developed by IMRA America, Inc, the owner of the present application. The system utilized a semiconductor seed laser and at least one fiber optic amplifier. Numerous other configurations are possible.

Various embodiments may provide pulse widths in the range of about a few hundred picoseconds to several hundred picoseconds. The laser system may comprise an FCPA system. In some embodiments that utilize picosecond or longer pulses any pulse compressor may be eliminated. Alternatively, a system may be configured to produce amplified picosecond pulses without chirped pulse amplification, e.g., preferably with a fiber amplifier system.

Referring back to FIG. 4A, the laser system 104 may include a mode-locked fiber oscillator or other seed source, and a fiber amplifier system having a fiber power amplifier. In various embodiments the fiber power amplifier comprises a multimode fiber amplifier configured to provide an output substantially in the fundamental mode. For example, the system may utilize a fiber power amplifier as described in U.S. Pat. No. 5,818,630, issued to Fermann, et al., entitled "Single-Mode Amplifiers and Compressors Based on Multi-Mode Fibers," assigned to the assignee of the present application, and hereby incorporated by reference herein in its entirety. Multimode fiber amplifiers provide production of peak powers and pulse energies that are higher than those achievable in single-mode (SM) fibers before the onset of undesirable non-linearities and gain saturation. In other embodiments, large-area amplifiers may be utilized, for example photonic bandgap or photonic crystal fiber designs. High quality output beams were demonstrated with leakage mode designs, for example, as described in U.S. patent application Ser. No. 11/134,856, entitled, "Single Mode Propagation in Fibers and Rods with Large Leakage Channels," published as U.S. Patent Application Publication 2006/0263024, assigned to the assignee of the present application, and hereby incorporated by reference herein in its entirety.

Figure 4B:
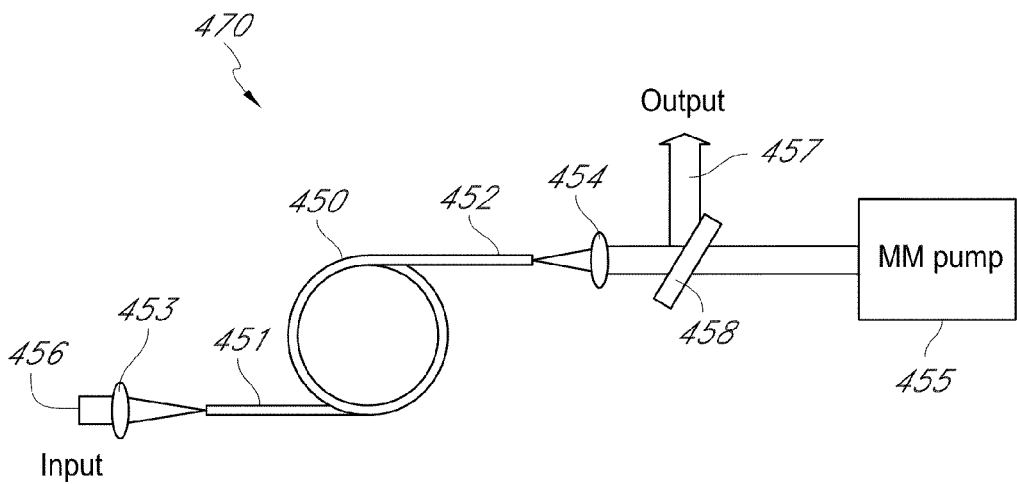
FIG. 4B schematically illustrates an embodiment of a large mode area fiber comprising a core doped with rare earth ions that can be used in a fiber amplifier or in a laser pumped by a multimode pump source FIG. 5 schematically illustrates a further embodiment of a system for processing a workpiece with laser pulse trains, the system having feedback and controls based on process and/or target information.

In at least one embodiment the amplifier may be included in laser system 104. FIG. 4B schematically illustrates an example embodiment 470 of a large mode area fiber comprising a core doped with rare earth ions that can be used in a fiber amplifier, or in a laser pumped by a multimode pump source. For example, the embodiment 470 can be included in the laser system 104 schematically shown in FIG. 4A. Input beam 456 may be generated with a mode-locked oscillator, semiconductor diode, diode and electro-optic modulator, and/or other suitable source. Prior to amplification with the large-mode amplifier, a preamplifier may boost the pulse energy levels.

The laser system 104 may also include pulse selectors, polarization controllers, and/or beam shaping optics to condition pulses prior to and/or after amplification. In the embodiment 470 illustrated in FIG. 4B, the fiber 450 has straight input and output ends 451, 452, respectively, and a coiled section therebetween. A multimode pump 455 is used to pump the amplifier or laser using a coupling lens 454. Input beam 456 is launched into the fiber 450 through a lens 453. Output 457 is separated by dichroic mirror 458. In other embodiments, the fiber 450 and/or other components may be configured differently than schematically shown in FIG. 4B. Also, various components can be removed, added, and/or arranged differently than shown in the example embodiment 470 illustrated in FIG. 4B.

Various laser or amplifier embodiments may be utilized in an all-fiber design for generation of high peak power pulses in the femtosecond, picosecond, and/or nanosecond regimes with reduced or negligible non-linear effects. The laser or amplifiers may also be utilized in FCPA systems to further increase available pulse energy. In one example embodiment a core diameter of about 70 µm-100 µm or larger may be used to produce nanosecond pulses having energy of a few mJ to about 10 mJ. In another embodiment, ultrashort pulses with example pulse widths of about 1-10 ps may be produced with output energies in the range of about 10 µJ to a few hundred µJ. Pulse repetition rates greater than about 100 KHz, and up to at least a few MHz may be utilized in various embodiments. Repetition rates in the range of 100 MHz to 1 GHz are also possible, depending on the average power rating and system requirements. By way of example, and as disclosed in PCT Application No. PCT/US2008/074668 entitled "Glass Large-Core Optical Fibers", which is owned by the assignee of the present application and which is hereby incorporated by reference herein in its entirety, input pulses at 25 KHz repetition rate, 5 µJ pulse energy, and 600 ps pulse width emitted from a microchip laser were amplified to about 400 µJ in a large-core leakage channel fiber, producing nearly diffraction limited output beams, and without distortion caused by non-linear effects. In the experiment no pulse stretching or compression was utilized. Higher pulse energies and repetition rates are achievable. Therefore, many possibilities exist for fiber-based amplified laser configurations.

Experimental Results—Silicon Trench Digging and Wafer Dicing Examples

The example experimental results that follow demonstrate embodiments of systems and methods for "trench digging" and "wafer dicing." In these example experiments, silicon substrates were generally processed using ultrashort pulses having sub-picosecond pulse widths. Some results were obtained with pulses having a pulse width up to about 200 ps.

Experimental System

Figure 6A:
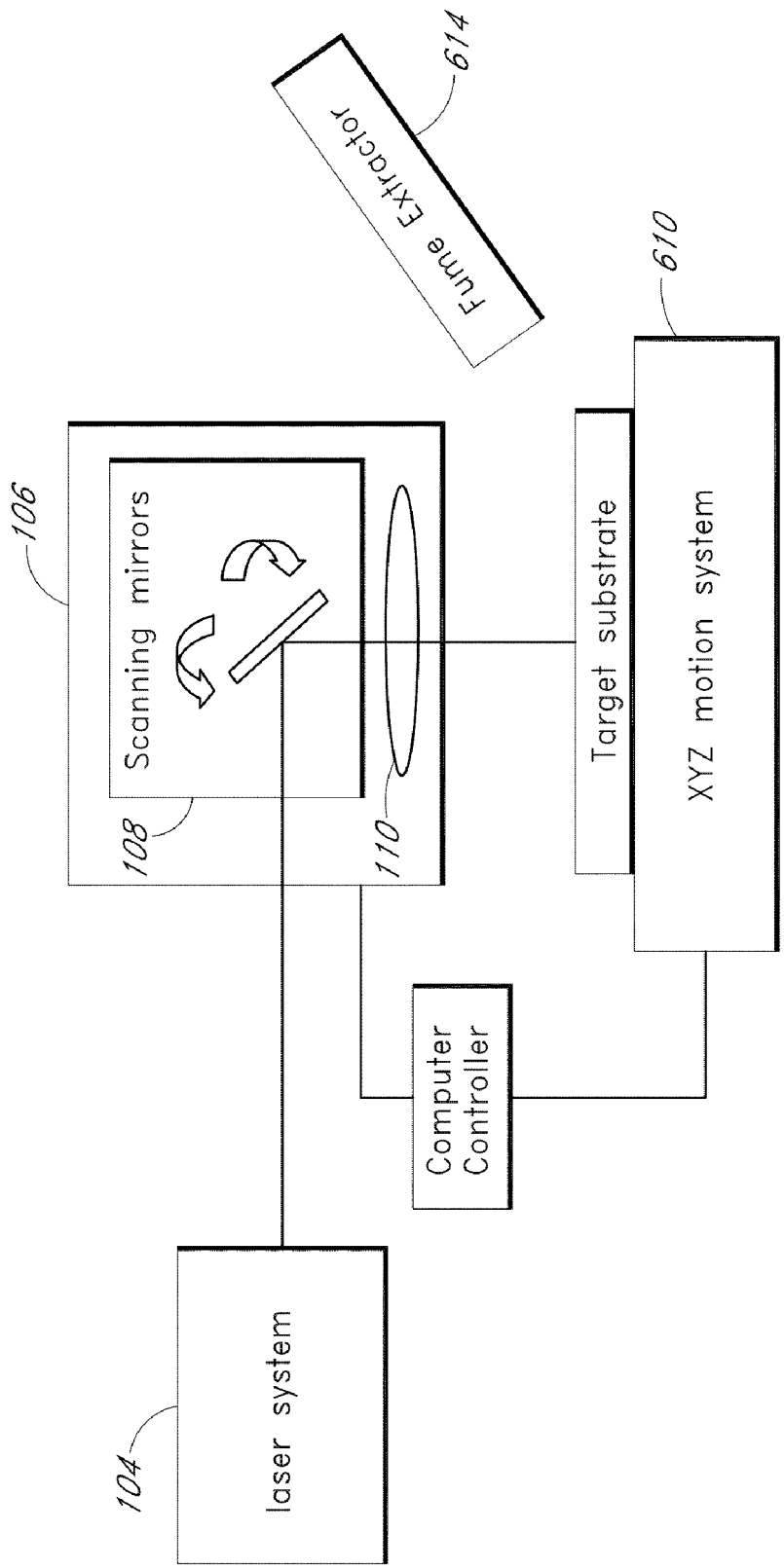
FIGS. 6A and 6B show a schematic representation and a photograph, respectively, illustrating an experimental system corresponding to an embodiment for processing a workpiece with laser pulse trains.

As schematically illustrated in FIG. 6A, the experimental arrangement included a laser system 104 providing more than 10 µJ of available pulse energy, pulse widths in a range from about 500 fs to about 500 ps, and a repetition rate exceeding 100 kHz. The laser parameters of the experimental system were varied, although not necessarily all the parameters were independent of each other. For example, pulse energy influences the minimum achievable pulse width. In some experiments, a typical focused spot size at the substrate surface was about 15 µm, which at an energy of 10 µJ provides an average fluence of about 5-6 J/cm$^2$ and a power density of nearly 10$^{13}$ W/cm$^2$. At a repetition rate of 500 kHz, the average power produced by the system is about 5 W in some experiments.

Figure 6B:
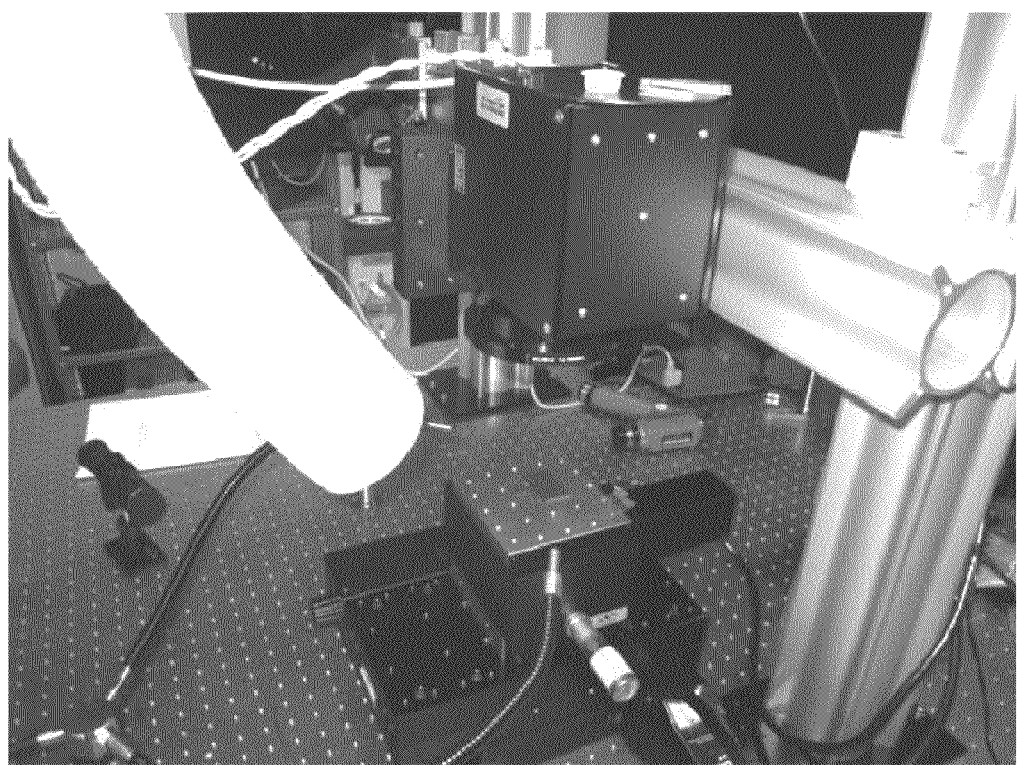

A photograph of the system is shown in FIG. 6B. The experimental setup includes a fume extractor 614, which is operable to remove particulate fumes generated during machining. The fume extractor 614 was operated at an extraction rate of approximately 350 cubic feet per minute. The experimental setup included an XYZ motion system 610.

Measurement Tools, Methods, and Specifications

Figure 7:
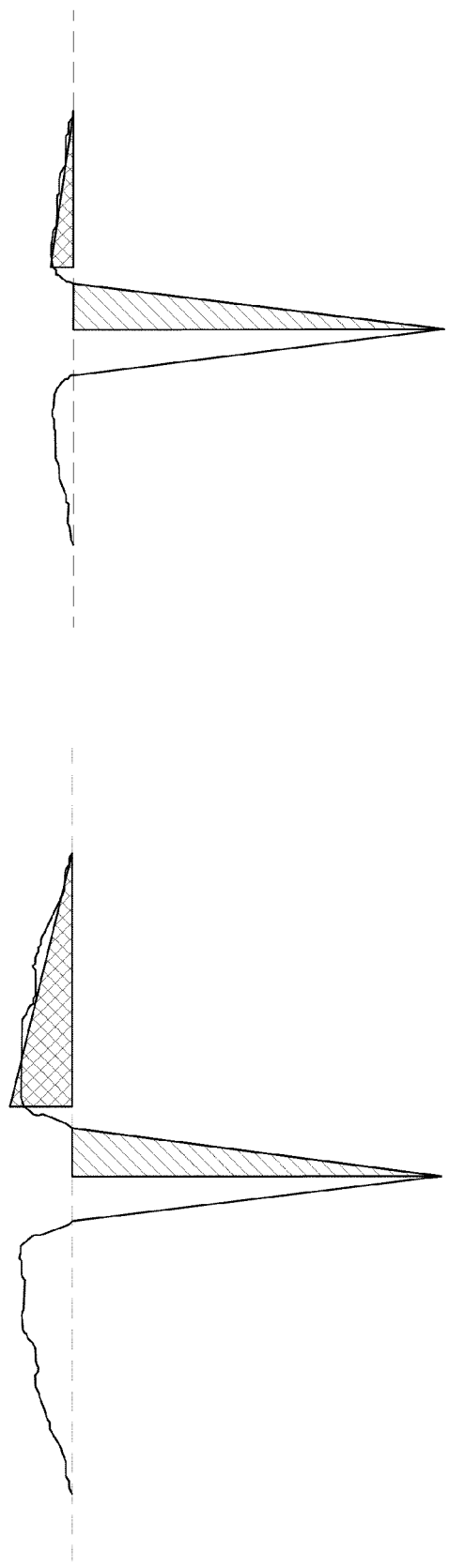
FIG. 7 schematically illustrates one example technique for quantifying processing quality so as to obtain an approximation of an ablated volume and a redeposited volume proximate to a processing location.

FIG. 7 schematically illustrates one example technique for quantifying processing quality so as to obtain an approximation of an ablated volume and a redeposited volume proximate to a processing location. For some processing applications, a rough measurement of the trench depth relative to the recast peak or average height may be sufficient to quantify the influence of laser parameters on machining quality. However, for other processing applications, it may be more accurate to characterize a quantity of material removed versus a quantity of material recast.

As an example, FIG. 7 schematically illustrates one possible method for quantifying laser-based material processing. From cross-sectional images of the trench obtained, for example, with a scanning electron microscope (SEM), the ablated area is approximated by fitting a triangle to the shape of a vertical bisector of the trench (hatched triangles in FIG. 7). A triangular approximation is also used to approximate the amount of material recast (cross-hatched triangles in FIG. 7). The trench (or other feature) quality is therefore quantified by the ratio of the triangular ablated area to the triangular recast area. In the following example results, a JEOL JSM 6060 SEM, available from JEOL USA, Inc. (Peabody, Mass.) was used. Additional measurements are obtainable using automated or semi-automated tools, for example a fully automated SEM system, white light interferometer, surface profilometer(s), and/or atomic force microscopes.

Some of the measurements, particularly those with longer pulse widths of 200 ps, were made by approximating the trench and recast with a polygon enclosing the area and estimating the area from the area of the polygon. In various embodiments, the polygon may have 3, 4, 5, 6, 7, 8, or more sides. In other embodiments, different shapes may be used to estimate the trench and/or recast areas. For example, a cross-sectional profile of a feature may be approximated by a spline, a best-fit curve, etc. In yet other embodiments, trench and/or recast areas may be estimated by summing areas of a plurality of geometric shapes (e.g., rectangles, trapezoids, etc.) that "fit" in the features (e.g., generally similar to approximating the area under a curve using the trapezoidal rule or Simpson's rule). A wide variety of numerical techniques may be used to estimate areas.

FIGS. 7A-7F show example SEM photographs of cross-sections obtained from silicon samples. The photographs demonstrate the trends observed in the experiments as will be described below. FIGS. 7A-7F include values of laser parameters, which are approximate, but known with sufficient accuracy to support any conclusions set forth below. FIGS. 7A-7F include scale bars to indicate the sizes of various features shown in the SEM photographs.

Reference is made below and in the corresponding figures to the number of machining (or processing) passes, N at various scan speeds. In various embodiments, the scanner arrangement provides for a scan speed (measured for example in m/s), but, in certain embodiments, a retrace period may occur at a fixed rate (10 m/s in the example experiments). Because the laser source was active during the retrace period in the example experiments described below, the laser exposure is somewhat greater than the listed pulse energies, and the additional exposure can be determined from the ratio of the 10 m/s retrace speed to the listed scan speed.

Example Effects of Varying Pulse Energy

Figure 7A:
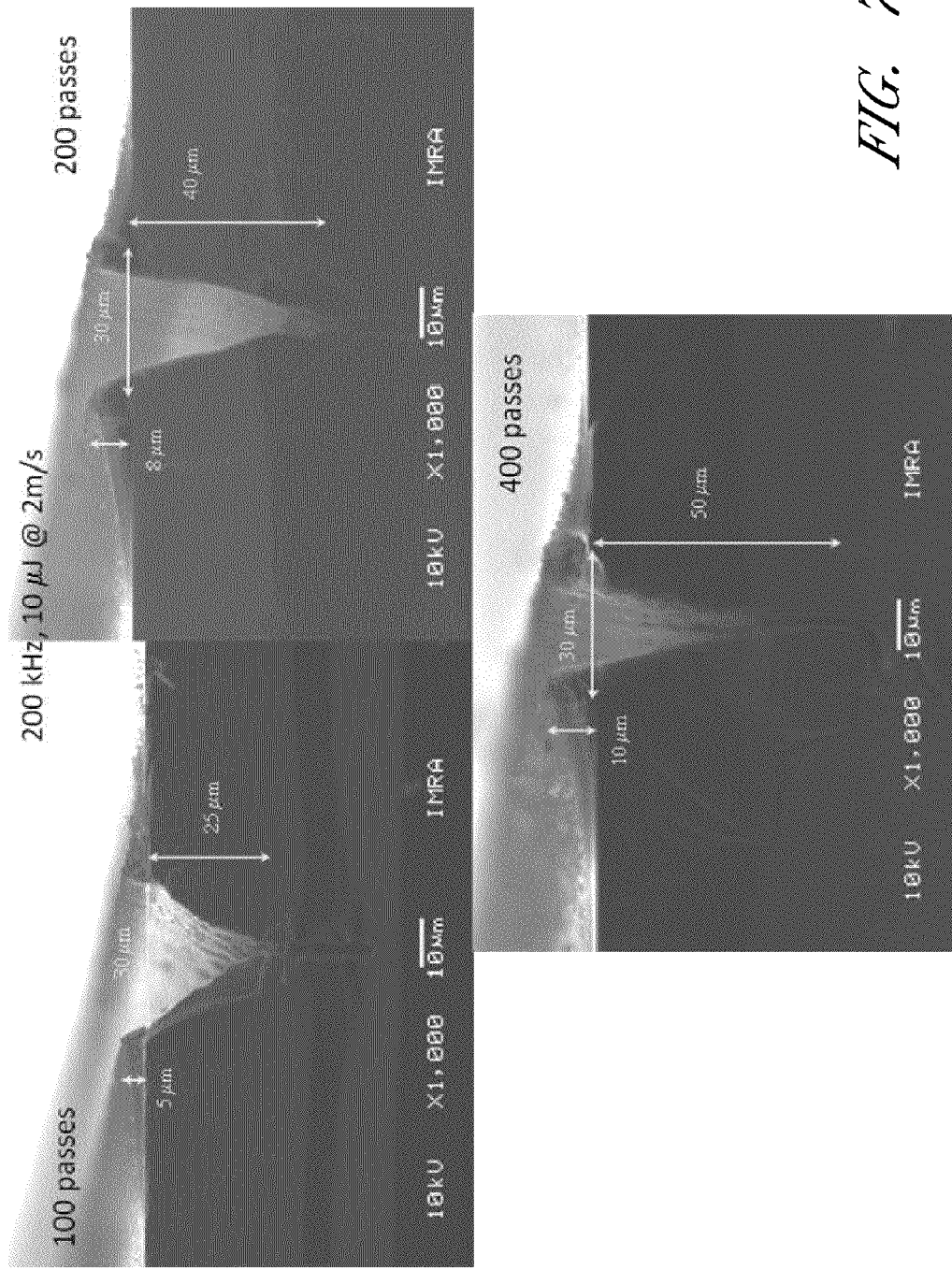
FIGS. 7A-7F show example scanning electron microscope (SEM) cross sections obtained from silicon samples, wherein the experimental results were obtained by varying laser processing parameters of the example system of FIGS. 6A and 6B.
Figure 7B:
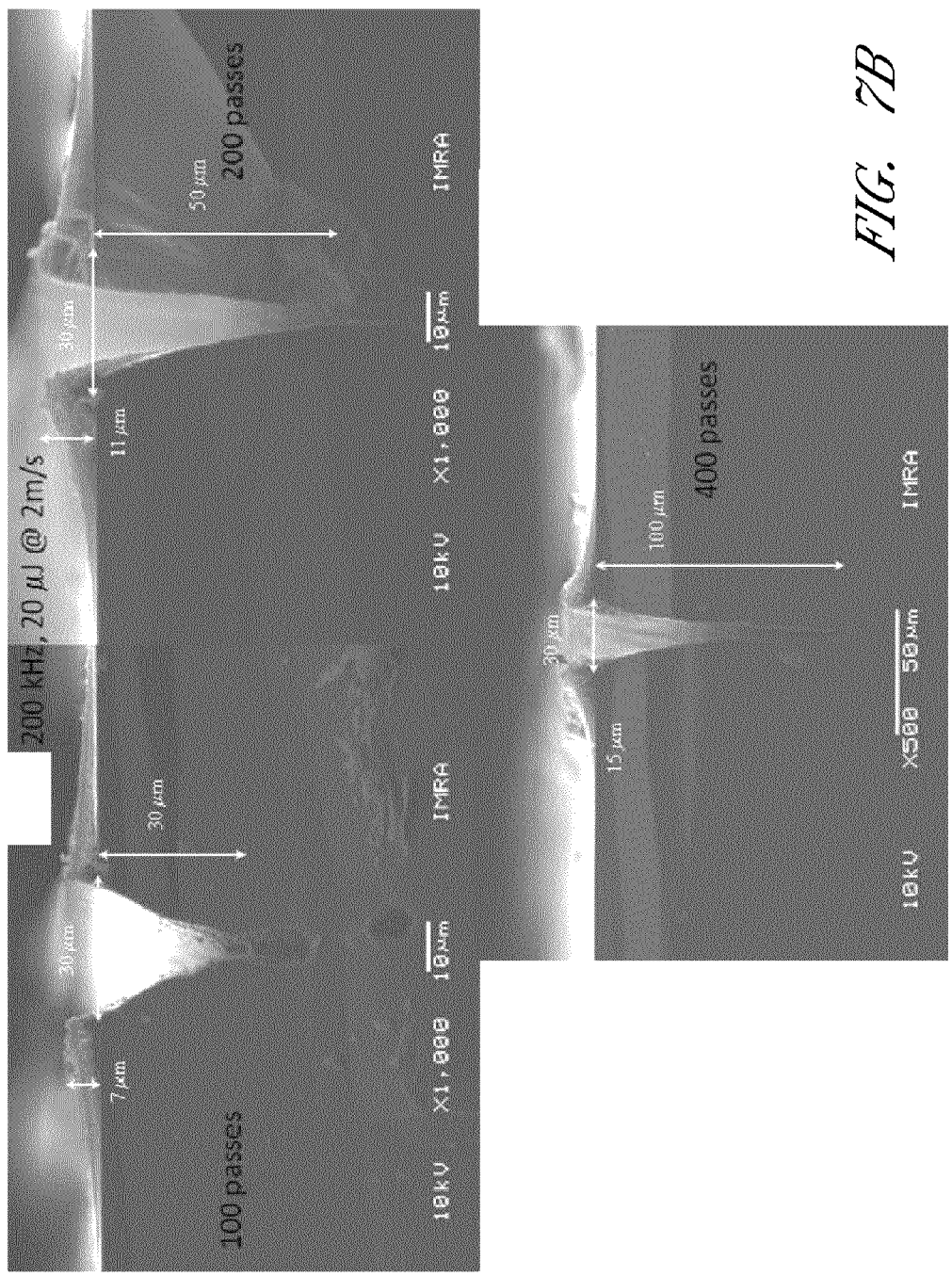

FIGS. 7A and 7B illustrate some example experimental effects of varying laser energy. In these examples, a 200 kHz laser repetition rate, a 15 µm focal spot diameter, and about 33% spatial overlap were fixed during machining. FIG. 7A shows results for pulse energies of about 10 µJ, and FIG. 7B shows results for pulse energies of about 20 µJ. The image panels in FIGS. 7A and 7B show results for 100 passes, 200 passes, and 400 passes. Increasing pulse energy from 10 µJ to 20 µJ provides for greater depth penetration with an increasing number of machining passes. The larger pulse energy also produces a greater amount of redeposited material surrounding the ablated feature. For example, after 400 passes using 20 µJ pulse energy, which generally corresponds to the largest machining depth in this example, the machining produced about 15 µm peak-to-peak of redeposited material. In contrast, with 10 µJ pulses, only about 10 µm peak-to-peak of redeposited material was measured. Therefore, greater ablated volume results in greater redeposited volume.

Figure 7C:
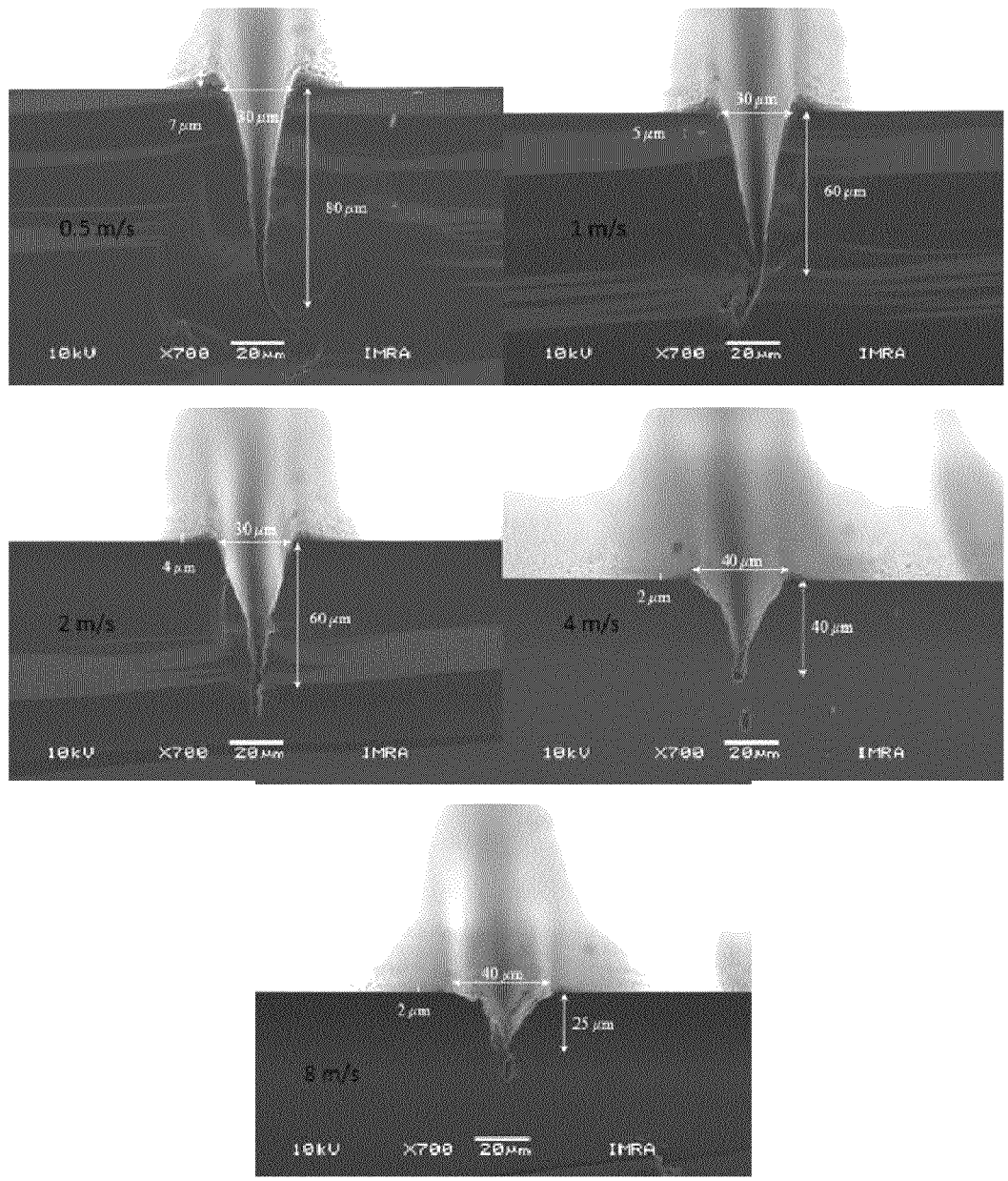

Example Effects of Scan Speed and Efficiency Versus Unwanted Redeposited Material FIG. 7C includes SEM photographs showing effects of scan speed, efficiency, and accumulation of redeposited material. In this example, a 500 kHz laser repetition rate, a 15 µm $1/e^2$ focal spot diameter, a 10 µJ pulse energy, and 100 passes were fixed parameters. The scan speed was varied in a range from about 0.5 m/s to about 8 m/s. As the scan speed increases in this range, the spatial overlap of incident pulses and the total incident energy decreases, and both the ablated volume and the redeposited volume are reduced. Decreasing the spatial overlap reduces the heat load per unit area and reduces the interaction of subsequent laser pulses with "excited" material. As the scan speed increases in this range, the ratio of ablated depth to recast height increases, which results in cleaner processing. This trend is not unusual, and is commonly observed during high speed/multi-pass cutting and helical drilling applications with nanosecond solid-state laser systems.

Example Effects of Laser Repetition Rate

Figure 7D:
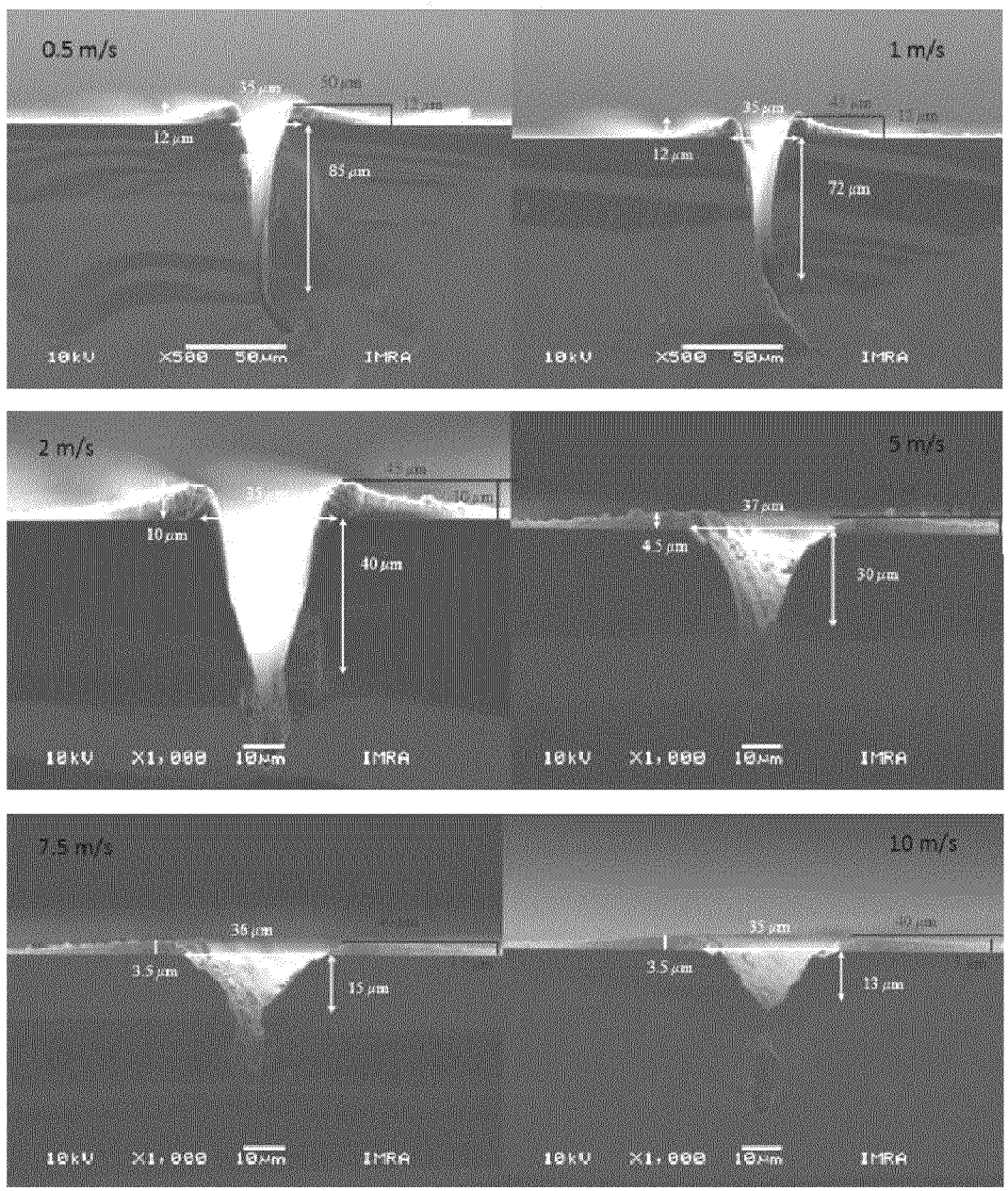
Figure 7E:
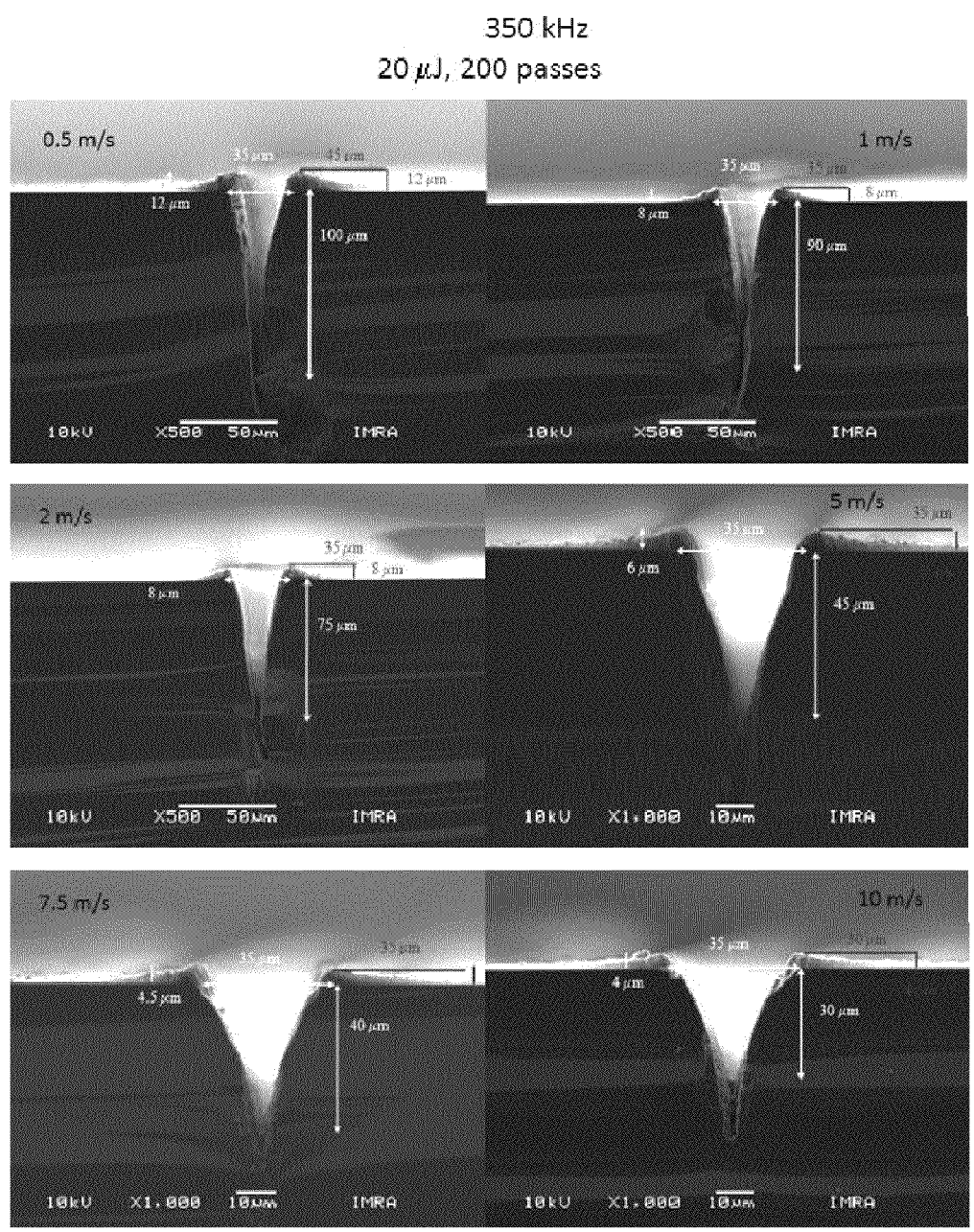
Figure 7F:
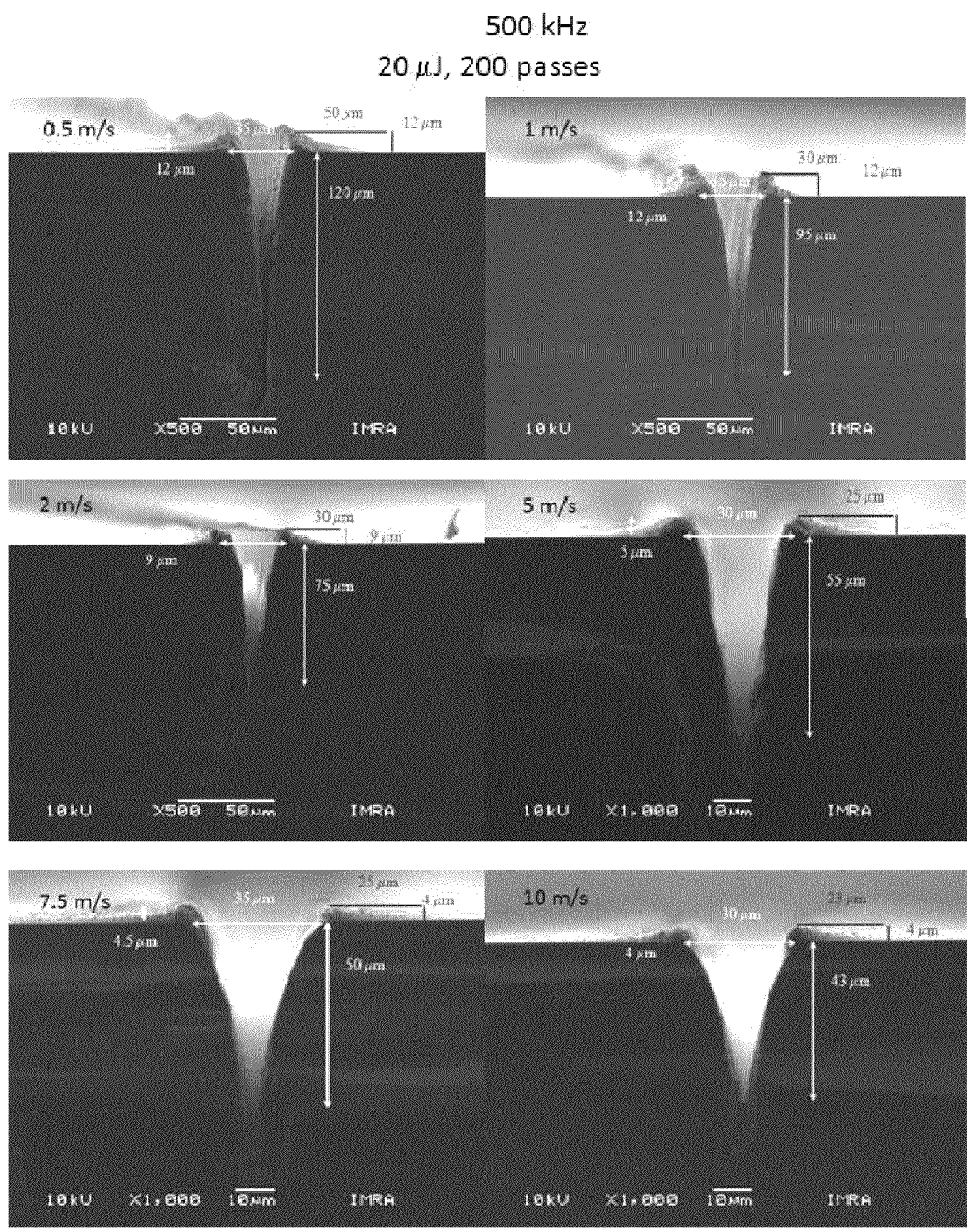

FIGS. 7D-7F illustrate example effects of laser repetition rate on the machining quality. In this example, the fixed focal spot diameter of about 15 µm at $1/e^2$, the pulse energy of 20 µJ, and 200 machining passes were fixed parameters. In each of FIGS. 7D-7F, image panels show results in which the scan speed was varied from about 0.5 m/s to about 10 m/s The experimental results shown in FIGS. 7D-7F were performed at a laser repetition rate of about 200 kHz, 350 kHz, and 500 kHz, respectively. FIGS. 7D-7F include scale bars to indicate the size of ablated and redeposited cross sections. In this example pulse energy of about 20 µJ was used and both the scan speed and repetition rate varied.

The depth and area of ablated features and the height and areas of recast material were measured using the technique described with reference to FIG. 7, and the results of the experiments are summarized in the tables below. In these example tables, a measure of processing quality is the ratio of the ablated area of a feature to the area of material redeposited adjacent to the ablated feature. Processing efficiency may be characterized in terms of processing speed (e.g., ablated area per second) relative to the average power (generally assuming the same pulse energy). The experimental data shown in FIGS. 7D-7F and summarized in the example tables were obtained by varying repetition rate and scan-speed with other parameters fixed. This data may be used to determine an example relation between quality and processing efficiency for the experiments summarized in the tables.

Tables Corresponding to Results Shown in FIGS. 7D-7F

| 200 kHz, 20 uJ | | | | 350 kHz, 20 uJ ablation | | | |
|---|---|---|---|---|---|---|---|
| speed (m/s) | ablation depth (um) | recast height (um) | ratio | speed (m/s) | depth (um) | recast height (um) | ratio |
| 0.5 | 85 | 12 | 7.083333 | 0.5 | 100 | 12 | 8.333333 |
| 1 | 72 | 12 | 6 | 1 | 90 | 8 | 11.25 |
| 2 | 40 | 10 | 4 | 2 | 75 | 8 | 9.375 |
| 5 | 30 | 4.5 | 6.666667 | 5 | 45 | 5 | 9 |
| 7.5 | 15 | 3.5 | 4.285714 | 7.5 | 40 | 4.5 | 8.888889 |
| 10 | 13 | 3 | 4.333333 | 10 | 30 | 4 | 7.5 |

| 200 kHz, 20 uJ | | | | 350 kHz, 20 uJ | | | |
|---|---|---|---|---|---|---|---|
| speed (m/s) | ablated area (um^2) | recast area (um^2) | ratio | speed (m/s) | ablated area (um^2) | recast area (um^2) | ratio |
| 0.5 | 744 | 300 | 2.48 | 0.5 | 875 | 270 | 3.240741 |
| 1 | 630 | 270 | 2.333333 | 1 | 788 | 140 | 5.628571 |
| 2 | 350 | 225 | 1.555556 | 2 | 656 | 140 | 4.685714 |
| 5 | 278 | 101 | 2.752475 | 5 | 394 | 88 | 4.477273 |
| 7.5 | 135 | 70 | 1.928571 | 7.5 | 350 | 79 | 4.43038 |
| 10 | 114 | 60 | 1.9 | 10 | 263 | 60 | 4.383333 |

| 500 kHz, 20 uJ | | | |
|---|---|---|---|
| speed (m/s) | ablation depth (um) | recast height (um) | ratio |
| 0.5 | 120 | 12 | 10 |
| 1 | 95 | 12 | 7.916667 |
| 2 | 75 | 9 | 8.333333 |
| 5 | 55 | 5 | 11 |
| 7.5 | 50 | 4.5 | 11.11111 |
| 10 | 43 | 4 | 10.75 |

| 500 kHz, 20 uJ | | | |
|---|---|---|---|
| speed (m/s) | ablated area (um^2) | recast area (um^2) | ratio |
| 0.5 | 1050 | 300 | 3.5 |
| 1 | 831 | 180 | 4.616667 |
| 2 | 656 | 135 | 4.859259 |
| 5 | 412 | 63 | 6.539683 |
| 7.5 | 438 | 50 | 8.76 |
| 10 | 323 | 46 | 7.021739 |

Figure 8:
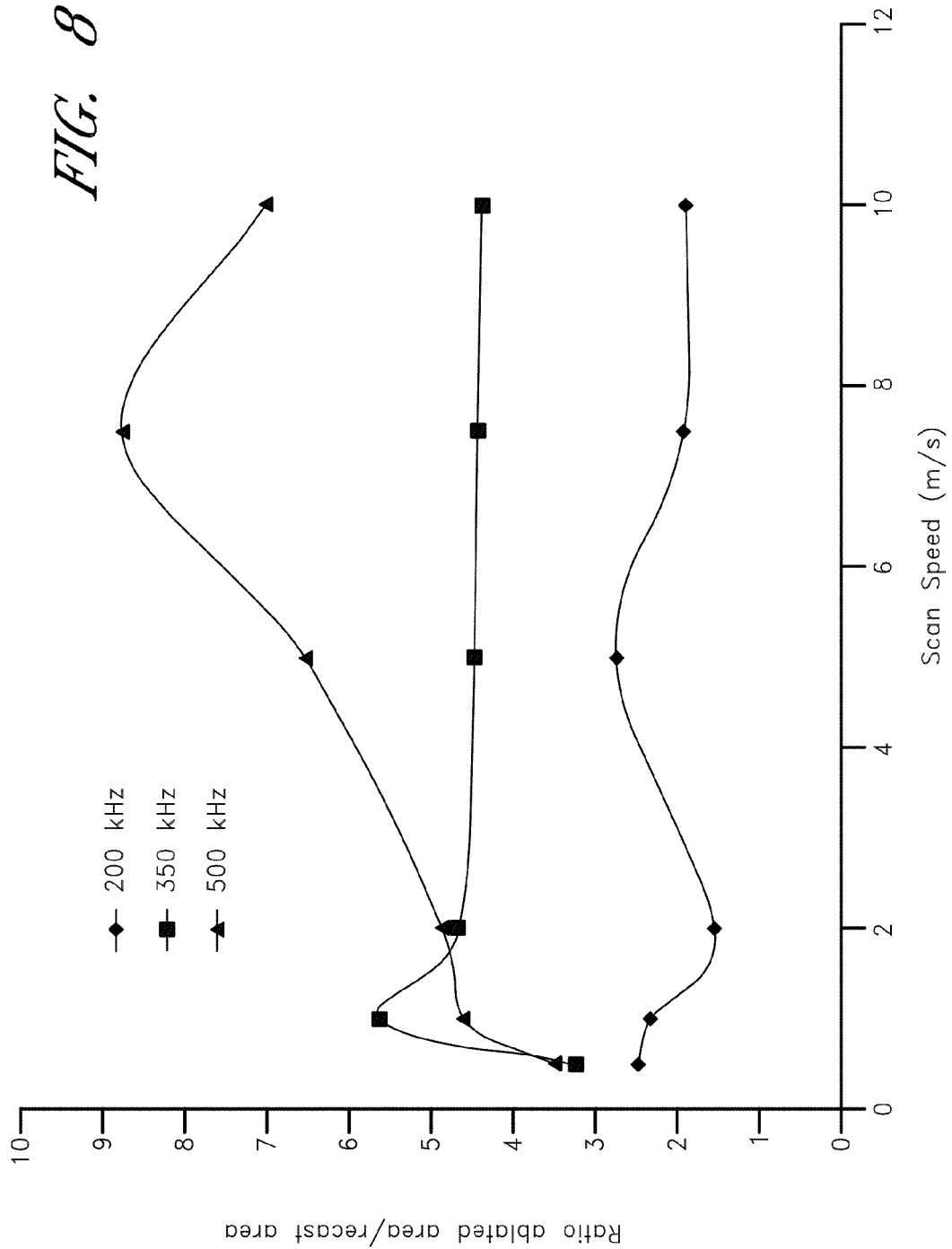
FIG. 8 is a plot showing examples of ablated cross-sectional area versus re-deposited cross sectional area as a function of scan speed and repetition rate.

FIG. 8 is a plot showing the ratio of the ablated cross sectional area to redeposited cross sectional area relative to scan speed at the different laser repetition rates for the experimental results shown in FIGS. 7D-7F. This plot demonstrates that the quality of the ablated features improves with increasing repetition rate for scan speeds greater than about 2 m/s.

Examples of processing efficiency are shown in FIG. 9. A weighted ablated cross sectional area is plotted versus scan speed for the results shown in FIGS. 7D-7F. In order to account for differences in average power and spatial overlap, the ablated areas are multiplied by a weighting factor which is proportional to the differences in laser repetition rate. The weighting factor is 1 for 200 kHz, 0.57 for 350 kHz, and 0.4 for 500 kHz. The plot in FIG. 9 demonstrates that the efficiency of ablation is independent of repetition rate for scan speeds greater than 2 m/s. Therefore, the improvement in processing quality (at higher repetition rates) is not significantly compromised at the expense of processing efficiency.

Increasing the laser repetition rate significantly affects the nature and amount of redeposited material. Referring back to FIGS. 1A-1E, the experimental results demonstrate a desirable increase in the ratio of material removed from the target region 1001-c to the redeposited material 1005-b. In contrast to the predictable trends shown in FIGS. 7A-7C, the observed influence of high repetition rates (see, e.g., FIGS. 7D-7F) was unforeseen and unexpected.

Although it is not necessary to the practice of embodiments of the disclosed systems and methods to understand the operative mechanism for these unexpected results and without subscribing to any particular theory, the demonstrated improvement with increasing repetition rate may be a result of the interaction between the ablation plume and subsequent laser pulses as the inter-pulse separation decreases from about 10 µs to about 1 µs. This may suggest, in some experiments, that the redeposited material may comprise fine particles. Further, the results suggest a previously unexploited laser-material interaction regime may exist, influenced by the repetition rate.

Examples of Cleaning and Post-Processing

Figures 1, 10A:
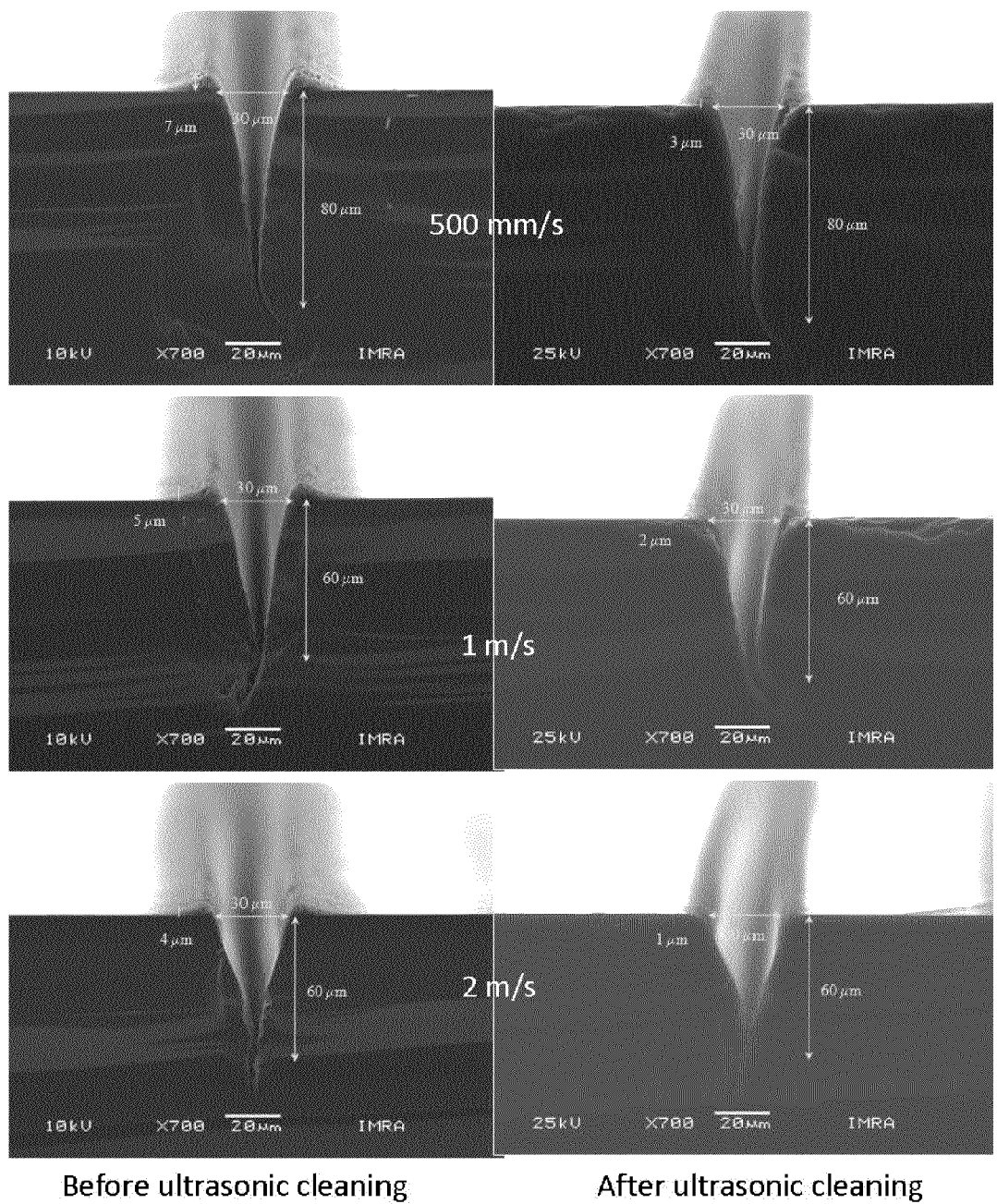
Figures 2, 10A:
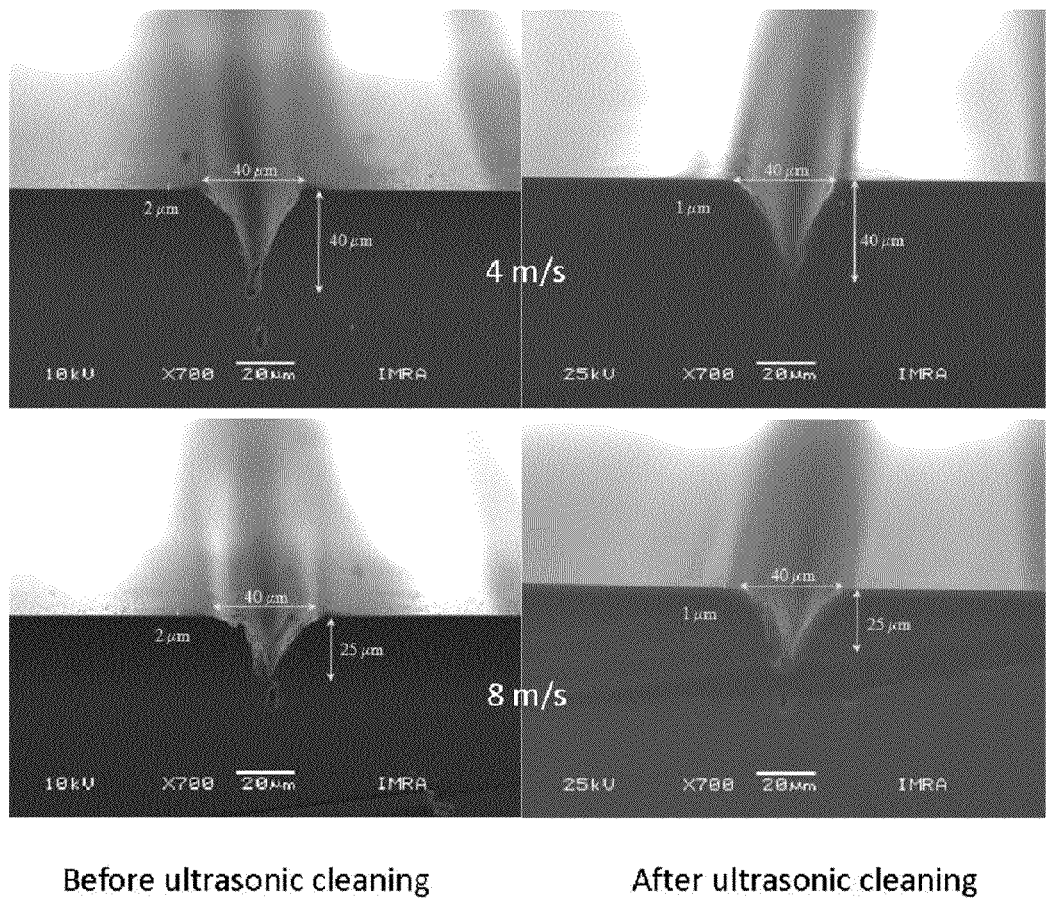

FIGS. 10A-1 and 10A-2 show example SEM cross-sections, wherein a quantity of re-deposited material is sufficiently low such that conventional ultrasonic cleaning is effective for further debris removal. These experimental results may be applicable to, for example, thin-wafer dicing and similar applications. The fixed laser parameters were a 500 kHz repetition rate, a 10 µJ pulse energy, and 100 machining passes. The scanning speed was varied from about 0.5 m/s to about 8 m/s for the experimental results shown in FIGS. 10A-1 and 10A-2. The SEM images in the left panels of FIGS. 10A-1 and 10A-2 are before ultrasonic cleaning, and the SEM images in the right panels of FIGS. 10A-1 and 10A-2 are after ultrasonic cleaning. The SEM photographs in FIGS. 10A-1 and 10A-2 generally show a significant decrease in the volume of the redeposited material after cleaning.

Figure 10B:
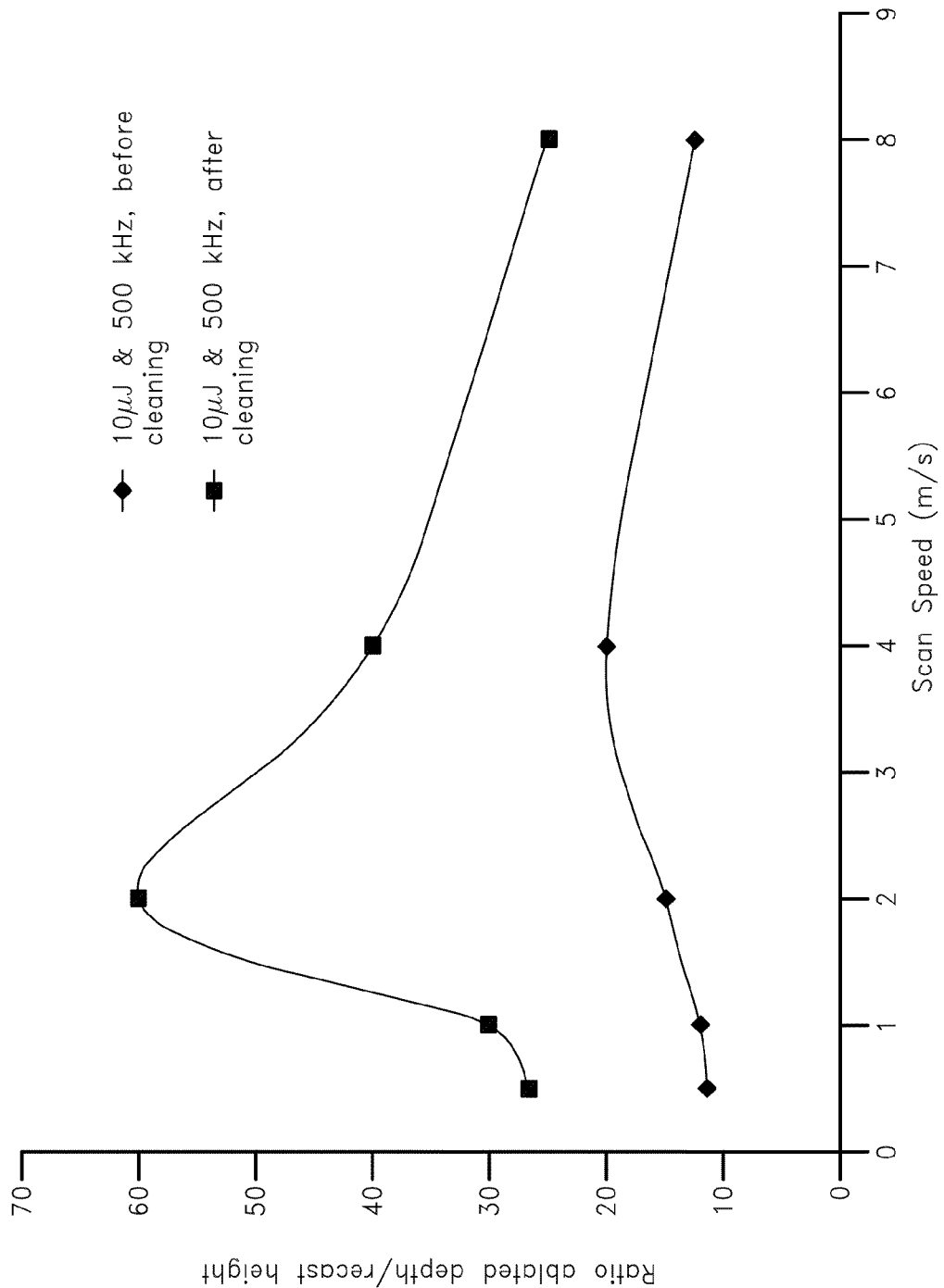
FIG. 10B is a plot of a ratio of ablated depth to recast height corresponding to the data shown in FIGS. 10A-1 and 10A-2.

FIG. 10B is a plot of a ratio of ablated depth to recast height corresponding to the data shown in FIGS. 10A-1 and 10A-2. The plot in FIG. 10B shows a nominal two-fold reduction in recast height after ultrasonic cleaning. In some cases, the height of redeposited material remaining after cleaning was at or near a practical measurement limit of the method described with reference to FIG. 7, for example, about 1 µm, at 1000× magnification. The experimental results of FIGS. 10A-1, 10A-2, and 10B are summarized in the tables below.

Examples of "Double-Pulse" Experiments

Figure 11A:
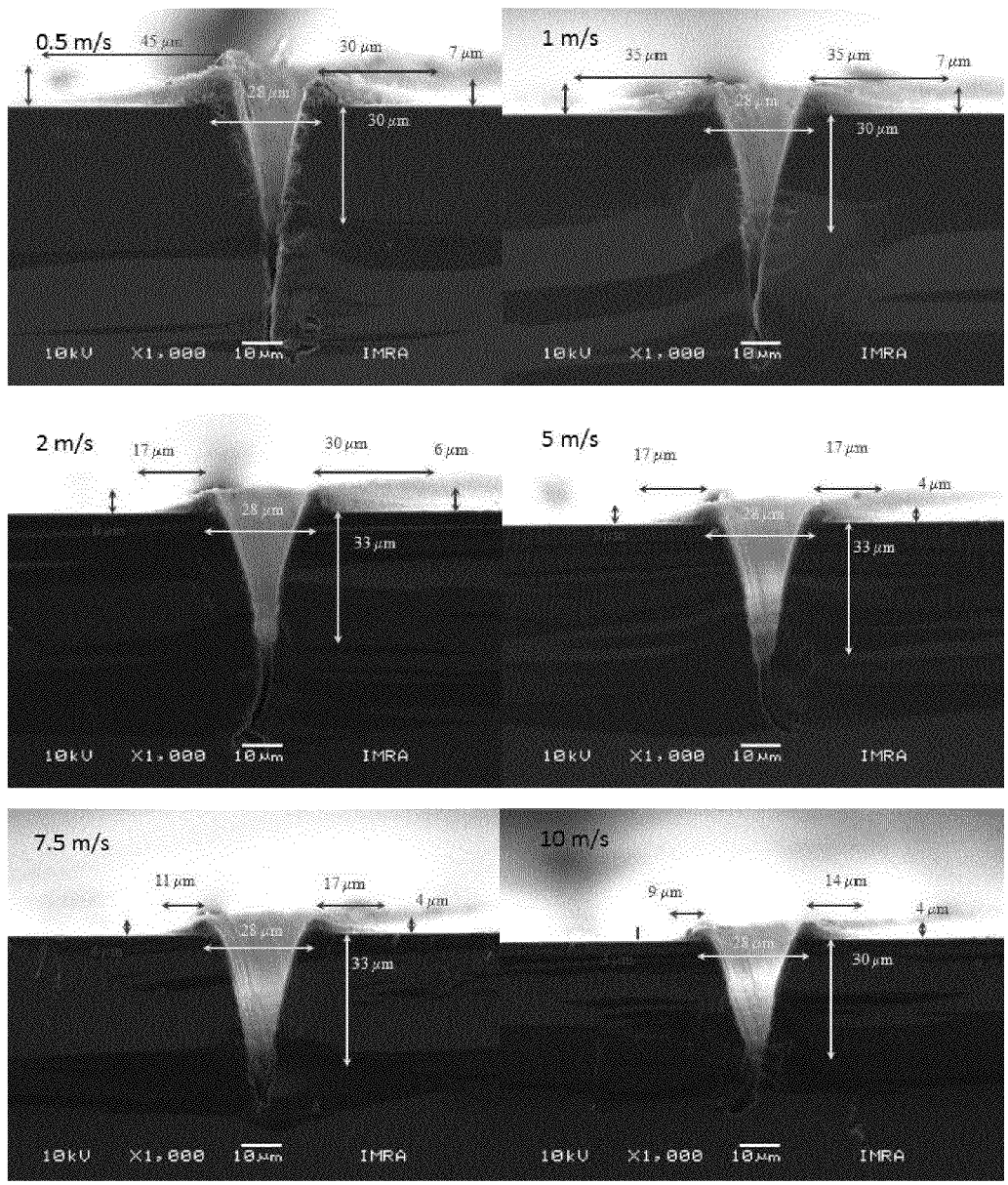
FIGS. 11A-11C show example SEM cross-sections comparing results of single and double pulse processing.
Figure 11B:
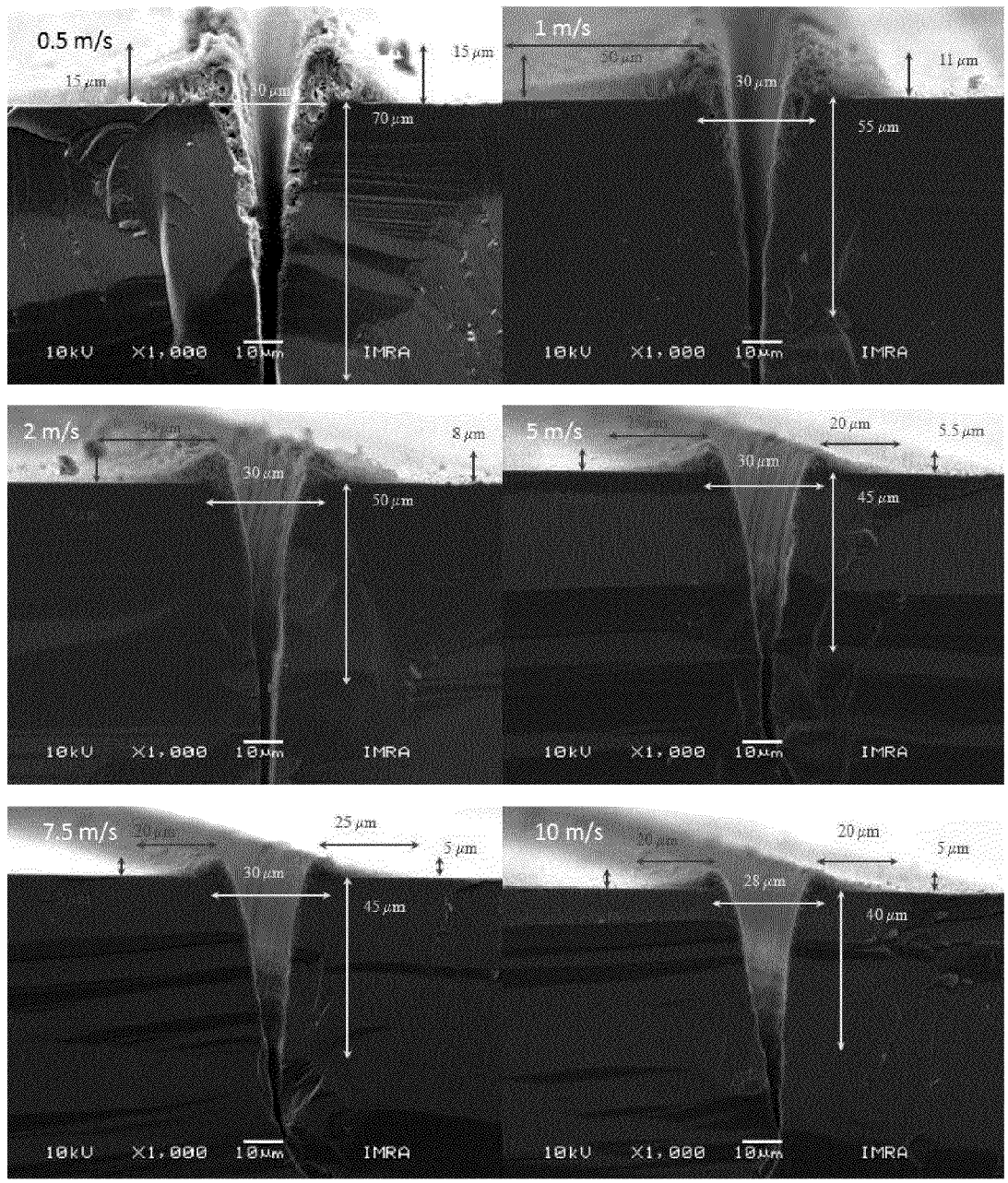
Figure 11C:
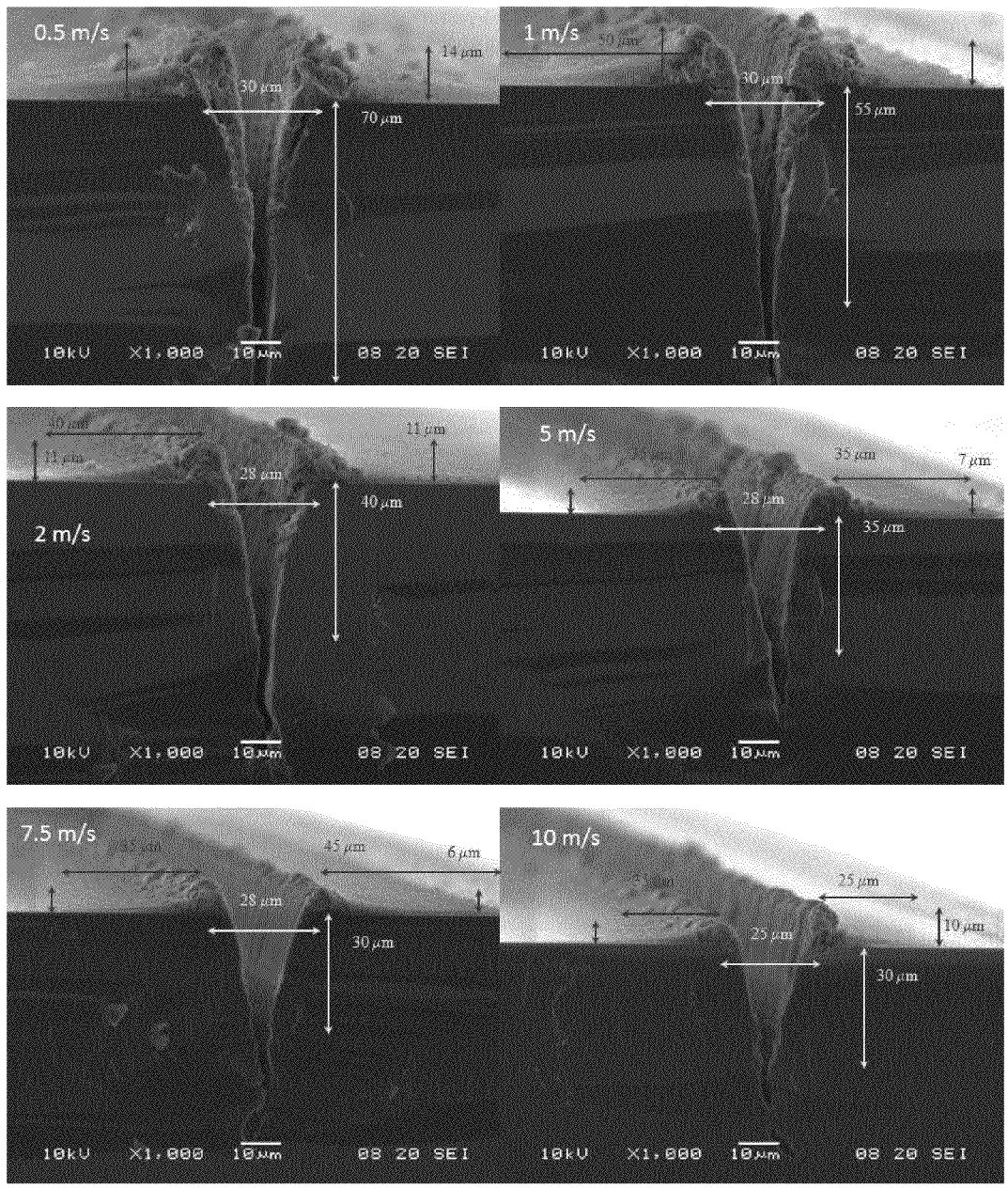
Figure 11D:
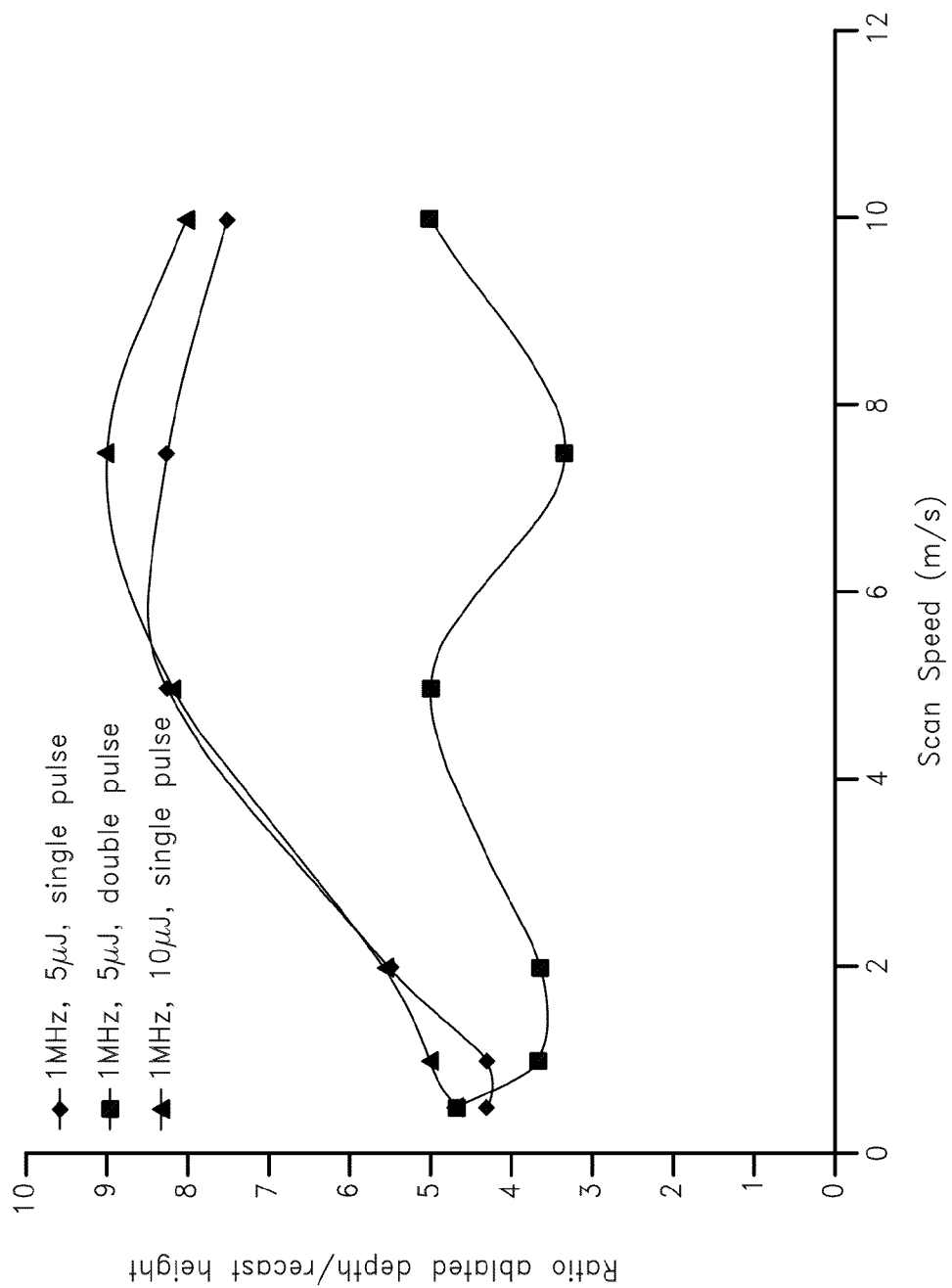
FIGS. 11D-11E are plots showing the ratio of ablated depth to recast height, corresponding to the SEM images of FIGS. 11A-11C.
Figure 11E:
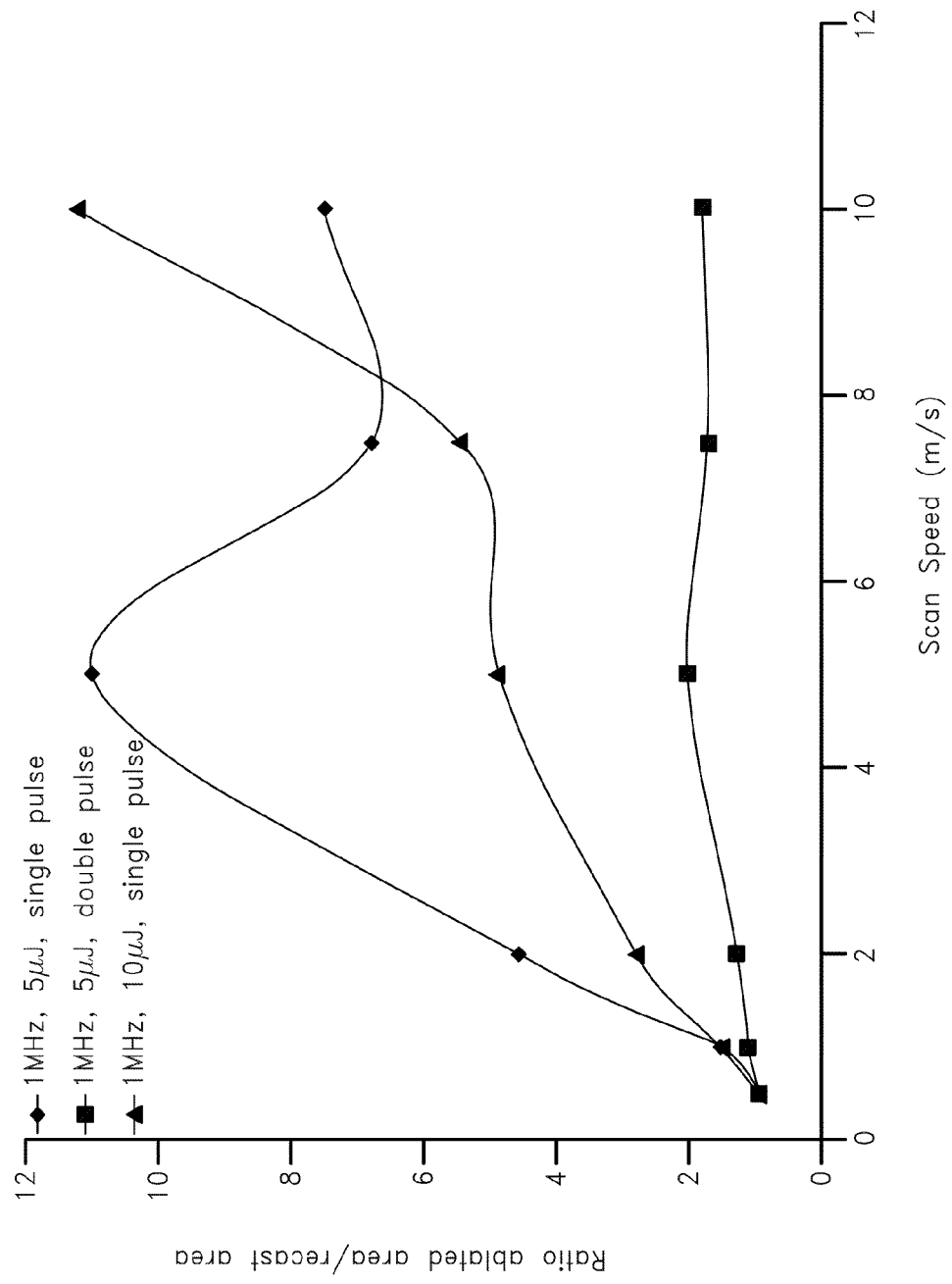

"Double pulse" experiments were also performed. In these experiments, single pulses and pairs of pulses were produced at a repetition rate of about 1 Mhz. The temporal spacing between pulses of each pair was about 20 ns, corresponding to an instantaneous burst repetition rate of about 50 MHz. FIGS. 11A-11C show example SEM cross-sections comparing results of single and double pulse processing. FIGS. 11D-11E are plots showing the ratio of ablated depth to recast height, corresponding to the SEM images of FIGS. 11A-11C. FIGS. 11A and 11B show results for experiments with "single pulses" produced a repetition rate of about 1 MHz. The pulse energy was about 5 µJ in FIG. 11A and about 10 µJ in FIG. 10B. FIG. 11C shows results for experiments with "double pulses" produced at a repetition rate of about 1 MHz and an instantaneous burst repetition rate of about 50 MHz. The scan speed was varied in a range from about 0.5 m/s to about 10 m/s in the experiments shown in FIGS. 11A-11C. In all the experiments, 200 machining passes were used. A comparison of the images in FIGS. 11A, 11B to the images in FIG. 11C indicates decreased performance of the double pulses compared to single pulses. The plots in FIGS. 11D and 11E also demonstrate decreased performance of the double pulse experiments. These results may suggest that very high instantaneous repetition rates, for example greater than about 10 MHz may limit machining performance in silicon for these laser system parameters (particularly at moderate to high scan speeds). The results are further summarized in the tables below.

Tables Corresponding to Results Shown in FIGS. 10A-1, 10A-2, and 10B

| 500 kHz, 10 uJ, before cleaning | | | | 500 kHz, 10 uJ, after cleaning | | | |
|---|---|---|---|---|---|---|---|
| speed (m/s) | ablation depth (um) | recast height (um) | ratio | speed (m/s) | ablation depth (um) | recast height (um) | ratio |
| 0.5 | 80 | 7 | 11.42857 | 0.5 | 80 | 3 | 26.66667 |
| 1 | 60 | 5 | 12 | 1 | 60 | 2 | 30 |
| 2 | 60 | 4 | 15 | 2 | 60 | 1 | 60 |
| 4 | 40 | 2 | 20 | 4 | 40 | 1 | 40 |
| 8 | 25 | 2 | 12.5 | 8 | 25 | 1 | 25 |

Tables Corresponding to Results Shown in FIGS. 11A-11E

| 1 MHz, 5 uJ, single pulse | | | | 1 MHz, 5 uJ, double pulse | | | |
|---|---|---|---|---|---|---|---|
| speed (m/s) | ablation depth (um) | recast height (um) | ratio | speed (m/s) | ablation depth (um) | recast height (um) | ratio |
| 0.5 | 30 | 7 | 4.285714 | 0.5 | 70 | 15 | 4.666667 |
| 1 | 30 | 7 | 4.285714 | 1 | 55 | 15 | 3.666667 |
| 2 | 33 | 6 | 5.5 | 2 | 40 | 11 | 3.636364 |
| 5 | 33 | 4 | 8.25 | 5 | 35 | 7 | 5 |
| 7.5 | 33 | 4 | 8.25 | 7.5 | 30 | 9 | 3.333333 |
| 10 | 30 | 4 | 7.5 | 10 | 30 | 6 | 5 |

| 1 MHz, 5 uJ, single pulse | | | | 1 MHz, 5 uJ, double pulse | | | |
|---|---|---|---|---|---|---|---|
| speed (m/s) | ablated area (um^2) | recast area (um^2) | ratio | speed (m/s) | ablated area (um^2) | recast area (um^2) | ratio |
| 0.5 | 210 | 225 | 0.933333 | 0.5 | 525 | 562 | 0.934164 |
| 1 | 210 | 140 | 1.5 | 1 | 412 | 375 | 1.098667 |
| 2 | 231 | 51 | 4.529412 | 2 | 280 | 220 | 1.272727 |
| 5 | 231 | 21 | 11 | 5 | 245 | 122 | 2.008197 |

Tables Corresponding to Results Shown in FIGS. 11A-11E

| 7.5 | 231 | 34 | 6.794118 | 7.5 | 210 | 122 | 1.721311 |
|---|---|---|---|---|---|---|---|
| 10 | 210 | 28 | 7.5 | 10 | 187 | 105 | 1.780952 |

1 MHz, 10 uJ, single pulse

| speed (m/s) | ablation depth (um) | recast height (um) | ratio |
|---|---|---|---|
| 0.5 | 70 | 15 | 4.666667 |
| 1 | 55 | 11 | 5 |
| 2 | 50 | 9 | 5.555556 |
| 5 | 45 | 5.5 | 8.181818 |
| 7.5 | 45 | 5 | 9 |
| 10 | 40 | 5 | 8 |

1 MHz, 10 uJ, single pulse

| speed (m/s) | ablated area (um^2) | recast area (um^2) | ratio |
|---|---|---|---|
| 0.5 | 525 | 562 | 0.934164 |
| 1 | 412 | 275 | 1.498182 |
| 2 | 375 | 135 | 2.777778 |
| 5 | 337 | 69 | 4.884058 |
| 7.5 | 337 | 62 | 5.435484 |
| 10 | 560 | 50 | 11.2 |

Example Experimental Results for Wafer Dicing and Ultrasonic Cleaning

FIGS. 12A-12B illustrates example SEM photographs of experimental results obtained for thin wafer dicing. The SEM photographs show a portion of a 10×4 mm² die cut out of a 100-μm thick silicon wafer. This size was chosen because it is a common size for microprocessor chips. The SEM photographs shown in FIGS. 12A and 12B correspond to 700 and 500 passes, respectively, at a scan speed of about 7 m/s. The laser pulse energy was set to 20 μJ in order to achieve the maximum laser penetration depth in the target wafer. The maximum laser repetition rate was 500 kHz due to the 10 W average power limit of the laser used in these experiments. The laser spot size was 30 μm at $1/e^2$. With these parameters the laser does not completely penetrate the substrate. In these example experiments, the laser trench serves as a scribe which is followed by a mechanical break (along the scribe line) to complete die singulation.

The SEM photographs in FIGS. 12A and 12B demonstrate that the edges are nearly free of cracks and show very little molten slag. Most of the particulate debris left on the surface can be easily removed, for example, in a short ultrasonic bath using a SharperTek SH80-D-2L ultrasonic cleaner applied for about 30 sec (see, e.g., the before-cleaning and after-cleaning results shown in FIG. 12B.)

Example Experiments with Longer Pulse Durations

Figures 1, 13A:
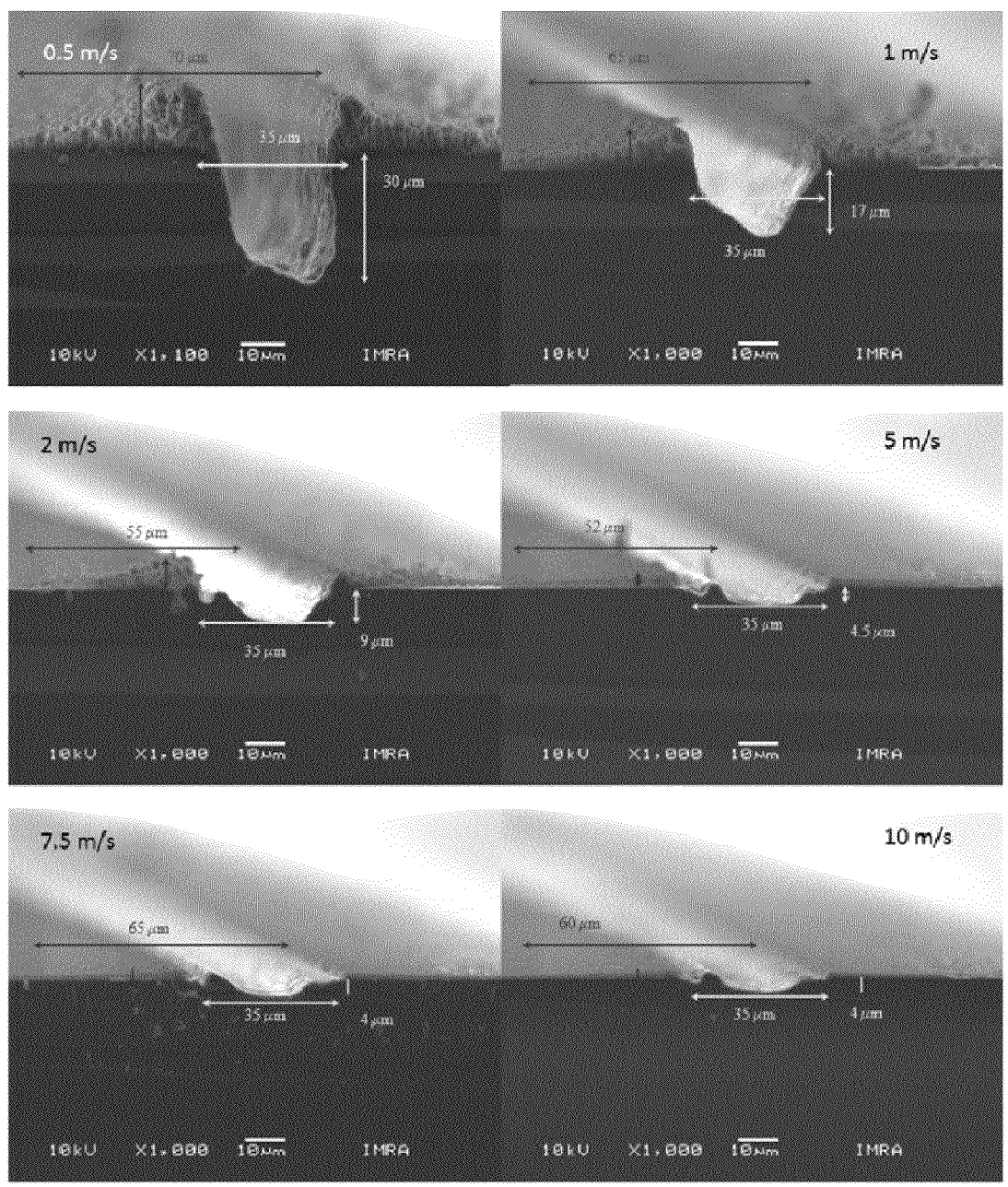
Figures 2, 13A:
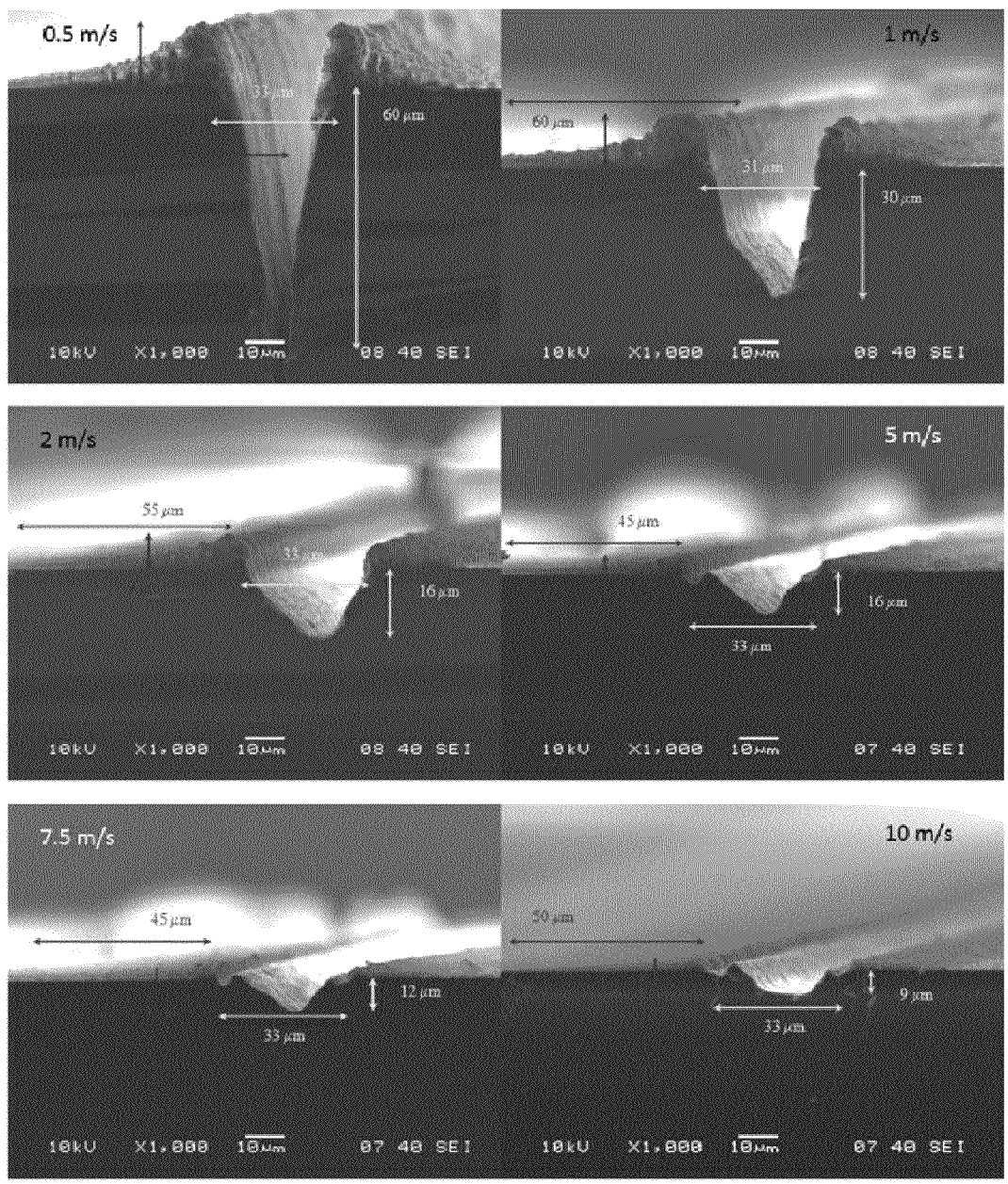
Figures 3, 13A:
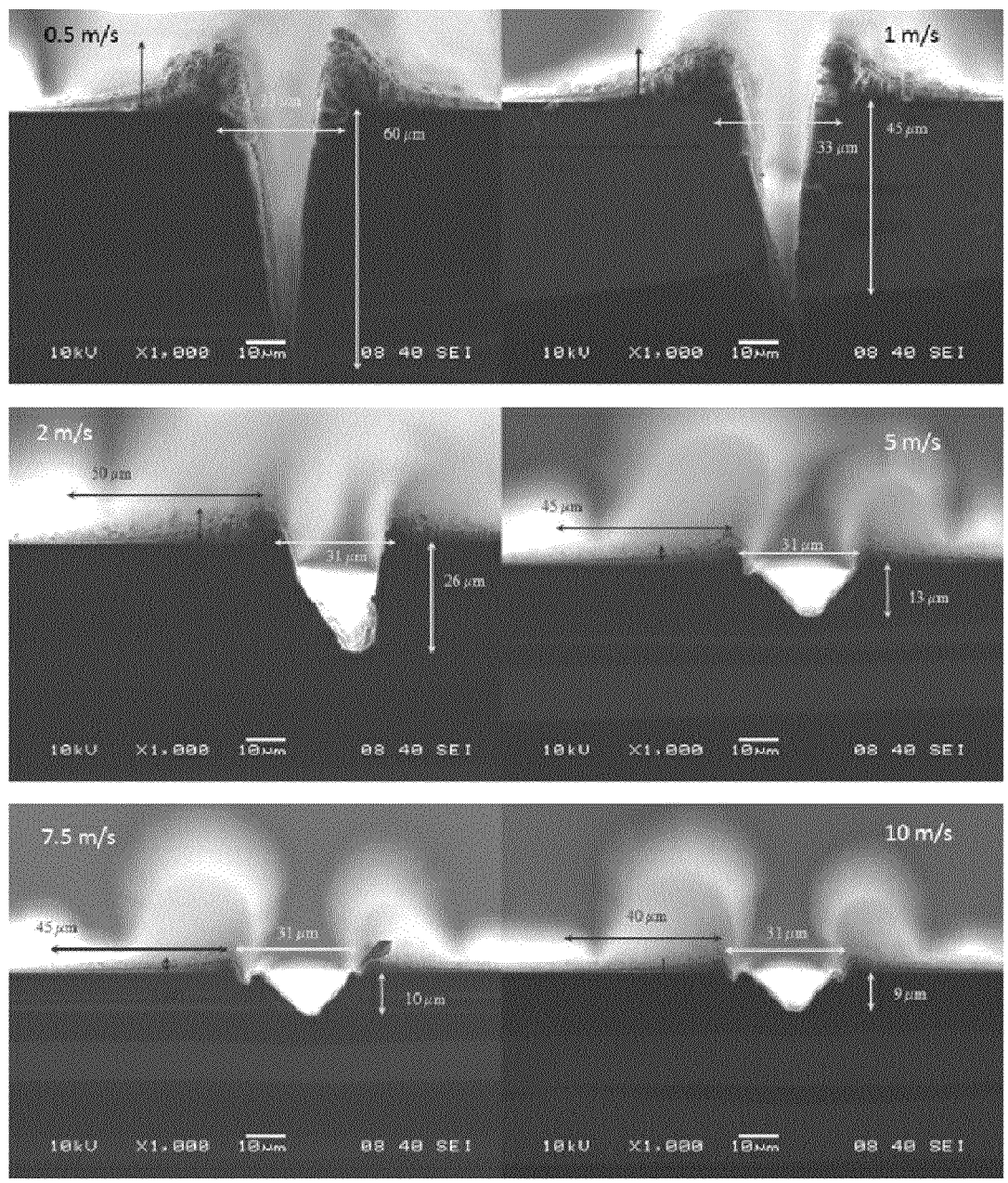

Experimental data was obtained using longer pulse widths. FIGS. 13A-1-13A-3 are SEM images showing results obtained with pulses having a pulse width of about 200 ps. Repetition rates of 200 kHz, 350 kHz, and 500 kHz were used at various scan speeds. In these experiments, the pulse compressor was detuned so as to produce pulse widths of about 200 ps and pulse energy of 20 μJ. The experimental results were also surprising. The trend of reducing a quantity of unwanted material continued in these experiments with longer pulse durations. However, in comparison to the experiments with ultrashort pulses, better feature quality, trench shape, and repeatability were obtained with ultrashort pulses.

Figures 4, 13A:
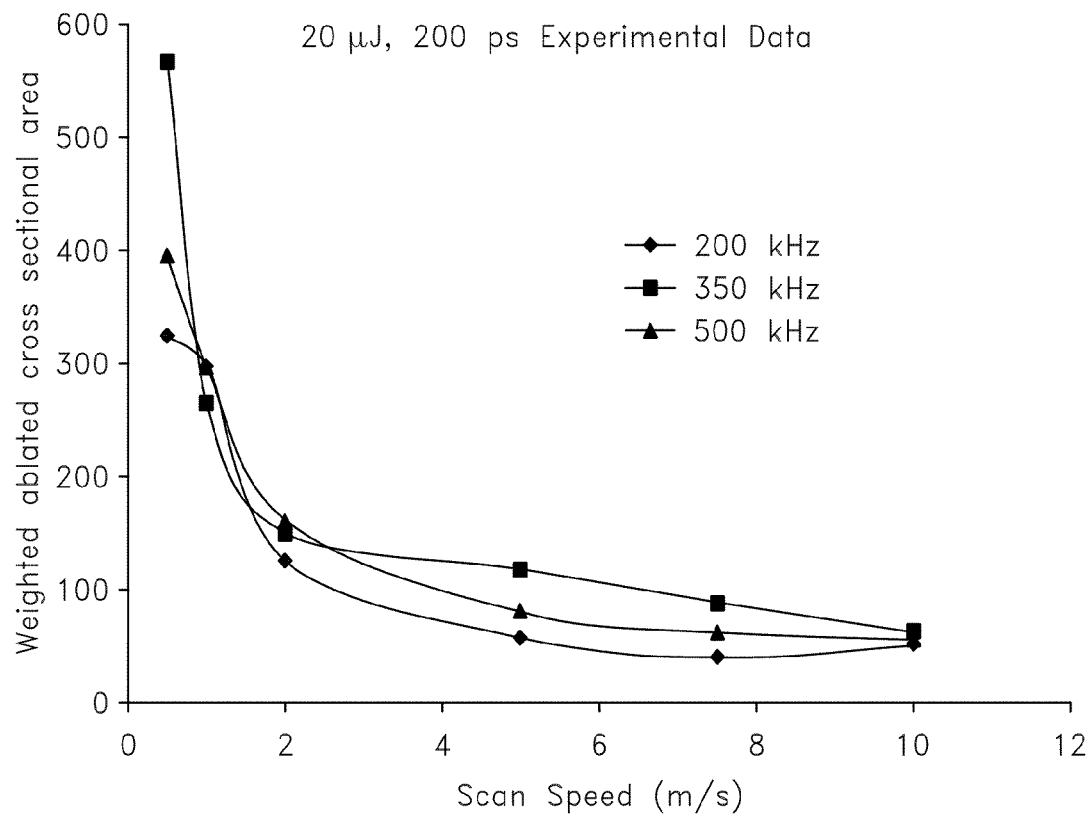
Figures 5, 13A:
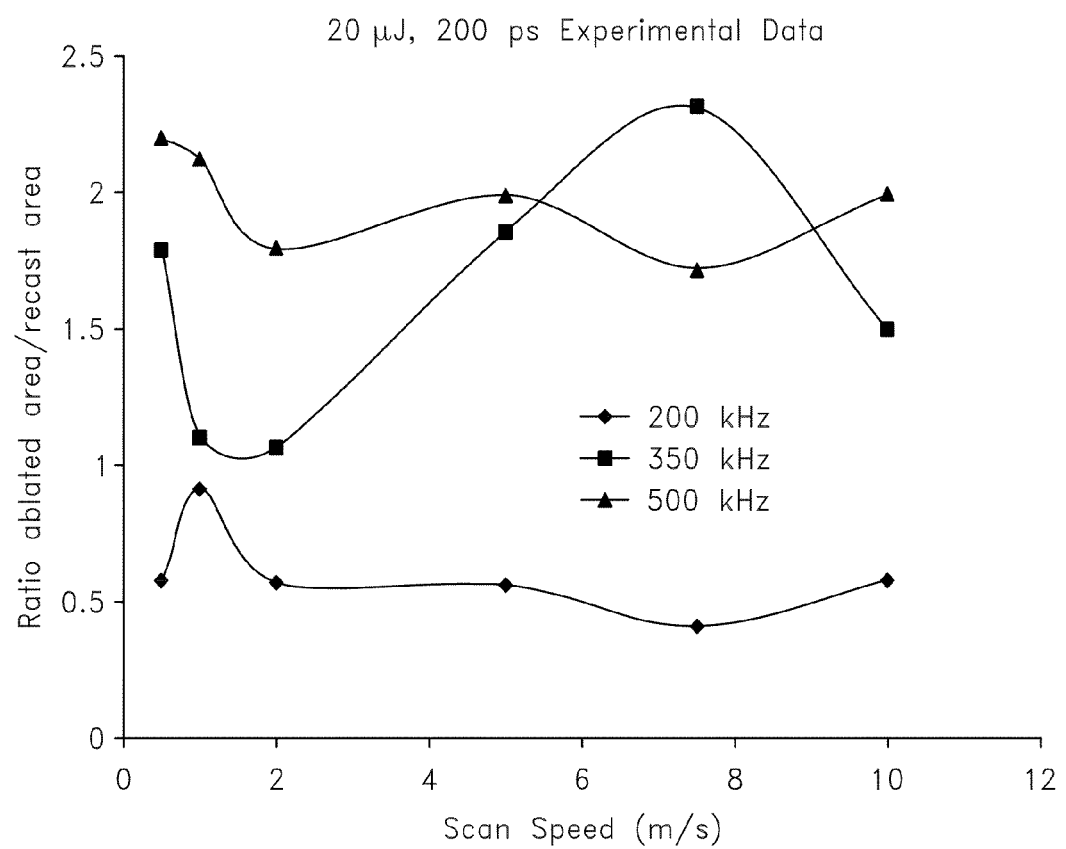

FIGS. 13A-4-13A-5 are plots corresponding to the SEM images of FIGS. 13A-1-13A-3. The measurement method for determining area was modified as disclosed above (e.g., polygons were used). The plots in FIGS. 13A-4-13A-5 suggest that predictability and repeatability of machining results may be affected at the longer pulse widths. FIG. 13A-5 is particularly interesting. The ratio of ablated area to recast area is improved at higher rep rates and can be discriminated from the 200 kHz data. In various embodiments, the ratio of ablated area to recast area may be greater than about 0.5, greater than about 1.0, greater than about 2.0, or some other value.

The experimental results of FIGS. 13A-1-13A-3 are summarized in the tables below.

Tables Corresponding to Results Shown in FIGS. 13A-1-13A-5

| 200 kHz | | | | 350 kHz | | | |
|---|---|---|---|---|---|---|---|
| speed (m/s) | ablation depth (um) | recast height (um) | ratio | speed (m/s) | ablation depth (um) | recast height (um) | ratio |
| 0.5 | 30 | 16 | 1.875 | 0.5 | 60 | 17 | 3.529412 |
| 1 | 17 | 10 | 1.7 | 1 | 30 | 14 | 2.142857 |
| 2 | 9 | 8 | 1.125 | 2 | 16 | 9 | 1.777778 |
| 5 | 4.5 | 4 | 1.125 | 5 | 16 | 5 | 3.2 |

-continued

Tables Corresponding to Results Shown in FIGS. 13A-1-13A-5

| 7.5 | 4 | 3 | 1.333333 | 7.5 | 12 | 3 | 4 |
| 10  | 4 | 3 | 1.333333 | 10  | 9  | 3 | 3 |

| 200 kHz | | | | 350 kHz | | | |
| --- | --- | --- | --- | --- | --- | --- | --- |
| speed (m/s) | ablated area (um^2) | recast area (um^2) | ratio | speed (m/s) | ablated area (um^2) | recast area (um^2) | ratio |
| 0.5 | 325  | 560 | 0.580357 | 0.5 | 990   | 552  | 1.793478 |
| 1   | 297  | 325 | 0.913846 | 1   | 465   | 420  | 1.107143 |
| 2   | 126  | 220 | 0.572727 | 2   | 264   | 247  | 1.068826 |
| 5   | 58.5 | 104 | 0.5625   | 5   | 208   | 112  | 1.857143 |
| 7.5 | 40   | 97  | 0.412371 | 7.5 | 156   | 67.5 | 2.311111 |
| 10  | 52   | 90  | 0.577778 | 10  | 112.5 | 75   | 1.5 |

| 500 kHz | | | |
| --- | --- | --- | --- |
| speed (m/s) | ablation depth (um) | recast height (um) | ratio |
| 0.5 | 60 | 18  | 3.333333 |
| 1   | 45 | 14  | 3.214286 |
| 2   | 26 | 9   | 2.888889 |
| 5   | 13 | 4.5 | 2.888889 |
| 7.5 | 10 | 4   | 2.5 |
| 10  | 9  | 3.5 | 2.571429 |

| 500 kHz | | | |
| --- | --- | --- | --- |
| speed (m/s) | ablated area (um^2) | recast area (um^2) | ratio |
| 0.5 | 990   | 450 | 2.2 |
| 1   | 742   | 350 | 2.12 |
| 2   | 403   | 225 | 1.791111 |
| 5   | 201   | 101 | 1.990099 |
| 7.5 | 155   | 90  | 1.722222 |
| 10  | 139.5 | 70  | 1.992857 |

Observations Based on the Experimental Results

The experimental results disclosed herein are a function of many co-dependent variables, e.g., scan speed, laser energy, laser power, pulse power density, spot diameter, spot overlap, pulse width, repetition rate, instantaneous burst repetition rate, fluence, number of machining passes, and so forth.

The experimental results demonstrate a surprising influence of increasing laser repetition rates from at least several hundred kHz to about 1 MHz on reducing the amount of redeposited material. Further reduction of redeposited material may occur at repetition rates up to about 5 MHz, and possibly up to about 10 MHz. However, the improved combination of processing efficiency and quality may degrade at very high repetition rates (e.g., greater than about 10 MHz or about 20 MHz), and the corresponding average laser power would be very high. Therefore, in various laser processing applications, both the upper and lower bounds of the range of repetition rate may be critical to avoid degraded performance. Further, at the upper bound, below about 10 MHz, the processing may also avoid undesirable heat accumulation effects, in addition to reduced accumulation of redeposited material Similar results may be obtainable for at least other semiconductor materials including, for example, GaAs. Similarly, benefits may be obtained for workpieces other than semiconductor substrates. Laser parameters may be further adjusted, for example wavelength, although it is generally known that the ablation threshold at certain ultrashort pulse widths, for example in a range from about 50 fs to about 1 ps, is less wavelength dependent than at longer pulse widths, for example 10 ps to 1 ns pulse widths.

In accordance with various embodiments, laser-based processing may be carried out with a fluence above an ablation threshold of the material to about 20-times the ablation threshold. For example, in some embodiments, a preferred range for fluence may be about 5 to about 15 times the ablation threshold.

Embodiments of silicon machining may be carried out with about 1-30 μJ of pulse energy, and typically 5-25 μJ for efficient and high quality processing. Repetition rates are advantageously above several hundred kHz, for example greater than 500 kHz. A beneficial range may be about 500 kHz to about 5 MHz, and may be in a range of 1 MHz to about 10 MHz.

Scan rates are somewhat dependent on spot size in certain embodiments. Spot sizes may be in the range from about 10 μm to about 100 μm and scan speeds may be in a range from about 0.2 m/s to 20 m/s.

As described above, a high ratio of ablated volume to redeposited volume may be obtained with various embodiments. The quality of the processing may be obtained without substantially sacrificing processing efficiency.

Example Experimental Results—Die Strength

In addition to reduced debris, a significant improvement in die strength relative to UV nanosecond lasers may result with the use of ultrashort pulses in some implementations of the disclosed systems and methods. Experimental results obtained with bare 50 µm thick wafers suggested such an improvement with appropriate pulse parameters.

FIGS. 14, 14A-1, and 14A-2 schematically illustrate some arrangements for die strength measurement. FIG. 14, is adapted in part from Li et al, "Laser dicing and subsequent die strength enhancement technologies for ultra-thin wafer", Electronic Components and Technology Conference, IEEE, (2007), pp 761-766. The stress (MPa) may be estimated as follows:

$$\sigma(stress) = 3FL/2bh^2$$

where F (Newtons) is the breaking load, L (mm) is the span length, b is sample width (mm) and h is the sample thickness (mm).

FIG. 14A-1 corresponds to a side view of a sample arranged in tension where the sample is supported with the laser cut direction (depicted with arrow) facing one point of the 3 point mount. The opposite arrangement of FIG. 14A-2 corresponds to a sample arranged in compression. The latter apparently corresponds with "active layer upwards" measurement configuration as shown in FIG. 3 of Li et. al., FIG. 3, and discussed in the corresponding text.

Experimental Results—Die Strength of 50 µm Bare Wafers

The table below shows laser pulse parameters varied during ten wafer cutting experiments. The "double pulse" experiments correspond to two pulses having a 20 ns spacing, with the pulse pairs being repeated at the 500 KHz repetition rate. The 700 fs pulse width and 500 KHz repetition rate were constant.

Experiments 2-4 show that for complete cuts, the maximum flexure stress significantly decreases, from 781 to 252 MPa, with reduction in scan speed, from 5 to 0.1 m/s.

Experiments 5 and 6 show that 5 µJ is insufficient pulse energy for a reasonable processing rate, in some implementations, with a spot size of about 40 µm ($1/e^2$). A complete cut required at least 3000 passes, with either single or double pulses. However, experiments in the following section will show 5 µJ is sufficient to cut 50 µm silicon samples with a reduced spot size of about 20 µm, corresponding to a 4-fold increase in fluence.

Experiments 7-9 demonstrate that the use of a double-pulse burst at 500 kHz (using two 10 µJ pulses separated by 20 ns) results in weaker die strength than for a single 10 µJ pulse at 500 kHz.

Observations Based on Experimental Results

The experimental results with 50 µm samples suggest at least some improvements in both die break strength and significant reduction in debris generation relative to conventional nanosecond laser dicing by appropriately using a high repetition rate ultrashort pulse laser system to dice 50-µm thick silicon wafers. The experiments suggest a 2-3 fold improvement, or perhaps larger, in die strength may be obtainable relative to reported UV DPSS results.

The experimental results demonstrate that the best die strength results were achieved (in these experiments) using a beam scanning system which rasters the beam at high speed (>1 m/s) a sufficient number of times to achieve a complete cut.

| No U | Maximum Flexure Load N | Std Dev | Flexure stress at Maximum Load Mpa | Std Dev | Flexure extension at Maximum Flexure Load (nm) | Std Dev | Average power W | Pulse duration fs | Pulse energy µJ | Rep rate kHz | Scan Speed m/s | Pass number | Single/Double | note |
|---|---|---|---|---|---|---|---|---|---|---|---|---|---|---|
| 1 | 0.83 | 0.29 | 1491.7 | 516.3 | 1.81 | 0.69 | 5 | 700 | 10 | 500 | 7.5 | 200 | Single | Partial cut |
| 2 | 0.43 | 0.04 | 781.3 | 78.4 | 0.79 | 0.10 | 5 | 700 | 10 | 500 | 5 | 750 | Single | Complete cut |
| 3 | 0.28 | 0.06 | 495.8 | 114.7 | 0.74 | 0.21 | 5 | 700 | 10 | 500 | 0.5 | 100 | Single | Complete cut |
| 4 | 0.14 | 0.03 | 252.7 | 60.3 | 0.2 | 0.16 | 5 | 700 | 10 | 500 | 0.1 | 14 | Single | Complete cut |
| 5 | 0.56 | 0.20 | 1016.0 | 367.1 | 1.23 | 0.51 | 2.5 | 700 | 5 | 500 | 5 | 3000 | Single | Partial cut |
| 6 | 0.38 | 0.07 | 690.7 | 118.1 | 1.35 | 0.18 | 5 | 700 | 5 | 500 | 5 | 3000 | Double | Complete cut |
| 7 | 0.28 | 0.04 | 507.7 | 78.2 | 1.036 | 0.18 | 5 | 700 | 10 | 500 | 5 | 700 | Single | Complete cut |
| 8 | 0.34 | 0.06 | 617.1 | 104.8 | 1.284 | 0.27 | 5 | 700 | 10 | 500 | 5 | 1000 | Single | Complete cut |
| 9 | 0.22 | 0.04 | 390.2 | 71.5 | 0.767 | 0.22 | 10 | 700 | 10 | 500 | 5 | 500 | Double | Complete cut |

Figure 14B:
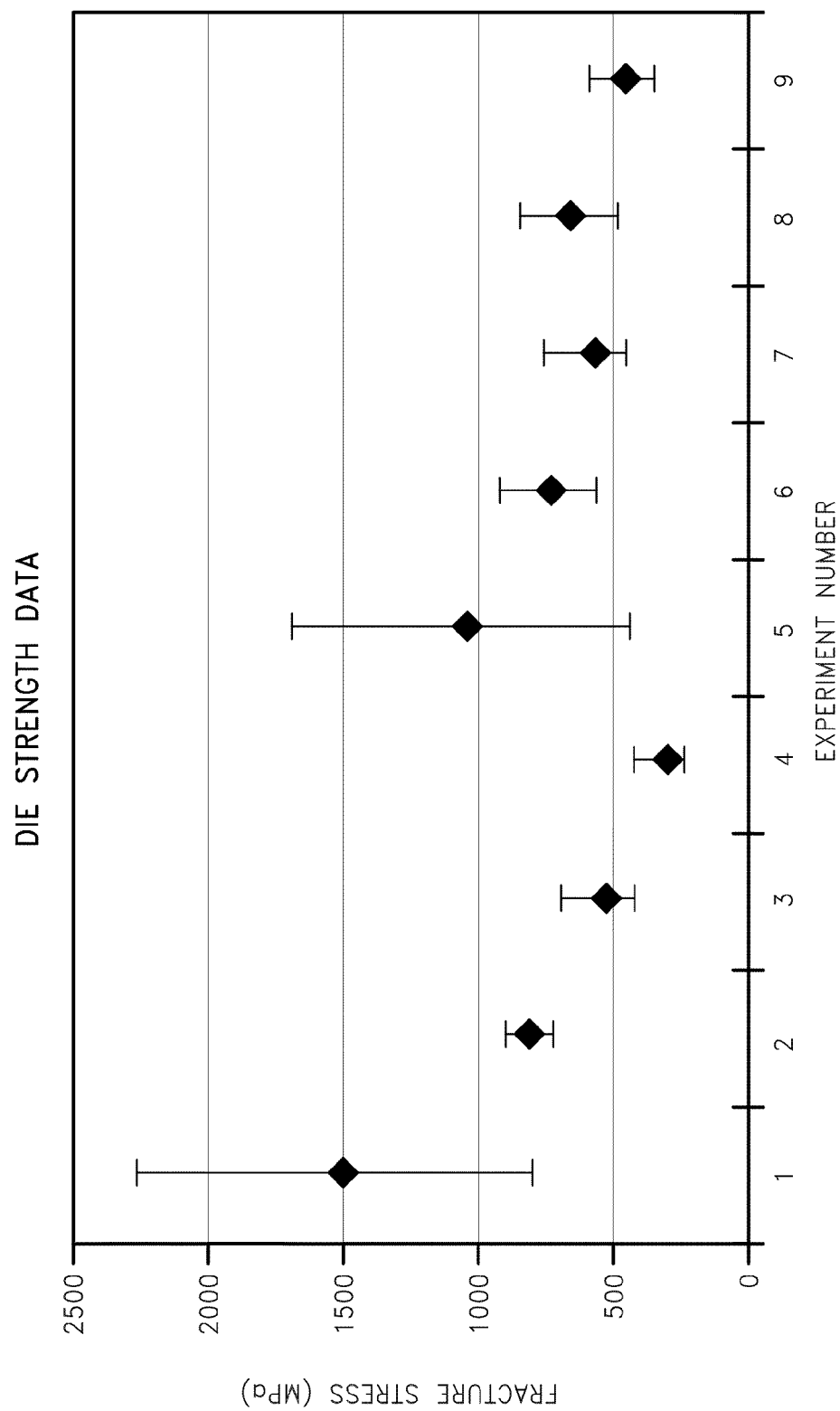
FIGS. 14B and 14C are plots illustrating examples of die strength measurements obtained after processing samples with ultrashort pulses from the example experimental system illustrated in FIGS. 6A and 6B.

FIG. 14B is a plot illustrating the results of the die strength measurements (summarized in the above table), all performed in compression as shown in FIG. 14A-2. In the above table, the first column is experiment number, the second column is maximum flexure load (in N), the third column is standard deviation of the maximum flexure load, the fourth column is flexure stress at maximum load (in MPa), the fifth column is standard deviation of the flexure stress at maximum load, the sixth column is flexure extension at maximum flexure load (in nm), the seventh column is standard deviation of the flexure extension at maximum flexure load, the eighth column is average laser power (in W), the ninth column is pulse duration (in fs), the tenth column is pulse energy (in µJ), the eleventh column is pulse rate (in kHz), the twelfth column is scan speed (in m/s), the thirteen column is number of passes, the fourteenth column indicates whether single or double pulses were used, and the fifteenth column provides notes on whether complete or partial cuts were made.

Experiments 1 and 5 demonstrate that the statistical distribution is relatively large for the case of partial (incomplete) laser cuts.

The experimental results indicate the cut quality and die strength both degrade with significantly fewer passes and slower scan speeds for this experimental setup. Incomplete cuts are generally undesirable.

Also, to achieve practical processing speeds at the laser spot size relatively high pulse energy is needed. For example, with a 40 µm spot size ($1/e^2$) pulse energy of at least about 5 µJ was applied to the Si samples. Wafer processing may generally be carried out with spot sizes in the range of about 15-40 µm, and may preferably be in the range of about 30-40 µm. A minimum fluence may be about 1 J/cm². Energy of 5 µJ over a 40 µm spot size corresponds to about 0.4 J/cm², and corresponds to a minimum fluence in the above table. Other spot sizes, energies, and fluences may be used in other embodiments.

The highest die break strength is typically achieved using mechanical dicing blades. However, the processing speed reduces significantly in proportion to the wafer thickness.

It is instructive to compare the results with published data regarding die strength. Example comparisons of die strength measurements obtained with a DPSS UV laser and mechanical saw are available in: (a) in Toftness et al., "Laser technology for wafer dicing and microvia drilling for next generation wafers", Proc. SPIE Vol. 5713, pp 54-66 (2005), and (b) Li et al, "Laser dicing and subsequent die strength enhancement technologies for ultra-thin wafer", Electronic Components and Technology Conference, IEEE, (2007), pp 761-766.

In Toftness et al, Section 3, "Thin Wafer Dicing" various aspects of the two approaches are discussed. Wafers with 75, 80, or 180 µm thicknesses were tested according to SEMI standard G86-0303. Specifically, for 75 micron and 3 point die strength comparison, 444 MPa and 280 MPa data were obtained for saw and laser data respectively. The range of values for the saw was quite wide compared to the laser distribution.

Li et al, pp 761-763, provides comparisons between blade and laser dicing die strength of 50 µm samples. Results were reported for 3 point measurements obtained in both compression and tension. The results suggest little difference for blade results in compression or tension. However, as shown in FIG. 3 of Li et al., pulsed laser processing with 355 nm UV produced very different results. In compression ("active layer upwards"), roughly 450 MPa was measured, roughly twice the strength obtained in tension. The blade results were in the range of 600-700 MPa, exceeding the laser results in all cases. Therefore, the results indicate that processing with UV DPSS systems yielded die strength values roughly 50% of typical results obtained with mechanical cutting.

Figure 14C:
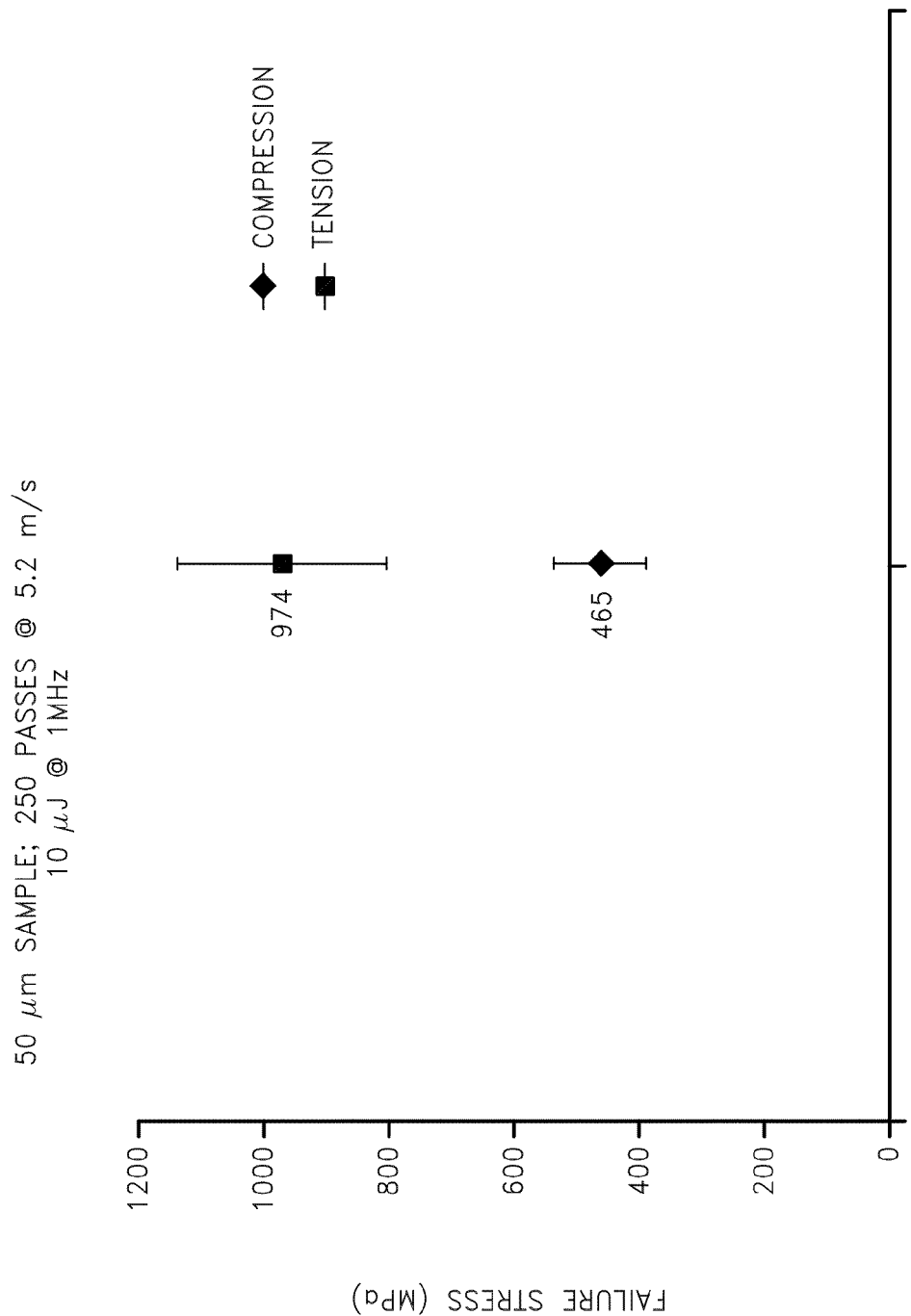

Referring to FIG. 14C, which shows failure stress for compression and tension experiments, it appears the compression arrangement has been found to be less favorable for ultrashort processing (at least in terms of failure stress). This result further supports the fact that ultrashort pulse laser dicing leads to a different failure mechanism than UV nanosecond laser due to significantly different nature of the processing.

Therefore, at least some results suggest that a worst case ultrashort measurement configuration (e.g., compression) provides an improvement with respect to a best case configuration for DPSS systems.

Ultrashort processing at sufficiently fast rates may produce die strength results comparable to, or perhaps slightly less, than obtainable with mechanical cutting. In some cases, processing is carried out with at least 500 kHz rep rates, spot sizes in the range of about 20-40 µm, and pulse energies at least about 5 µJ.

Such ultrashort processing may produce die strength in a range of about 400 MPa to at least 700 MPa, and in some cases larger values, for example up to about 900 MPa or greater than 1000 MPa.

The above results indicate die strength may be improved with ultrashort processing. However, it is known that die strength may be affected by several factors. Also, some information suggests die strength is of less overall importance for some embodiments of a laser-based process than debris reduction, particularly for processing patterned wafers.

Moreover, it is expected that die strength could be improved with ultrashort processing at lower pulse energies than 5-20 µJ with a 40 µm spot size. However, because high throughput may be advantageous in some implementations, such an approach is generally regarded as deficient for some such implementations. One possible wafer processing system beneficially may simultaneously provide for adequate die strength, low debris, and high throughput.

Moreover, as will be shown in the following experiments, low pulse energy, in some cases, may produce other detrimental effects when cutting patterned wafers.

Example Experimental Results—Patterned Wafer Scribing/Cutting

Referring back to FIG. 1G-2, a top view of a patterned wafer is schematically illustrated with multiple materials and patterns overlapping a laser processing path 127-b within street 127. The material and patterns may be disposed to provide for electrical testing or other functions. Numerous combinations of materials may be present having different thermal, optical, electrical, or mechanical properties.

For example, as generally illustrated in the example of FIG. 1G-2, a microprocessor architecture may be complex and comprise various patterns and materials. Layers of metal, low-k dielectric patterns, functional circuitry formed on a fine grid, may all be supported on a silicon substrate and covered with an overlying passivation layer (not shown).

As earlier noted, materials may include, but are not limited to, metals, inorganic dielectrics, organic dielectrics, semiconductor materials, low-k dielectric materials, or combinations thereof. The combinations of materials may be arranged in different spatial patterns and stacked in depth. For example, microelectronic circuits may comprise portions having alternating layers of copper and low-k material, covered by the overlying passivation layer. Many possibilities exist for semiconductor architectures.

The experimental results below will demonstrate scribing through active material layers disposed within the streets without generating significant material debris. Although it is difficult to directly measure the extent of a heat affected zone (HAZ), a general objective is to cleanly remove multiple materials, with negligible melting, and with no significant change to layer morphology.

Parameters used for cutting of bare silicon wafers in the above examples provide at least a useful starting point for patterned wafer scribing/cutting. The example parameters used in the following experiments may provide good scribing performance of some patterned wafers. Other parameters may be used.

Example Experimental Results with Patterned Wafers/Multi-Material Devices

The following types of patterned wafers were studied:
Experiment 1: GaN on copper (LED device)
Experiment 2: a patterned microelectronic circuit,
Experiment 3: a microprocessor device, and
Experiment 4: a flash memory device.

Experiment 1

Figure 15B:
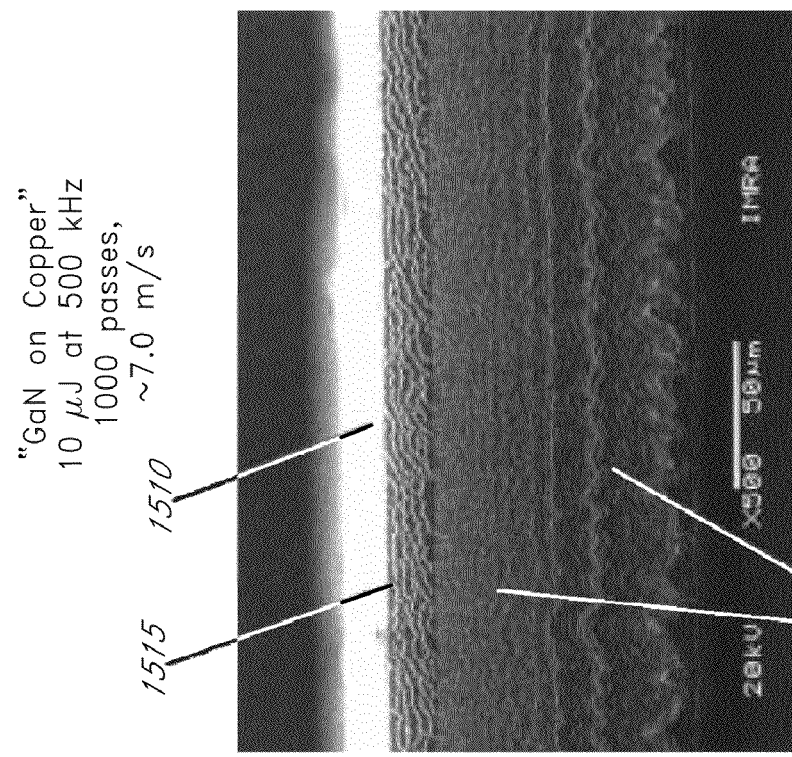
FIGS. 15A-15D show examples of SEM images, and cross sections of samples scribed and/or cut with ultrashort pulses generated with the example experimental system of FIGS. 6A and 6B.
Figure 15A:
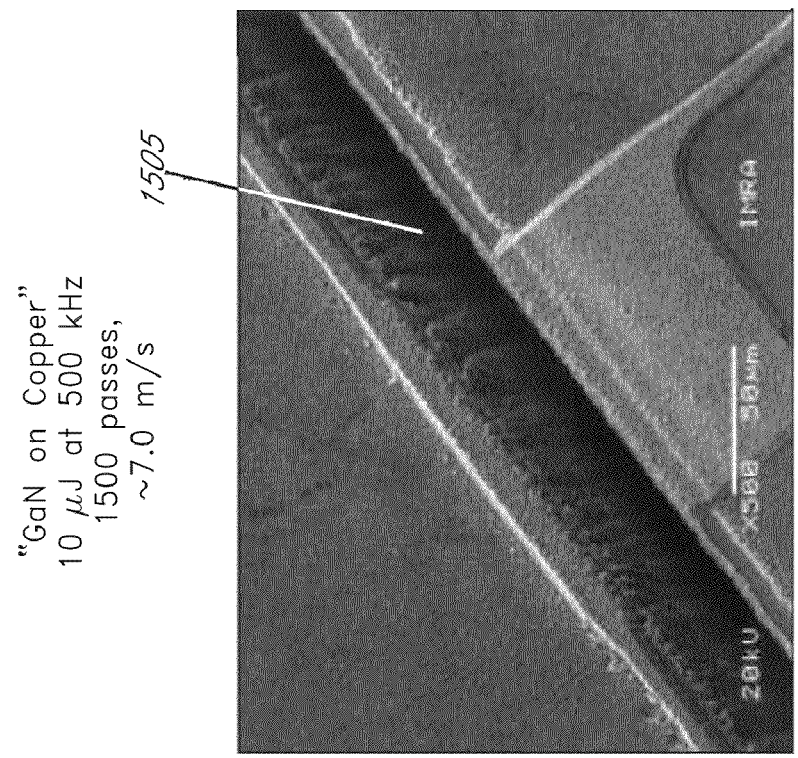

A particularly encouraging result was obtained with processing of GaN on Copper. The result was obtained with parameters that may be well suited for cutting several bare wafers: 10 µJ, 500 kHz, approximately 7 m/sec, with about 1000-1500 passes, and a spot size of about 30-40 µm ($1/e^2$ diameter). FIG. 15A is an SEM image showing a high quality cut 1505 with little or no debris. FIG. 15B is a side view of the cut. Various materials are discernible in the image, including overlying material 1510, GaN material 1515, and inner layer(s) 1520. No attempts were made to clean the sample after laser processing.

Experiment 2

Figure 15D:
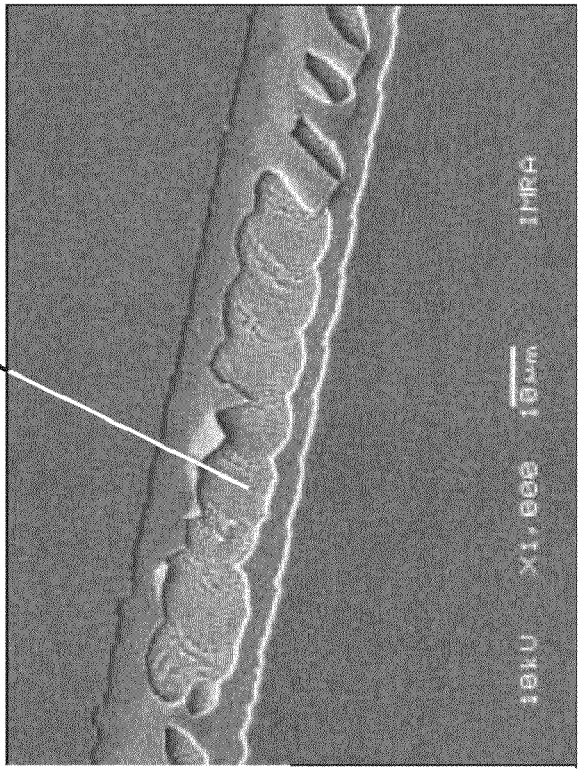
Figure 15C:
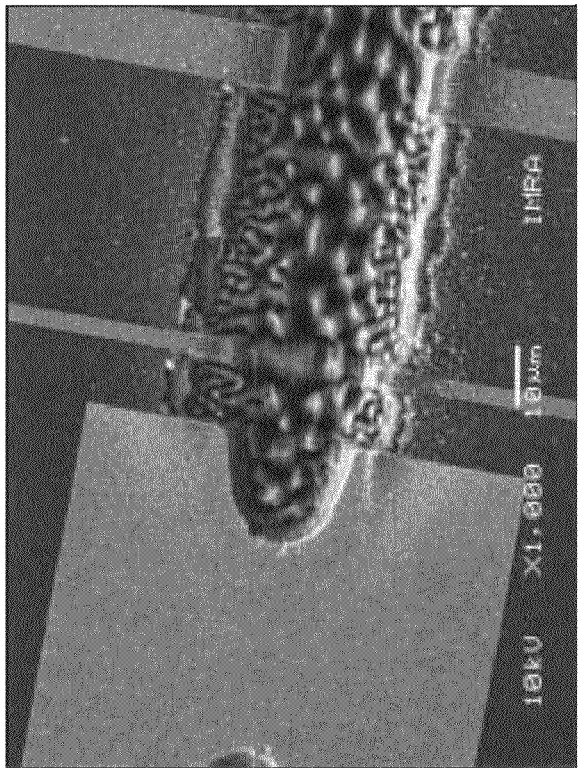

A microelectronic circuit having an overlying passivation layer, multiple alternating layers of copper and low-k dielectric, and a silicon substrate was laser scribed. Processing was first carried out with 100 passes, about 7 msec scan speed, 10 µJ pulse energy, and 500 kHz. FIGS. 15C and 15D are SEM images schematically illustrating incomplete cuts of a copper pad and some low-k delamination, respectively. The laser parameters resulted in removal of the passivation layer, but only partial removal of the copper layer. The region of the cut also shows noticeable surface texturing. The low-k dielectric removal was incomplete with evidence of delamination and cracking 1530. In some cases, a reduction in scan speed, and a corresponding increase in spatial overlap of the pulses, may improve copper removal.

Experiment 3A

A microprocessor device was processed with 10 µJ pulse energy and 500 kHz repetition rate. The number of passes were 200, 100, and 50 at respective scan speeds of approximately 7.0, 5.0, and 2.0 msec. Several SEM images (not shown) displayed variations in cut quality with scan speed and number of scans. The particular number of passes was chosen to completely cut through passivation, metal, and dielectric layers, down to the underlying silicon substrate. The number of passes was approximately inversely proportional to the scan speed.

As previously observed, the least debris and HAZ were generated for the highest scan speed. This was particularly evident from the differences in cut width between a top layer and a buried grid layer within or near the laser path 127-*b* of street 127, as schematically illustrated in FIG. 1G-2. By way of example, a grid layer 129 is schematically illustrated in FIG. 1G-2 and FIG. 1G-3, and in this is experiment was in the laser path as shown. A scribing experiment resulted in the area of an exposed buried grid layer at the edge of a scribe being considerably larger for the case of 50 passes with scan speed about 2.0 m/s vs. 200 passes at approximately 7.0 m/s.

Therefore, in contrast to the results of Experiment 2 above, this example demonstrated typical parameters for bare wafer processing may also be suitable for processing a patterned wafer in some cases.

Experiment 3B

Another experiment was carried out with the laser parameters of Experiment 3A, but with 200 passes at about 7 msec. In this experiment delamination between the dielectric and metal layers was observed in certain regions within the "streets". Such delamination can be a significant problem in some applications, because the induced cracks can propagate through the device after die singulation and ultimately may even cause device failure. Steps to reduce delamination are discussed in experiment 3C below.

Experiment 3C

Further experiments showed delamination/cracking between the low-k dielectric and metal layers is affected by variation in scan speed in the experimental system. Laser processing was carried out with 5 µJ pulse energy at 500 kHz repetition rate. Only single passes were used for testing. Reducing the scan speed from a maximum of 10.0 m/s to 250 mm/s reduced the delamination/cracking.

The effect of pulse energy was also studied, particularly for single scan passes at 250 mm/s. A minimum of 2 µJ was necessary to ablate metal and non-metal areas of this sample in these experiments. However, 2 µJ energy caused more delamination/cracking than observed for 5 µJ and 10 µJ under the same scan conditions. Moreover, the 5 and 10 µJ results for a single pass at 250 mm/s were compared. No apparent or significant difference in delamination/cracking was found. The higher pulse energy was beneficial in the example by providing for a complete cut through the thickest metal regions, thereby providing the highest throughput.

Increased magnification was used to evaluate scribes formed in areas having thick metal pads. The areas were scribed using 10 µJ pulses at 500 kHz repetition rate. It was confirmed that a single pass at 250 mm/s was sufficient to completely cut through the passivation, metal, and dielectric layers, and to the base silicon substrate of this sample. In this example, with 500 KHz repetition rate, 40 µm spot size, and 250 mm/sec scan speed, spot overlap is about 99%. The results showed negligible HAZ and minimal debris redeposition.

Moreover, the passivation layer for this sample was polyimide, a thermally sensitive polymer. Although observations indicated the passivation layer receded from the scribe region, no evidence of charring was found. Such charring is a common detrimental result associated with thermal laser processing effects.

A surprising result of these experiments was the dependence of delamination on both pulse energy and scan speed. A 2.5-fold increase in pulse energy improved the result, and a reasonable operating range was found at higher pulse energies up to at least 10 µJ. The minimum fluence with approximately 5 µJ over a 40 µm spot was about 0.4 J/cm$^2$, with such a spot size providing for high throughput.

Experiment 3D

In the previous experimental results described in Experiments 1-3C, the focal spot diameter was 35-40 µm (1/e$^2$ diameter). In order to facilitate experiments at 1 MHz, the spot diameter was reduced to 20 µm. As such, 5 µJ over the 20 µm spot (e.g.: a fluence of 1.6 J/cm$^2$) was sufficiently high to completely scribe through active layers in the streets of the microprocessor sample.

The increase in repetition rate to 1 MHz also allows a linear increase in scribing speed for this example. Delamination between the dielectric and metal layers was avoided with an optimal speed between about 400-500 mm/s in this example. This was also a sufficiently fast scan speed to avoid possible problems with heat accumulation. By way of example, with typical energy of about 5 µJ per pulse and a 500 KHz to 1 MHz pulse rate, speed of about 0.2 msec to 1 msec may be suitable for clean removal of low-k dielectrics. At 1 MHz, and with speed of 0.5 msec and spot size of 20 µm, the approximate pulse overlap was about 98%.

In this experiment, the reduction of the spot diameter and the incident pulse energy also reduced the cut width in both the active and passivation layers. Furthermore, the difference in cut width between the active and passivation layers allowed for steeper side walls within the cut.

Experiment 4

A flash memory device was processed. Such devices are also formed with multiple materials in the streets, in some cases a fine grid. The structure included a thin silicon substrate (typically 50-75 µm thick) with metal and dielectric layers coated by a passivation layer.

Conventional mechanical dicing results exhibited obvious edge chipping, and some delamination of the dielectric layers.

Ultrashort pulses were used to cut through the full 50-µm wafer thickness. Similar to Experiments 1 and 2, but unlike Experiment 3, one possible preferred dicing method is to use many passes (e.g., 550 in this case) at a relatively high translation speed (e.g., approximately 7.0 m/s). A fewer number of passes (e.g., less than 550) could be used to cut the entire wafer. The spot diameter was 20 μm as in Experiment 3D. However the pulse energy was 10 μJ and the repetition rate was 500 kHz as in Experiments 1-3C.

This experiment indicates that efficient cutting of full wafer thickness was demonstrated while limiting, if not minimizing, debris redeposition and HAZ. Delamination problems were not found in the experiment, which may at least in part be a result of the specific device construction. It should be noted that no post-processing was used to clean the sample after laser cutting.

Mechanical cutting typically uses a large amount of water to clean/cool the blade during cutting. It is likely that the majority of the laser dicing debris can be removed by standard wafer spin rinse/dry systems without the need for special protective coating.

This flash memory application requires a complete cut through the wafer, and one concern is laser induced damage to the dicing tape. In conventional nanosecond laser cutting, the optical/thermal penetration of the laser into the tape is generally quite deep which can significantly reduce the tape strength and complicate subsequent "pick and place" of the die after singulation. In the case of nanosecond UV laser dicing, there has been a large effort in the industry to develop specialized laser dicing tape which limits the depth of laser penetration into the tape. With ultrashort pulse laser machining, it is possible to choose parameters such as, e.g., the number of laser passes so as to completely cut through the substrate but not substantially damage the tape. The precise nature of ultrashort laser ablation reduces or eliminates the need for specialized tape, so that standard mechanical dicing tape can still be used.

Observations Based on the Example Experimental Results

It may be desirable for laser parameters and scan speeds to be modified in order to achieve best scribing results.

Relatively high repetition rates, for example in the range of 500 kHz to about 1 MHz, resulted in low debris, as observed with bare wafer experiments. Generally, sufficiently high repetition rates will avoid accumulation of debris. However, an increase in repetition rates to values above several MHz, (for examples tens of MHz or higher) may increase thermal effects and HAZ induced material modification in some cases. It may be advantageous for some scribing/dicing implementations for the scan speed and laser spot size to be sufficiently large to provide acceptable throughput.

Because of the variation in pattern construction and materials in streets between adjacent die, some complex wafer designs may require relatively more experimentation to identify process operating parameters. Therefore, it may be advantageous for a laser and machining system to provide for sufficient adjustment of laser parameters, for example, pulse energy, scan speed, etc.

Some examples showed it may not be sufficient to set processing conditions for some implementations based upon only minimization of debris and HAZ in isolated area. In some cases parameters may be adjusted between passes to identify suitable process parameters. A very complex pattern design for a workpiece may limit the processing window to a relatively narrow set of parameters within an adjustable range, or may lead to some compromise in processing throughput.

Flexibility and adjustability of laser parameters over a wide range advantageously may provide for processing of patterned wafers having multiple materials in the streets. Operating with microjoule pulse energy, 500 kHz-1 MHz, over typical 20-40 μm spot sizes, and about 0.2-10 m/sec was shown to be generally beneficial in these experiments.

A surprising dependence on a combination of pulse energy/fluence and speed was found for processing certain patterned and bare wafer portions. With fixed parameters, slower speeds tend to produce increased pulse overlap and exposure of a wafer region, for example "topside" patterned wafer portions having multiple layers. Increased speed, and decreased spatial overlap between spots, tends to be suitable for bare wafer processing. Once an initial scribe is complete, the underlying substrate (typically silicon) can be cut using a mechanical saw for some implementations for thick wafers.

Alternatively, laser cutting parameters used for thin wafers may be suitable. In particular, for 100 μm, 75 μm, 50 μm or other thin substrates the same high repetition rate ultrashort pulse fiber laser of (e.g.: shown in FIG. 1F or FIG. 6A) may be used for the active-layer scribing (with typically a low number of relatively slow scans in some cases) and for the substrate cutting (with typically a large number of relatively high speed scans in some cases). Certain parameters including, e.g., pulse energy, repetition rate (e.g.: rate at which pulses are applied to the substrate), and scan speed are advantageously adjustable over a wide range in some implementations.

The high degree of depth precision possible with some ultrashort laser pulse wafer dicing embodiments can be utilized and calibrated to completely cut the wafer material without significant cutting into/through the underlying dicing tape. As such, standard mechanical dicing tape may be acceptable, whereas it is well known that conventional nanosecond UV laser dicing requires the usage of specially designed dicing tape.

Parameters for processing a patterned wafer may overlap or be distinct from typical bare wafer processing parameters. Therefore, a laser processing system that provides for adjustment of parameters over a sufficiently wide range may be suitable for processing a wide variety of semiconductor substrates, both patterned and un-patterned. Some experimentation generally is expected for different production designs to optimize processing.

Some values and/or ranges for parameters for processing thin (e.g.: 50 μm, 75 μm, etc.) patterned or non-patterned silicon wafers at a near IR wavelength may include some or all of the following in some advantageous embodiments:

Wavelength: approximately 1 μm
Number of passes: 10-1000 typical, up to about 1500
Spot size ($1/e^2$): 10-50 μm, 20-40 μm typical
Pulse width: sub-picosecond (e.g.: >100 fs) to about 10 ps, less than about 50 ps
Pulse energy: about 2-20 μJ, 5-10 μJ typical, higher energies typical to limit delamination, and to process copper with high throughput
Minimum fluence: greater than about 0.4 J/cm$^2$ (e.g.: about 5 μJ over 40 μm spot $1/e^2$ diameter)
Repetition rate: 500 kHz-5 MHz (delivered to target surface)
Scan speed: 0.1 msec to 10 msec, >1 msec typical for non-patterned wafer, <5 msec typical for patterned wafers, 0.2 m/s to 1 msec for typical low-k materials The above values and ranges are examples; other values and ranges are possible in other embodiments.

In some embodiments one or more initial passes may be carried out at a relatively slow scan speed to remove metal and/or dielectric material, for example multiple layers. Additional passes may be carried out at increased speed for cutting the semiconductor wafer, for example the underlying silicon substrate that supports the metal and/or dielectric layers.

By way of example, the first passes (e.g.: for dielectric/conductor removal) may be carried out at about 0.2 msec to 1 msec using pulse energy in the range of greater than about 2

μJ and up to about 10 μJ. The additional passes may be carried out at speed of up to about 10 msec with pulse energy as above. A focused spot size may be in the range of about 20-40 μm ($1/e^2$ diameter). A minimum fluence may be about 0.4 J/cm². Pulse widths may be about 10 ps or less. Other parameters for the first and/or additional passes are possible.

Example Experimental Results—Femtosecond and Picosecond Pulses

Scribing Example with fs and ps Pulses

Additional experiments were carried out to compare scribing results obtained with femtosecond and picosecond pulses. The system configuration used was similar to the system schematically illustrated in FIG. 6A. In these experiments, the laser system 104 comprised a D-10K laser made by IMRA America Inc. (Ann Arbor, Mich.).

Pulsed laser beams were generated with the D-10K laser, which was configured with a pulse compressor that produced sub-picosecond output pulses in some experiments. The output wavelength was 1.04 μm, and a pulse train with 10 μJ energy per pulse was generated at 1 MHz repetition rate. The pulse energy of the femtosecond and picosecond pulses was approximately equal. Before compressing, the laser pulse duration was about 300 ps, and corresponds to a stretched and amplified output of a mode-locked oscillator. In this experiment, the 300 ps pulses were obtained by removing the pulse compressor. The compressed pulse width was about 500 fs. In one set of example experiments (e.g., the example results shown at the left of FIG. 17), compressed pulses having about 5 μJ pulse energy were used. In all of these example experiments, the laser beam was focused using an F-theta lens, and the 100 μm thick silicon wafer was placed at or near the focal plane of the lens. The pulsed laser beams were scanned across the silicon wafer so as to scribe the wafer with multiple passes. For each pass, a laser beam was scanned one time across the wafer with a scan speed discussed below.

Figure 16A:
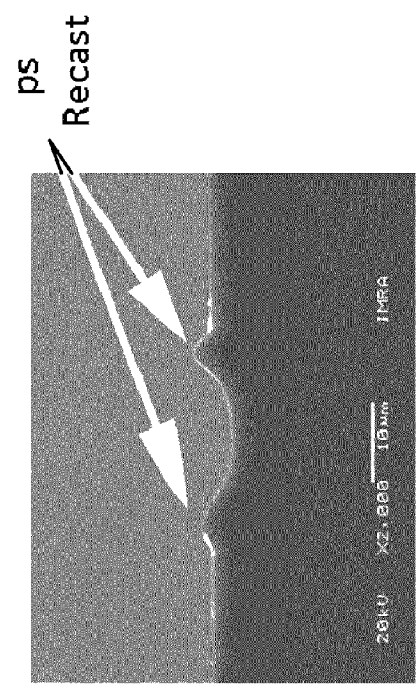
FIGS. 16A-16D show examples of SEM images illustrating femtosecond and picosecond scribing results.
Figure 16B:
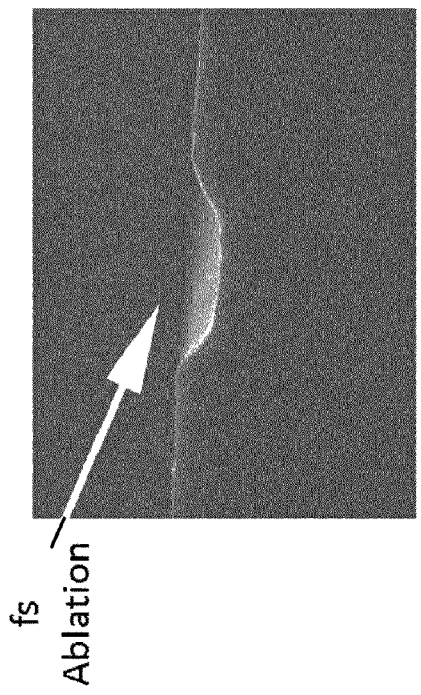
Figure 16C:
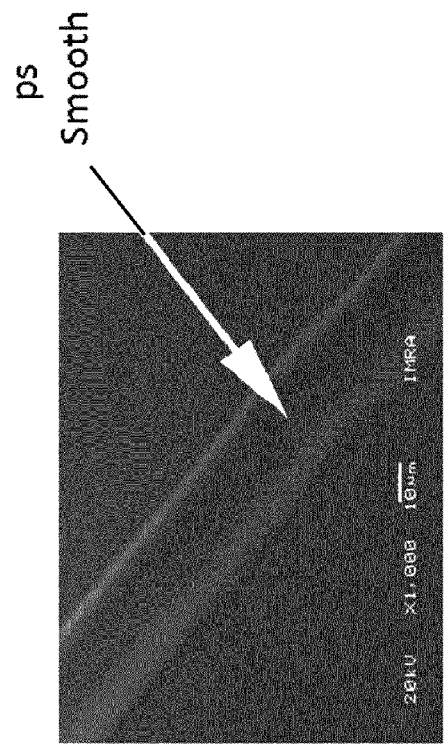
Figure 16D:
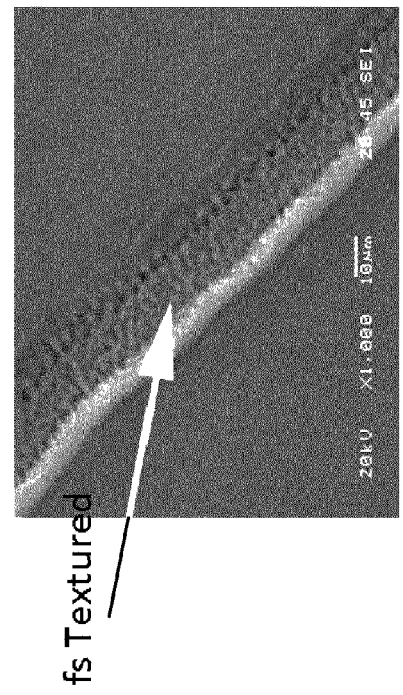

FIGS. 16A-16D illustrate example scanning electron microscopy (SEM) images of an unpatterned silicon wafer scribed using 500 fs laser pulses (FIGS. 16A and 16C) and with 300 ps laser pulses (FIGS. 16B and 16D). The results illustrated in FIGS. 16A and 16C were obtained with scan speeds about 120 mm/s, and the results in FIGS. 16B and 16D with scan speeds of about 320 mm/s. The SEM images of laser scribed grooves shown in FIGS. 16A and 16B are side views of a cleaved (after scribing) surface. The SEM images shown in FIGS. 16C and 16D are top views of portions of the grooves shown in FIGS. 16A and 16B, respectively.

In these example experiments, recast was much lower with femtosecond pulses than with picosecond pulses. The silicon sample, scribed with 500 fs laser pulses, shows no observable recast region in FIGS. 16A and 16C. Thus, it was confirmed that only a very shallow HAZ was generated by femtosecond laser pulses in this example experiment. However, scribing with 300 ps pulses resulted in a noticeable recast region about the scribing groove in the example experimental results shown in FIGS. 16B and 16D. The recast (illustrated by arrows in FIG. 16B labeled "ps Recast") indicates melting of silicon, and larger HAZ with 300 ps pulses than with 500 fs pulses, in these experiments. The recast produced with 300 ps pulses in the example shown in FIG. 16B is believed to be a result of thermal melting of the redeposited material. In certain example of femtosecond processing illustrated in earlier embodiments of wafer processing, melting of the redeposited material may not occur (or may occur to a lesser extent than with longer pulses, e.g., >100 ps pulses). Without subscribing to or requiring any particular theory or explanation, the recast of particulate debris associated with sub-picosecond laser ablation may involve somewhat different phenomenon than, for example, the thermal melting that may occur for longer pulse durations, e.g., as observed in some experiments using pulse widths greater than 100 ps. The uncompressed test results of the examples described with reference to FIGS. 13A-1 to 13A-5 (using 200 ps pulses) illustrate the quality of silicon wafer cutting may be degraded with longer pulse widths in some cases. Nevertheless, the melting and recasting observed in 300 ps processing was gentle (e.g., compared to nanosecond processing). For example, FIG. 16B does not show cracking in the region of material modification.

The 300 picosecond example experimental results illustrated in FIGS. 16B and 16D show a smooth scribed surface compared to the example experiment with sub-picosecond pulses illustrated in FIGS. 16A and 16C. Although femtosecond pulses created a relatively flat scribing groove with relatively shallow HAZ (see FIG. 16A), the scribing surface was full of texture (see FIG. 16C). Without being limited to any particular theory or explanation, it is believed the texture results from laser induced periodic surface structures (LIPSS). Scribing with 300 ps pulses formed a much smoother surface in these experiments, apparently a result of the melting process described above. On the other hand, the pulse width is short enough in the illustrated example to avoid creating surface variations on a scale comparable to wafer features (e.g.: conductors, dielectric layers). Thus, 300 ps pulses provided much smoother scribed surface quality than did 500 fs pulses, in these example experiments. Accordingly, in some implementations, longer pulse widths (e.g., longer than about 100 ps in certain embodiments) may be used to produce a smooth and substantially texture-free surface portion of a metal material, a dielectric material, and/or a semiconductor material in a workpiece.

Figure 17:
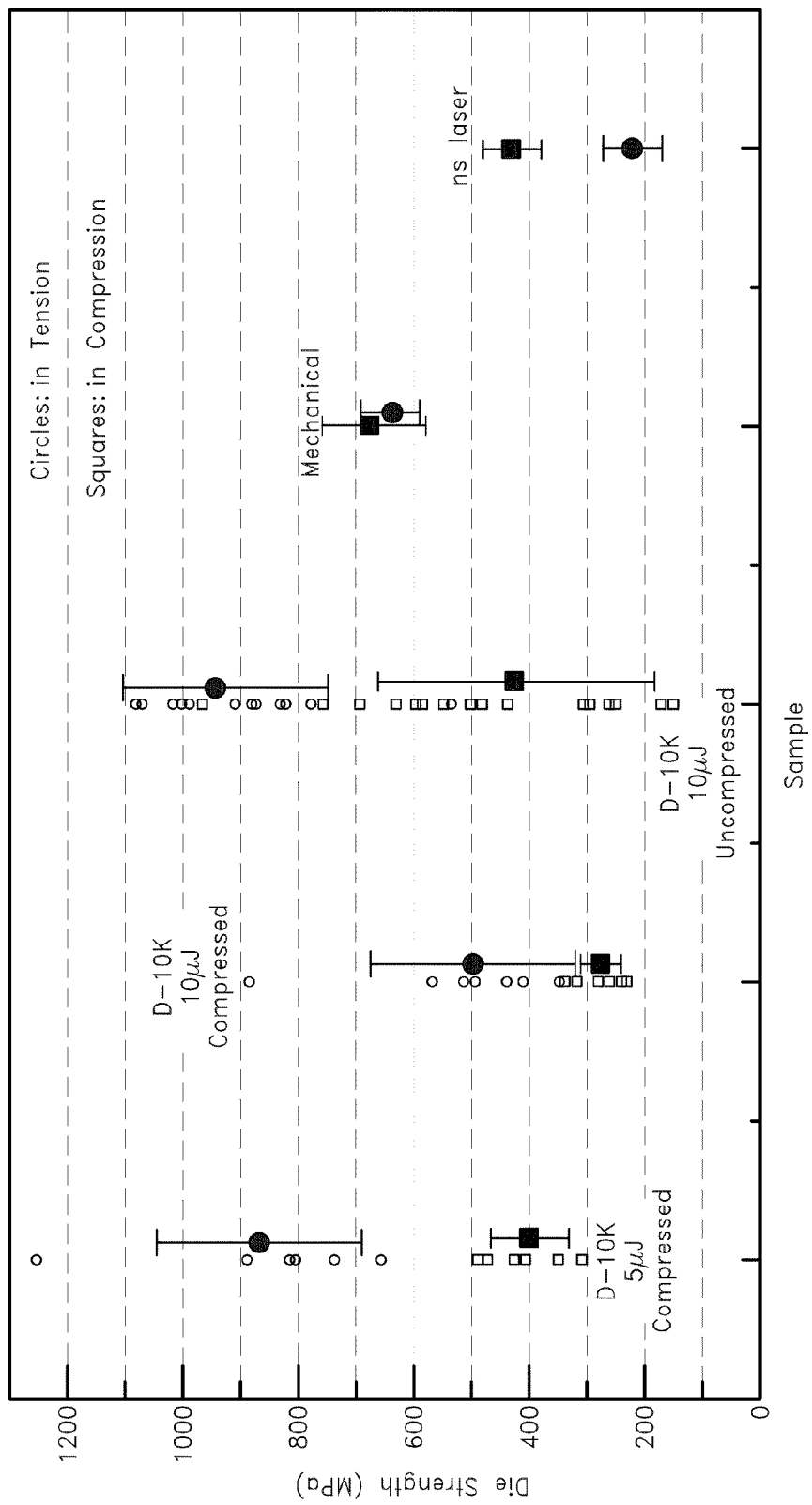
FIG. 17 illustrates experimental test results showing die strength of silicon dies cut with 500 fs compressed pulses or 300 ps uncompressed pulses.

The experimental results also showed superior die strength is achievable with either femtosecond pulses, or with picosecond pulses having pulse widths of a few hundred picoseconds. For example, FIG. 17 shows die strength of silicon dies cut with 500 fs (compressed D-10K output pulses), and 300 ps (uncompressed D-10K output pulses). In FIG. 17, individual experimental results are shown as open circles (die in tension) and open squares (die in compression). The average values (and error bars) corresponding to the experimental results are shown as filled circles (die in tension) or filled squares (die in tension), which are horizontally offset from the experimental results. For comparison, results of mechanical and nanosecond laser dicing disclosed in Li et al, "*Laser dicing and subsequent die strength enhancement technologies for ultra-thin wafer*", Electronic Components and Technology Conference, IEEE, (2007), pp 761-766 are shown. The example results illustrated in FIG. 17 indicate that dicing with 300 ps laser pulses produced die strength similar to those of dies cut with 500 fs laser pulses, and these experimental die strengths obtained from 300 ps and 500 fs pulses are stronger than the die strength of dies cut with a nanosecond laser.

Observations Based on the Example Experimental Results

In various embodiments, low-k dielectric scribing may be more efficiently carried out with HAZ sufficiently large to cause material modification over a depthwise region that intersects multiple layers. The extent (e.g., a depthwise extent) of the HAZ advantageously may be limited to reduce or avoid cracking, voids, or substantial unwanted re-deposited material. Also, in some implementations, the system is configured such that HAZ generated during removal of a dielectric material (e.g., a low-k dielectric) and/or a metal material in the workpiece is increased depthwise relative to HAZ generated during removal of a portion of a semiconductor material of the workpiece. For example, in some implementations, the depthwise extent of the HAZ generated during removal of the dielectric material and/or the metal material may extend through (and/or intersect) multiple layers of material.

FIG. 16B illustrates an example of material removal with a thermal interaction resulting in redeposited material, but is non-catastrophic with the absences of cracking and voids. FIG. 16A illustrates an example of an ultrashort (fs) laser ablation mechanism, wherein a depthwise portion of material is removed with reduced or negligible re-deposition (compared to the example in FIG. 16B). In these experiments with bare silicon, the presence of some recast without cracking or other undesirable modification is an indicator that the HAZ is sufficient for removal of an overlying layer of low-k material. Also, the experimental results again confirm the reduction or avoidance of recast, slag, molten regions, etc. with femtosecond processing of a bare wafer, and demonstrate a benefit of femtosecond pulses for cutting the entire thickness of the wafer, or a substantial portion thereof.

Debris accumulation may be further reduced in some micromachining operations with use of electrostatic attraction of charged particles ejected from the target material. U.S. Pat. No. 6,770,544, entitled "Laser Cutting Method", discloses such a technique. A dust collecting electrode which is positively or negatively charged may be installed in the vicinity of the laser irradiator of a wafer cutting system or other micromachining device. With this arrangement, charged fragments produced by laser irradiation can be electrostatically attracted by the dust collecting electrode, thus preventing the charged fragments from depositing in the vicinity of the laser irradiator. Such methods may be utilized with various embodiments to further enhance performance. The figure of merit may depend, at least in part, on the relative distribution of charged and neutral particles in the ejecta.

Additional Embodiments, Features, and Example Applications

As described herein, unwanted material may accumulate within the target region, proximate to the region, or both during processing of a target substrate. Embodiments which reduce the quantity of redeposited material and/or alter the composition of the debris may reduce or eliminate additional processing steps. For example, for semiconductor processing the quantity of unwanted material may be reduced sufficiently such that conventional ultrasonic cleaning may be used to remove some or all of the unwanted material. Additionally, use of some embodiments of the laser systems described herein may result in redeposition of fine particles rather than "blobs" of material. In such embodiments, use of chemical etching or other cleaning steps may not be required.

Numerous embodiments of the systems and methods described herein are applicable for processing semiconductor substrates. Some embodiments advantageously may reduce or eliminate the need for special coating and/or etching steps now utilized in the industry for debris removal. Some embodiments may provide additional and/or different advantages. Examples of certain additional embodiments are described herein. These additional embodiments are intended to illustrate certain advantageous examples of various systems and methods and are not intended to limit the scope of the disclosure.

In one embodiment, a method of laser processing a workpiece is provided. The method may comprise focusing and directing laser pulses to a region of the workpiece at a pulse repetition rate sufficiently high so that material is removed from the region and a quantity of unwanted material within or proximate to the region is reduced relative to a quantity obtainable at a lower repetition rate. In at least some embodiments, the region of the workpiece comprises a semiconductor wafer, and the quantity of unwanted material comprises redeposited material. In various such embodiments, the redeposited material is limited to a thickness less than about 20 μm, less than about 10 μm, less than about 5 μm, less than about 4 μm, or less than about 3.5 μm.

At least one embodiment includes a method of laser processing a target material to remove a depthwise portion of the material. The method may comprise: repeatedly irradiating at least a portion of the target material with focused laser pulses at a scan rate and a pulse repetition rate. The repetition rate is sufficiently high to efficiently remove a substantial depthwise portion of material from a target location and to limit accumulation of unwanted material within or proximate to the target location. In various embodiments, depth of the removed material may be greater than about 10 μm, greater than about 25 μm, greater than about 50 μm, greater than about 75 μm, greater than about 100 μm, greater than about 125 μm, greater than about 150 μm, or some other depth. In certain embodiments, depth of the removed material is sufficient to cut entirely through a target material having a thickness greater than about 10 μm, greater than about 25 μm, greater than about 50 μm, greater than about 75 μm, greater than about 100 μm, or some other depth. In some embodiments, the depthwise portion comprises a relatively shallow trench with a depth that may be, for example, less than about 10 μm, less than about 5 μm, or some other value. In various embodiments, width of the removed material may be in a range from about 5 μm to about 100 μm, in a range from about 10 μm to about 50 μm, in a range from about 20 μm to about 40 μm, or some other range.

At least one embodiment includes a method of processing a target material for at least one of cutting, dicing, scribing, or forming a feature on or within the target material. The method may comprise repeatedly irradiating the target material with focused laser pulses at a scan rate and a pulse repetition rate. The repetition rate may be in a range of at least about a 100 kHz to about 10 MHz in some cases. The scan rate may be in the range of about 0.2 m/s to 20 m/s in some cases. The scan rate may be in the range of about 0.5 m/s to about 10 m/s in some cases. In certain embodiments, at least some of the focused pulses have at least one of the following: a non-zero spatial overlap factor with at least one other pulse, a pulse width below about 1 ns, a pulse energy in a range of about 5 μJ to about 25 μJ, a focused $1/e^2$ spot size in a range of about 10 μm to about 50 μm. The pulses may produce a fluence of about 0.25 J/cm$^2$ to about 30 J/cm$^2$ at the target material In some implementations, the irradiating is carried out with multiple passes over at least a portion of the target material. In some implementations, at least a portion of the focused laser pulses removes at least a 5 μm depthwise portion of material from the target material.

In some implementations of a method of processing a multi-material workpiece, the workpiece comprises a semiconductor material and a pattern, and the pattern comprises at least one of a dielectric material and metal material. The method may include irradiating the workpiece with a series of laser pulses. In some implementations, at least two pulses of the series have different characteristics that are applied to different materials of the workpiece. The method may also include controlling heat-affected zone (HAZ) such that at least one HAZ generated during removal of at least one of the dielectric material and the metal material is increased depthwise relative to at least one HAZ generated during removal of a portion of the semiconductor material. In some embodiments, at least some laser pulses have different pulse widths, and controlling HAZ comprises applying different pulse widths to the workpiece materials. The pulse widths can be in a range of about 100 fs to about 500 ps. In some embodiments, the different characteristics comprise at least one of: pulse energy, peak power, and spatial overlap at the workpiece. Controlling HAZ may comprise applying pulses having at least one of the different characteristics to the different workpiece materials. In at least one embodiment, at least one pulse of the series provides fluence in a range from about 0.25 J/cm$^2$ to about 30 J/cm$^2$.

Embodiments of a system for at least one of dicing, cutting, scribing, and forming features on or within a material of a semiconductor substrate are described. The system may comprise a pulsed laser system that is configured to repeatedly irradiate at least a portion of the material with focused laser pulses at a scan rate and a pulse repetition rate. The repetition rate can be sufficiently high to efficiently remove a substantial depthwise portion of material from a target location and to limit accumulation of unwanted material proximate to the target location. The repetition rate may be in a range from about 100 kHz to about 5 MHz in some embodiments. The system may include an optical system to deliver and focus the laser pulses and a beam positioning system configured to position the laser pulses relative to the semiconductor substrate at the scan rate. The positioning system may comprise at least one of an optical scanner and a substrate positioner. The system may also include a controller coupled to the laser system, the optical system, and the positioning system.

In some implementations, this system also includes a beam manipulator coupled to the laser system and the controller. The beam manipulator, the laser system, and the controller can be operable to obtain a signal indicative of a condition of at least one of the substrate and the laser system. The controller may be operable to produce a control signal to alter the condition of at least one of the laser system and the substrate.

In some implementations, the laser source comprises at least one of a fiber laser, a fiber amplifier, a passive Q-switched microchip laser, and a mode locked oscillator. The system can be configured to produce at least one pulse having a width in a range from about 50 fs to a few nanoseconds at the repetition rate.

In some implementations, the system is configured to provide at least one laser pulse having a pulse width less than about 10 ps. In other implementations, the system can be configured to provide at least one pulse with a pulse width in a range of about 50 fs to about 500 ps. In some implementations, the pulsed laser system comprises at least one of an ultrashort laser and an optical amplifier for amplifying ultrashort pulses. In some implementations, the system is configured to operate with a pulse repetition rate less than about 10 MHz.

At least one embodiment includes a method of laser processing target material to form a high-aspect ratio feature in the target material, the feature having a sufficiently large ratio of depth to width, and a feature depth of at least about 5 microns. The method may comprise irradiating the target material with a series of focused laser pulses at a scan rate and a pulse repetition rate. The method may further comprise controlling one or more characteristics of a series of laser pulses. Controlled pulse characteristics may include a fluence, a pulse energy, a non-zero spatial overlap factor with at least one other pulse of the series, and a pulse width. The repetition rate and scan rate are sufficiently high such that the feature quality is improved relative to the quality obtainable with substantially the same pulse characteristics and scan rate at a lower repetition rate.

At least one embodiment includes a method of laser processing a target material. At least one embodiment comprises irradiating the target material with a series of focused laser pulses at a scan rate and a pulse repetition rate. The method may further comprise controlling one or more characteristics of a series of laser pulses. Controlled pulse characteristics of pulses of the series may include a fluence, a pulse energy of at least about 5 microjoules, a non-zero spatial overlap factor with at least one other pulse of the series, and a pulse width. Processing quality may be characterized with a measure of redeposited material within or proximate to a quantity of material removed. The repetition rate and/or the scan rate are sufficiently high such that the machining quality is improved relative to the quality obtainable with substantially the same pulse characteristics and scan rate at a lower repetition rate below about 1 MHz.

At least one embodiment includes a method of processing a target material to cut, dice, scribe, and/or form a feature on or within the target material. The target material may comprise a semiconductor, metal, or dielectric. For example, the target material may comprise silicon. The dielectric may comprise a low-k dielectric. The method may comprise irradiating the target material with a series of focused laser pulses at a scan rate and a pulse repetition rate. The method may further comprise controlling one or more characteristics of a series of laser pulses. Controlled pulse characteristics of pulses of the series may include a fluence, a pulse energy of at least about 5 microjoules, a non-zero spatial overlap factor with at least one other pulse of the series, and a pulse width. The energy of at least pulse one may be in a range from about 5 μJ to about 25 μJ, a pulse width may be less than about 1 ps, a focused spot size may be in a range from about 10 μm to about 50 μm, producing a fluence in a range from about 0.25 J/cm$^2$ to about 30 J/cm$^2$ at the substrate. In some embodiments, a repetition rate may be in a range from at least about 500 kHz to about 10 MHz, and a scan speed may be in a range from about 0.2 msec to about 20 msec.

In various embodiments a pulse width is less than 1 ps.

In some embodiments a pulse width may be up to a few nanoseconds.

In some embodiments a sub-nanosecond pulse width may be less than 1 ns, for example 500 ps or less.

In some embodiments, pulse widths from tens of femtoseconds to about 500 ps may be used.

In various embodiments a pulse width is sufficiently short to avoid undesirable microcracking or other defects within or near to a region of target material.

In various embodiments a pulse width is sufficiently short to limit accumulation of unwanted material at the higher repetition rate.

In various embodiments a pulse width is sufficiently short such that a feature shape is formed within a pre-determined tolerance.

A pulse width sufficiently short to form a predetermined feature shape may be less than about 100 ps.

In various embodiments an upper limit for a repetition rate may be about 2.5 MHz, about 5 MHz, or about 10 MHz, and may be selected so as to avoid one or more of heat accumulation effects and accumulation of redeposited material.

In various embodiments a higher repetition rate may be less than about 2.5 MHz.

In various embodiments a higher repetition rate may be less than about 5 MHz.

In some embodiments a higher repetition rate may be less than about 10 MHz.

At least one embodiment includes an ultrashort pulse laser system suitable for carrying out any of the embodiments of the methods of laser processing described herein.

At least one embodiment includes an ultrashort pulse laser system that comprises at least one of a fiber amplifier or a fiber laser.

A depthwise portion of material removed may be about 0.5 µm or greater during a single pass.

A repetition rate may be at least about 1 MHz

A cross-section of unwanted material may be limited to a sub-micron dimension.

Feature quality may be measurable as a depth Z of a formed feature relative to a measure of re-deposited material proximate to the feature.

In at least one embodiment the repetition rate may be at least about 500 kHz to about 5 MHz, and the lower repetition rate in the range of about 10 kHz to about 250 kHz In at least one embodiment the repetition rate may be about 500 kHz to 10 MHz, and a lower repetition rate in the range of about 10 kHz to less than about 400 kHz.

In at least one embodiment, the repetition rate may be about 500 kHz to about 2.5 MHz, and a lower repetition rate may be in a range of about 10 kHz to less than about 400 kHz.

The repetition rate may be in the range of at least about 500 kHz to about 10 MHz, and the average power of pulses during active processing may be as low as about 2.5 W.

At least one embodiment includes an ultrashort pulse laser system suitable for carrying out embodiments of the above-described method of forming high aspect ratio features.

The target material may comprise a semiconductor such as, for example, silicon.

The pulse energy may be at least about 1 microjoule, and sufficiently high such that a fluence exceeds an ablation threshold of the target material over at least a portion of a focused $1/e^2$ spot diameter.

The irradiating may be carried out in multiple passes over the material, and a depthwise portion of the feature depth may be formed during any pass.

In at least one embodiment a repetition rate may be at least 1 MHz.

The fluence on target material, pulse duration, and laser spot overlap may be held approximately constant.

A measure of quality may include at least one of the following: average height, volume, and area of redeposited material over a region proximate to target material.

A measure of quality may include at least one of the following: peak height, average height of a cross section within the region.

A further measure of quality may also include a ratio of the depth of a feature formed in the target material to any of the above quality measures.

In various embodiments an approximate reduction in the amount of recast material may include an apparent reduction in the recast particle size.

The number of passes N may be in a range from about 10 passes to about 1000 passes.

A fluence may be about 5 times to about 20 times above an ablation threshold of the material.

A fluence may be in a range of about 0.25 J/cm$^2$ to about 30 J/cm$^2$.

A pulse width may be below about 1 ps.

A scan rate may be about 10 m/s and a focused pulse may comprise a $1/e^2$ spot size of about 10 microns to about 100 microns In some embodiments the target material may comprise a silicon wafer, and the machining may comprise wafer scribing or dicing.

In some embodiments a quantity of redeposited material may be sufficiently low to eliminate a processing step utilized to remove redeposited material of a larger quantity.

In some embodiments a quantity of redeposited material may be sufficiently low such that ultrasonic cleaning removes redeposited material, and without a requirement for a substrate coating or chemical etching.

In some embodiments a repetition rate may be up to about 10 MHz and average power at least about 25 W, and up to about 100 W.

Spatial overlap of spots may be in a range from about 10% to about 50%.

In some embodiments, the power density of a pulse may be in a range from about $10^{12}$ to about $10^{14}$ W/cm$^2$, and the pulse may have a width less than about 10 ps.

In some embodiments, the power density of a pulse may be in a range from about $10^{10}$ to about $10^{13}$ W/cm$^2$, and the pulse may have a width less than about 500 ps.

At least one embodiment includes a laser based system for scribing, dicing, or similar processing of multi-material workpiece. The workpiece includes a semiconductor portion, for example a semiconductor substrate. The system comprises: a source of optical pulses. An optical amplification system, comprising at least one large-mode fiber amplifier, amplifies a pulse from the source to an energy of at least about 1 µJ, and generates output pulses having at least one pulsewidth in the range of about 500 fs to a few hundred ps. The system includes a modulation system, including at least one optical modulator, that adjusts the repetition rate of pulses delivered to the surface within the range of about a few hundred KHz to about 10 MHz. A beam delivery system delivers focused spots over a spot size ($1/e^2$) of about 5-50 µm on one or more materials, and a scanning system is used to scan the focused spots at a rate of about 0.1 msec to 20 msec. In some embodiments, the spot size ($1/e^2$) may be in a range from about 15-50 µm.

Various embodiments may also comprise: a fiber-based chirped pulse amplification system having a pulse stretcher disposed between the source and the large core amplifier, a pulse compressor that reduces a pulse width of a pulse amplified with the large core fiber. Some embodiments include an optical amplification system operable to produce an output pulse with pulse energy of about 20 µJ, with average power of about 10 W, a fiber oscillator, and one or more high gain amplifiers receiving pulses from the oscillator, configured as an all-fiber design.

In various embodiments, the system may include:

a source of optical pulses having a mode-locked fiber oscillator;

a source having at least one of a fiber laser, a fiber amplifier, a passive Q-switched microchip laser, and a mode locked oscillator;

a pulse compressor that reduces the width of pulses emitted from the optical amplifier;

a pulse stretcher disposed between the source and the optical amplifier;

the pulse stretcher may include a length of optical fiber;

a fluence may be at least about 0.25 J/cm$^2$ within a spot area, or at least about 1 J/cm$^2$, and may be material dependent;

a spot size ($1/e^2$ diameter) may in the range of about 30-40 µm;

a pulse energy is in the range of about 1 µJ to about 20 µJ.

Various embodiments of a pulsed laser system may comprise: a source of optical pulses, and an optical amplification system, comprising at least one large-mode fiber amplifier, that amplifies a pulse from the source to an energy of at least about 1 µJ, and generates ultrashort output pulses having at least one pulsewidth in the range of about 100 fs to about 1 ps. The system is preferably adjustable to deliver output pulses at a repetition rate within the range of at least about a few hundred kHz to about 10 MHz.

Various embodiments may also comprise:

available average power of at least about 10 W;

a fiber-based chirped pulse amplification system;

a large-mode fiber amplifier having at least one of a multimode fiber amplifier, a large-core leakage channel fiber (LCF), a photonic crystal fiber (PCF), and a photonic bandgap fiber (PBGF). One or more of the amplifiers may be configured in such a way that a nearly diffraction limited beam is output.

At least one embodiment comprises a method of scribing, dicing, or similar processing of a multi-material workpiece having a semiconductor material portion. The method includes: irradiating at least one material of the workpiece with laser pulses having a pulsewidth in the range of about 500 fs to a few hundred ps, and at a rate of a few hundred kHz to about 10 MHz. The pulses are focused into spots sizes of about 15-50 $\mu$m ($1/e^2$), and the focused spots scanned at a rate of about 0.1 msec to 20 msec on or within the at least one material. The irradiating controls heat accumulation within one or more materials in such a way that provides for rapid material removal, while simultaneously limiting accumulation of debris about the processed area, with control of a heat-affected zone (HAZ).

In various embodiments:

the workpiece thickness is less than about 100 $\mu$m;

the workpiece is formed with both a patterned layer and a bare semiconductor wafer portion. The patterned layer may have at least one of a dielectric and metal material.

For processing some materials, the scanning speed for removal of at least a portion of the patterned layer may be substantially less than a scanning speed for removal of the bare wafer portion. In some embodiments, an overlap between adjacent focused spots may be substantially greater for irradiation of the patterned layer than for irradiation of the bare wafer portion. Different spot sizes may be used for illumination of the patterned layer than for illumination of the bare wafer portion.

Removal of the patterned wafer portions may be carried out with spot overlap of at least about 95%. The spot overlap may be greater than about 99% in some embodiments.

The pulse energy may be in the range of about 1 $\mu$J to about 20 $\mu$J.

The patterned portion may be scanned at a rate of about 0.1-0.5 msec.

A pulse energy may be at least about 1 $\mu$J, and a fluence on or within a conductor or dielectric material may be sufficiently high to avoid delamination of the dielectric material.

Processing of some substrates may be carried out with fluence for removal of the patterned layer exceeding the fluence for removal of a bare wafer portion. In some implementations, heat accumulation for removal of at least some of the patterned portion exceeds heat accumulation for removal of at least some of the semiconductor wafer. In some such implementations, pulse energy, pulse width, repetition rate, fluence, spot overlap, and/or scan rate may be varied to provide controlled heat accumulation in one or more regions of the workpiece.

At least one embodiment includes a method of laser processing a workpiece. The method includes focusing and directing laser pulses to a region of the workpiece at a pulse repetition rate sufficiently high so that heat accumulation within one or more materials is controlled in such a way that provides for rapid material removal, while simultaneously limiting accumulation of redeposited material about the processed area, with control of a heat-affected zone (HAZ).

Various embodiments may comprise a laser based system for scribing, dicing, or similar processing of multi-material workpiece having a semiconductor material portion. The system includes a source of optical pulses, and an optical amplification system. The amplification system comprises at least one large-mode fiber amplifier that amplifies a pulse from the source, and generates output pulses having at least one pulsewidth in the range of about 500 fs to a few hundred ps. In other embodiments, the amplification system may be configured to generate output pulses having at least one pulse width in a range from tens of femtoseconds to about 500 picoseconds. The system also comprises a modulation system, including at least one optical modulator, for adjusting the repetition rate of pulses delivered to the surface to within the range of at least about 1 MHz to less than 100 MHz. A beam delivery system delivers focused pulses over a spot diameter ($1/e^2$) of at least about 5 microns on one or more materials. A scanning system, comprising at least one beam deflector, scans the focused pulses at a scanning rate that produces a spot overlap of at least about 95% at the repetition rate and the spot size.

In various embodiments:

At least some of the output pulses have pulse energy of at least about 100 nJ.

The spot overlap may exceed about 99%.

The source and amplification system may be all-fiber.

The amplification system may comprise a fiber-based chirped pulse amplifier.

In some embodiments of the laser-based system is configured such that:

A first output pulse has a pulsewidth greater than about 10 ps and a second output pulse has a pulsewidth less than 1 ps.

The first output pulse and the second output pulse are overlapped in time.

The first output pulse and the second output pulse are separated in time by less than about 1 $\mu$s.

The first output pulse is output when the scanning rate is at a first rate, the second output pulse is output when the scanning rate is at a second rate, the first rate less than the second rate.

In at least one embodiment, a multi-material workpiece may comprise both a patterned region and a semiconductor wafer region, the patterned region having at least one of a dielectric and a metal material. Embodiments of methods of processing the workpiece may include some of the following: modifying at least a portion of material within the patterned region with pulses having pulse widths in the range of about 100 ps to about 500 ps, and modifying at least a portion of the semiconductor wafer region with pulses having pulse widths in the range of about 100 fs to about 10 ps. In some embodiments, at least one pulse comprises a pulse width in the range of about 100 ps to 500 ps, and at least one pulse comprises a pulse width less than about 10 ps. In some embodiments, at least one pulse has a pulse energy of at least about 100 nJ. In some implementations, the pattern comprises both a dielectric material and a metal material, and heat accumulation within at least a portion of the pattern is sufficiently high to reduce or avoid delamination of the dielectric material from the metal material. In some embodiments, a depthwise portion of a heat-affected zone (HAZ) produced by modifying at least a portion of the pattern is larger than a depthwise portion of a HAZ produced by modifying at least a portion of the semiconductor wafer.

Various embodiments of the methods for material processing described herein may be implemented using at least some of the embodiments of the pulsed laser systems described herein. In various embodiments, the pulsed laser systems can comprise at least one of a fiber amplifier or a fiber laser. For example, embodiments of the methods for material processing may be implemented using embodiments of the systems shown and described with reference to FIGS. 1F, 2A, 2B, 3, 4A, 4B, 5, 6A, and/or 6B, and/or other pulsed laser systems. In some implementations, the laser system (or components thereof, such as an oscillator and/or amplifier) may be implemented using an all-fiber design.

The example experiments, experimental data, tables, graphs, plots, photographs, figures, and processing and/or operating parameters (e.g., values and/or ranges) described herein are intended to be illustrative of operating conditions of the disclosed systems and methods and are not intended to limit the scope of the operating conditions for various embodiments of the methods and systems disclosed herein. Additionally, the experiments, experimental data, calculated data, tables, graphs, plots, photographs, figures, and other data disclosed herein demonstrate various regimes in which embodiments of the disclosed systems and methods may operate effectively to produce one or more desired results. Such operating regimes and desired results are not limited solely to specific values of operating parameters, conditions, or results shown, for example, in a table, graph, plot, figure, or photograph, but also include suitable ranges including or spanning these specific values. Accordingly, the values disclosed herein include the range of values between any of the values listed or shown in the tables, graphs, plots, figures, photographs, etc. Additionally, the values disclosed herein include the range of values above or below any of the values listed or shown in the tables, graphs, plots, figures, photographs, etc. as might be demonstrated by other values listed or shown in the tables, graphs, plots, figures, photographs, etc. Also, although the data disclosed herein may establish one or more effective operating ranges and/or one or more desired results for certain embodiments, it is to be understood that not every embodiment need be operable in each such operating range or need produce each such desired result. Further, other embodiments of the disclosed systems and methods may operate in other operating regimes and/or produce other results than shown and described with reference to the example experiments, experimental data, tables, graphs, plots, photographs, figures, and other data herein.

Other systems, setups, and parameters may be used in other implementations, which may provide the same or different results. Many variations are possible and are contemplated within the scope of this disclosure. Films, layers, components, features, structures, and/or elements may be added, removed, or rearranged. Additionally, process or method steps may be added, removed, or reordered.

Certain processing steps or acts of the methods disclosed herein may be implemented in hardware, software, or firmware, which may be executed by one or more general and/or special purpose computers, processors, or controllers, including one or more floating point gate arrays (FPGAs), programmable logic devices (PLDs), application specific integrated circuits (ASICs), and/or any other suitable processing device. In certain embodiments, one or more functions provided by a controller or a control means may be implemented as software, instructions, logic, and/or modules executable by one or more processing devices. In some embodiments, the software, instructions, logic, and/or modules may be stored on computer-readable media including storage media implemented on a physical storage device and/or communication media that facilitates transfer of information. In various embodiments, some or all of the steps or acts of the disclosed methods may be performed automatically by one or more processing devices. Many variations are possible.

For purposes of this disclosure, certain aspects, advantages, and novel features are described herein. It is to be understood that not necessarily all such advantages may be achieved in accordance with any particular embodiment. Thus, for example, those skilled in the art will recognize that the systems and methods may be embodied or carried out in a manner that achieves one advantage or group of advantages as taught herein without necessarily achieving other advantages as may be taught or suggested herein. Furthermore, embodiments may include several novel features, no single one of which is solely responsible for the embodiment's desirable attributes or which is essential to practicing the systems and methods described herein. Additionally, in any method or process disclosed herein, the acts or operations of the method or process may be performed in any suitable sequence and are not necessarily limited to any particular disclosed sequence.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While certain embodiments of the inventions disclosed herein have been described, these embodiments have been presented by way of example only, and are not intended to limit the scope of the inventions disclosed herein. Reference throughout this disclosure to "some embodiments," "an embodiment," or the like, means that a particular feature, structure, step, process, or characteristic described in connection with the embodiment is included in at least one embodiment. Thus, appearances of the phrases "in some embodiments," "in an embodiment," or the like, throughout this disclosure are not necessarily all referring to the same embodiment and may refer to one or more of the same or different embodiments. Indeed, the novel methods and systems described herein may be embodied in a variety of other forms; furthermore, various omissions, substitutions, equivalents, and changes in the form of the methods and systems described herein may be made without departing from the spirit of the inventions disclosed herein.

What is claimed is:

1. A method of scribing, dicing, cutting, or processing to remove material from a region of a multi-material workpiece, said method comprising:
   directing laser pulses toward at least one material of a multi-material workpiece, the laser pulses having a pulse width in a range from tens of femtoseconds to about 500 picoseconds and a pulse repetition rate of a few hundred kHz to about 10 MHz, the workpiece comprising both a pattern and a semiconductor wafer, said pattern comprising at least one of a dielectric material and a metal material;

focusing said laser pulses into laser spots having spot sizes in a range from a few microns to about 50 μm (1/e$^2$); and positioning said laser spots relative to said at least one material at a scan speed such that an overlap between adjacent focused spots for removal of material from at least a portion of the pattern is substantially greater than an overlap between adjacent focused spots for removal of material from at least a portion of the semiconductor wafer, wherein said method controls heat accumulation within one or more materials of said workpiece, while limiting accumulation of redeposited material about the region, wherein at least one laser pulse has a pulse energy of at least about 100 nJ, wherein said pattern comprises said metal material and said dielectric material, and wherein heat accumulation within said at least a portion of said pattern is sufficiently high to avoid delamination of said dielectric material from said metal material.

2. The method of claim 1, wherein a thickness of said semiconductor wafer is less than about 100 μm.

3. The method of claim 1, wherein at least one laser pulse has a pulse energy in a range from about 1 μJ to about 20 μJ.

4. The method of claim 1, wherein said spot sizes are in a range from about 15 μm to about 50 μm, and said scan speed for removal of material from said pattern is in a range from about 0.1 msec to about 0.5 msec.

5. The method of claim 1, wherein said laser pulses are output by an ultrashort pulsed laser system.

6. The method of claim 1, wherein a pulse width for removing at least a portion of said pattern is in a range from about 100 ps to about 500 ps, and a pulse width for removing at least a portion of said wafer is in a range from about 100 fs to about 10 ps.

7. The method of claim 1, wherein the scan speed for removal of at least a portion of said pattern is substantially less than the scan speed for removal of at least a portion of said wafer.

8. The method of claim 1, wherein said scan speed is in the range of about 0.1 msec to about 10 msec.

9. The method of claim 1, wherein at least one of said laser pulses provides a fluence in a range from about 0.25 J/cm$^2$ to about 30 J/cm$^2$.

10. The method of claim 1, wherein at least one of said laser pulses provides a fluence in a range from above an ablation threshold of said at least one material to about 20 times the ablation threshold of said at least one material.

11. The method of claim 1, wherein the overlap between adjacent focused spots for removal of the material from the at least a portion of the pattern exceeds about 95%.

12. The method of claim 1, wherein the overlap between adjacent focused spots for removal of the material from the at least a portion of the pattern exceeds about 99%.

13. The method of claim 1, wherein the overlap between adjacent focused spots for removal of material from the at least a portion of the pattern is in a range between about 75% to more than about 99%.

14. The method of claim 1, wherein the overlap between adjacent focused spots for removal of the material from the at least a portion of the pattern is at least about ten times greater than the overlap between adjacent focused spots for removal of the material from the at least a portion of the semiconductor wafer.

15. The method of claim 1, wherein at least a portion of said positioning is carried out with a beam deflector.

16. The method of claim 1, wherein said positioning said laser spots comprises performing multiple passes of said laser spots relative to said at least one material.

\* \* \* \* \*

UNITED STATES PATENT AND TRADEMARK OFFICE
CERTIFICATE OF CORRECTION

PATENT NO. : 8,158,493 B2  
APPLICATION NO. : 12/641256  
DATED : April 17, 2012  
INVENTOR(S) : Lawrence Shah et al.

Page 1 of 2

It is certified that error appears in the above-identified patent and that said Letters Patent is hereby corrected as shown below:

On the Title Page

In column 1 (page 2 item 56) at line 22, under U.S. Patent Documents, change "Wai" to --Peng--.

In column 1 (page 2 item 56) at line 40, under U.S. Patent Documents, change "Shah" to --Shah et al.--.

In column 1 (page 2 item 56) at line 62, under U.S. Patent Documents, change "Shah" to --Shah et al.--.

In column 2 (page 2 item 56) at line 7, under U.S. Patent Documents, change "Shah" to --Shah et al--.

In the Specification

In column 5 at line 1, change "msec" to --m/sec--.

In column 5 at line 2, change "msec," to --m/sec,--.

In column 13 at line 32, change "msec." to --m/sec.--.

In column 13 at line 46, change "msec," to --m/sec,--.

In column 13 at line 49, change "msec," to --m/sec,--.

In column 18 at line 27, change "msec." to --m/sec.--.

In column 46 at line 65, change "msec" to --m/sec--.

In column 47 at line 15, change "msec." to --m/sec.--.

In column 47 at line 41, change "msec." to --m/sec.--.

In column 48 at line 43, after "0.2" change "msec" to --m/sec--.

In column 48 at line 43, after "1" change "msec" to --m/sec--.

In column 48 at line 45, change "msec" to --m/sec--.

In column 50 at line 54, after "0.1" change "msec" to --m/sec--.

Signed and Sealed this  
Eighteenth Day of February, 2014

Michelle K. Lee  
*Deputy Director of the United States Patent and Trademark Office*

CERTIFICATE OF CORRECTION (continued)
U.S. Pat. No. 8,158,493 B2

In column 50 at line 54, after "10" change "msec," to --m/sec,--.

In column 50 at line 54, after ">1" change "msec" to --m/sec--.

In column 50 at line 55, change "msec" to --m/sec--.

In column 50 at line 56, change "msec" to --m/sec--.

In column 50 at line 66, change "msec" to --m/sec--.

In column 50 at line 67, change "msec" to --m/sec--.

In column 51 at line 2, change "msec" to --m/sec--.

In column 56 at line 39 (approx.), after "0.2" change "msec" to --m/sec--.

In column 56 at line 39 (approx.), after "20" change "msec." to --m/sec.--.

In column 58 at line 34, after "0.1" change "msec" to --m/sec--.

In column 58 at line 34, after "20" change "msec." to --m/sec.--.

In column 59 at line 22, after "0.1" change "msec" to --m/sec--.

In column 59 at line 22, after "20" change "msec" to --m/sec--.

In column 59 at line 48, change "msec." to --m/sec.--.

In the Claims

In column 63 at line 30 (approx.), in Claim 4, change "0.1 msec" to --0.1 m/sec--.

In column 63 at line 30 (approx.), in Claim 4, change "0.5 msec." to --0.5 m/sec.--.

In column 64 at line 6, in Claim 8, change "0.1 msec" to --0.1 m/sec--.

In column 64 at line 6, in Claim 8, change "10 msec." to --10 m/sec--.